(12) United States Patent
Salcedo et al.

(10) Patent No.: US 11,595,036 B2
(45) Date of Patent: Feb. 28, 2023

(54) FINFET THYRISTORS FOR PROTECTING HIGH-SPEED COMMUNICATION INTERFACES

(71) Applicant: Analog Devices, Inc., Norwood, MA (US)

(72) Inventors: Javier A. Salcedo, North Billerica, MA (US); Jonathan G. Pfeifer, Summerfield, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/863,830

(22) Filed: Apr. 30, 2020

(65) Prior Publication Data

US 2021/0344336 A1 Nov. 4, 2021

(51) Int. Cl.
*H01L 29/74* (2006.01)
*H01L 29/78* (2006.01)
(Continued)

(52) U.S. Cl.
CPC ... *H03K 17/08108* (2013.01); *H01L 27/0262* (2013.01); *H01L 29/742* (2013.01); *H01L 29/785* (2013.01)

(58) Field of Classification Search
CPC ............ H01L 29/0657; H01L 29/0665; H01L 29/0669; H01L 29/0676; H01L 29/068;
(Continued)

(56) References Cited

U.S. PATENT DOCUMENTS 5,610,790 A 3/1997 Staab et al.
6,768,616 B2 7/2004 Mergens et al.
(Continued)

FOREIGN PATENT DOCUMENTS

CN 109166850 A 1/2019
WO WO2017078676 A1 5/2017

OTHER PUBLICATIONS

International Search Report and Written Opinion for International Application No. PCT/US2021/024363 dated Jul. 15, 2021, in 12 pages.
(Continued)

*Primary Examiner* — Natalia A Gondarenko
(74) *Attorney, Agent, or Firm* — Knobbe, Martens, Olson & Bear, LLP

(57) ABSTRACT

Fin field-effect transistor (FinFET) thyristors for protecting high-speed communication interfaces are provided. In certain embodiments herein, high voltage tolerant FinFET thyristors are provided for handling high stress current and high RF power handling capability while providing low capacitance to allow wide bandwidth operation. Thus, the FinFET thyristors can be used to provide electrical overstress protection for ICs fabricated using FinFET technologies, while addressing tight radio frequency design window and robustness. In certain implementations, the FinFET thyristors include a first thyristor, a FinFET triggering circuitry and a second thyristor that serves to provide bidirectional blocking voltage and overstress protection. The FinFET triggering circuitry also enhances turn-on speed of the thyristor and/or reduces total on-state resistance.

21 Claims, 37 Drawing Sheets

(51) Int. Cl.
  *H01L 27/02* (2006.01)
  *H03K 17/081* (2006.01)
(58) Field of Classification Search
  CPC ............ H01L 29/0688; H01L 29/6609; H01L
         29/66098; H01L 29/66136; H01L
         29/0673; H01L 29/413; H01L 29/42312;
         H01L 29/42392; H01L 29/49; H01L
         29/4916; H01L 29/42316; H01L 29/7827;
         H01L 29/785; H01L 29/7858; H01L
         29/861; H01L 29/8613; H01L 27/0255;
         H01L 27/0629; H01L 27/0248; H01L
         27/0924; H01L 27/0292; H01L 27/105;
         H01L 21/823431; H01L 21/823456;
         H01L 21/823892; H01L 21/823821;
         H01L 21/823857; H01L 21/82385; H01L
         21/823885; H01L 2027/11811; H01L
         2924/13091; H01L 27/0218; H01L
         27/0229; H01L 27/0259; H01L 27/0262;
         H01L 27/0266–0296; H01L 27/0647;
         H01L 27/067; H01L 27/0711; H01L
         27/0722; H01L 27/0727; H01L 27/0744;
         H01L 27/075; H01L 27/0886; H01L
         27/0928; H01L 27/098; H01L 27/1027;
         H01L 29/0646; H01L 29/0804; H01L
         29/0808; H01L 29/083; H01L 29/0839;
         H01L 29/0843; H01L 29/1004; H01L
         29/1008; H01L 29/1012; H01L 29/102;
         H01L 29/1029; H01L 29/66121; H01L
         29/66234; H01L 29/6625; H01L
         29/66356; H01L 29/66363; H01L
         29/66371; H01L 29/66378; H01L
         29/66386; H01L 29/66393; H01L 29/705;
         H01L 29/73; H01L 29/735; H01L
         29/7391; H01L 29/7392; H01L 29/74;
         H01L 29/7404; H01L 29/7412; H01L
         29/7408; H01L 29/742; H01L 29/7436;
         H01L 29/745; H01L 29/747; H01L
         29/7855; H03K 17/08108
  USPC ......................................... 257/107, 133, 173
  See application file for complete search history.

(56) References Cited

U.S. PATENT DOCUMENTS

| 7,285,828 | B2 | 10/2007 | Salcedo et al. |
| 7,566,914 | B2 | 7/2009 | Salcedo et al. |
| 7,601,991 | B2 | 10/2009 | Salcedo et al. |
| 8,044,457 | B2 | 10/2011 | Salcedo et al. |
| 8,222,698 | B2 | 7/2012 | Salcedo et al. |
| 8,320,091 | B2 | 11/2012 | Salcedo et al. |
| 8,368,116 | B2 | 2/2013 | Salcedo et al. |
| 8,416,543 | B2 | 4/2013 | Salcedo |
| 8,422,187 | B2 | 4/2013 | Parthasarathy et al. |
| 8,432,651 | B2 | 4/2013 | Salcedo et al. |
| 8,466,489 | B2 | 6/2013 | Salcedo et al. |
| 8,553,380 | B2 | 10/2013 | Salcedo |
| 8,564,065 | B2 | 10/2013 | Donovan et al. |
| 8,570,698 | B2 | 10/2013 | Lee et al. |
| 8,592,860 | B2 | 11/2013 | Salcedo et al. |
| 8,598,641 | B2 | 12/2013 | Chen et al. |
| 8,610,251 | B1 | 12/2013 | Salcedo |
| 8,637,899 | B2 | 1/2014 | Salcedo |
| 8,665,571 | B2 | 3/2014 | Salcedo et al. |
| 8,680,620 | B2 | 3/2014 | Salcedo et al. |
| 8,779,518 | B2 | 7/2014 | Lin et al. |
| 8,796,729 | B2 | 8/2014 | Clarke et al. |
| 8,860,080 | B2 | 10/2014 | Salcedo |
| 8,946,822 | B2 | 2/2015 | Salcedo et al. |
| 8,947,841 | B2 | 2/2015 | Salcedo et al. |
| 8,958,187 | B2 | 2/2015 | Parthasarathy et al. |
| 9,006,781 | B2 | 4/2015 | Salcedo et al. |
| 9,088,256 | B2 | 7/2015 | Cosgrave et al. |
| 9,123,540 | B2 | 9/2015 | Salcedo et al. |
| 9,147,677 | B2 | 9/2015 | Salcedo et al. |
| 9,171,832 | B2 | 10/2015 | Salcedo et al. |
| 9,275,991 | B2 | 3/2016 | Salcedo et al. |
| 9,293,912 | B2 | 3/2016 | Parthasarathy et al. |
| 9,318,479 | B2 | 4/2016 | Li et al. |
| 9,478,608 | B2 | 10/2016 | Salcedo et al. |
| 9,634,482 | B2 | 4/2017 | Parthasarathy et al. |
| 9,653,448 | B2 | 5/2017 | Zhang et al. |
| 9,831,233 | B2 | 11/2017 | Salcedo et al. |
| 9,876,005 | B2 | 1/2018 | Su et al. |
| 10,083,952 | B2 | 9/2018 | Lee et al. |
| 10,158,029 | B2 | 12/2018 | Parthasarathy et al. |
| 10,177,566 | B2 | 1/2019 | Zhao et al. |
| 10,199,369 | B2 | 2/2019 | Parthasarathy et al. |
| 10,249,609 | B2 | 4/2019 | Salcedo et al. |
| 10,340,370 | B2 | 7/2019 | Wang et al. |
| 10,504,886 | B1 | 12/2019 | Yam et al. |
| 11,004,849 | B2 | 5/2021 | Salcedo et al. |
| 2002/0089017 | A1 | 7/2002 | Lai et al. |
| 2014/0268438 | A1* | 9/2014 | Davis ............... H01L 27/0262 361/56 |
| 2015/0008476 | A1* | 1/2015 | Shrivastava ........ H01L 27/0924 257/133 |
| 2015/0029622 | A1* | 1/2015 | Su ...................... H01L 29/7436 257/173 |
| 2016/0056146 | A1* | 2/2016 | Li ....................... H01L 27/0262 257/133 |
| 2016/0056147 | A1 | 2/2016 | Li et al. |
| 2016/0141358 | A1* | 5/2016 | Salcedo ............. H01L 27/0259 257/168 |
| 2016/0204096 | A1 | 7/2016 | Zhao et al. |
| 2016/0261110 | A1 | 9/2016 | Ivanov et al. |
| 2016/0285255 | A1 | 9/2016 | O'Donnell et al. |
| 2016/0300830 | A1 | 10/2016 | Salcedo et al. |
| 2016/0336740 | A1 | 11/2016 | Parthasarathy et al. |
| 2016/0336744 | A1 | 11/2016 | Parthasarathy et al. |
| 2017/0069616 | A1 | 3/2017 | Cai et al. |
| 2017/0256534 | A1 | 9/2017 | Parthasarathy et al. |
| 2017/0317070 | A1 | 11/2017 | Salcedo et al. |
| 2018/0026440 | A1 | 1/2018 | Zhao et al. |
| 2018/0068996 | A1 | 3/2018 | Lee |
| 2018/0158814 | A1 | 6/2018 | Salcedo et al. |
| 2018/0158935 | A1 | 6/2018 | Wang et al. |
| 2018/0211951 | A1 | 7/2018 | Luo et al. |
| 2018/0226788 | A1 | 8/2018 | Salcedo et al. |
| 2018/0308846 | A1* | 10/2018 | Huang ............... H01L 27/0262 |
| 2019/0013310 | A1 | 1/2019 | Paul et al. |
| 2019/0027470 | A1 | 1/2019 | Han et al. |
| 2019/0131787 | A1 | 5/2019 | He et al. |
| 2020/0111778 | A1 | 4/2020 | Lai et al. |
| 2020/0286889 | A1 | 9/2020 | Salcedo et al. |
| 2020/0403007 | A1* | 12/2020 | Thomson ............ H01L 29/0657 |

OTHER PUBLICATIONS

Karp et al., "FinFET MPSoC 32 GB/s transceivers: Custom ESD protection and verification." 2016 IEEE 59th International Midwest Symposium on Circuits and Systems (MWSCAS). IEEE, 2016, in 4 pages.

* cited by examiner

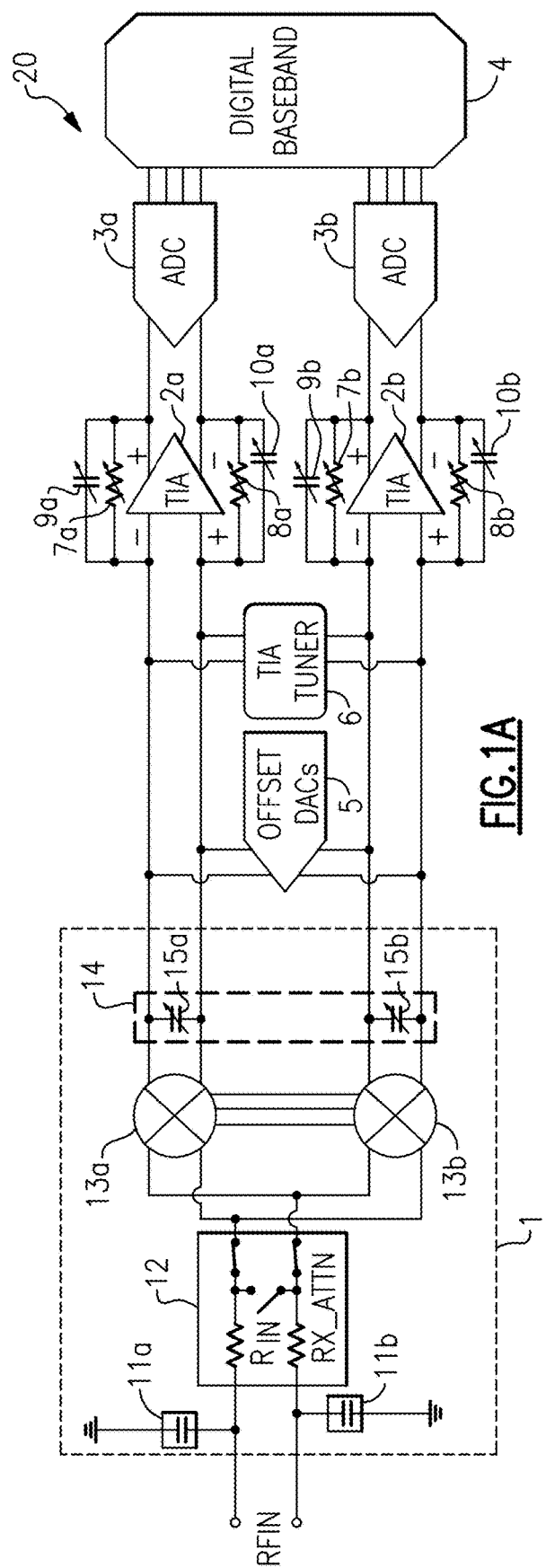
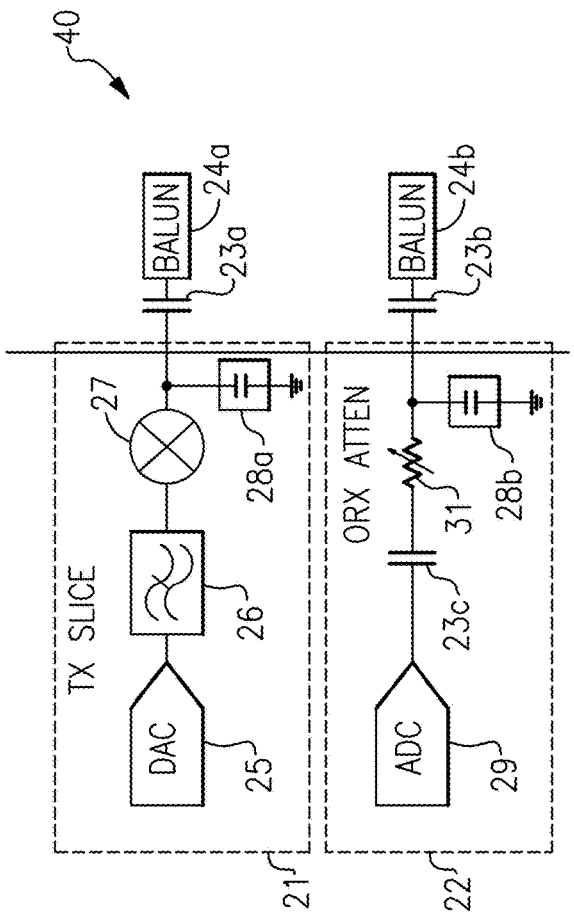
FIG.1A
FIG.1B

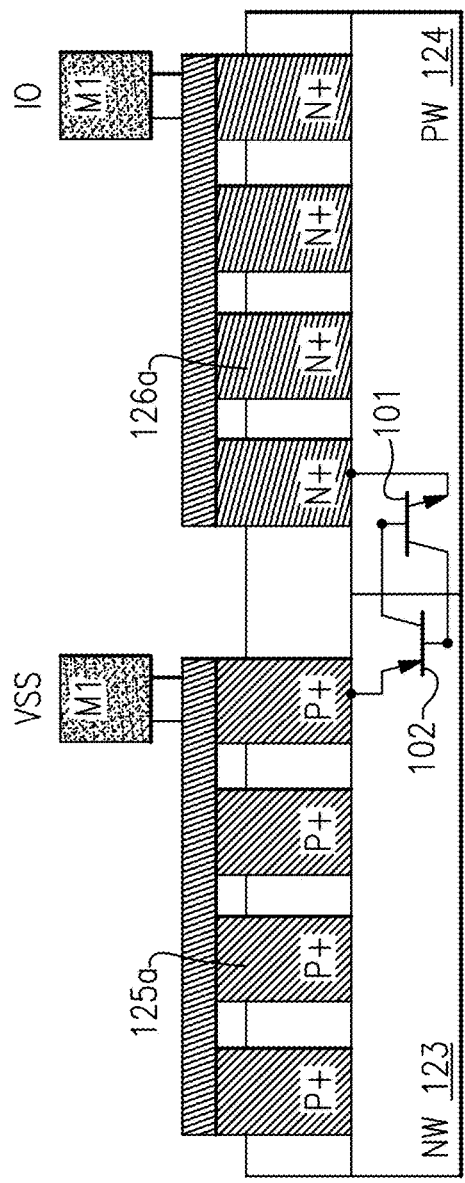
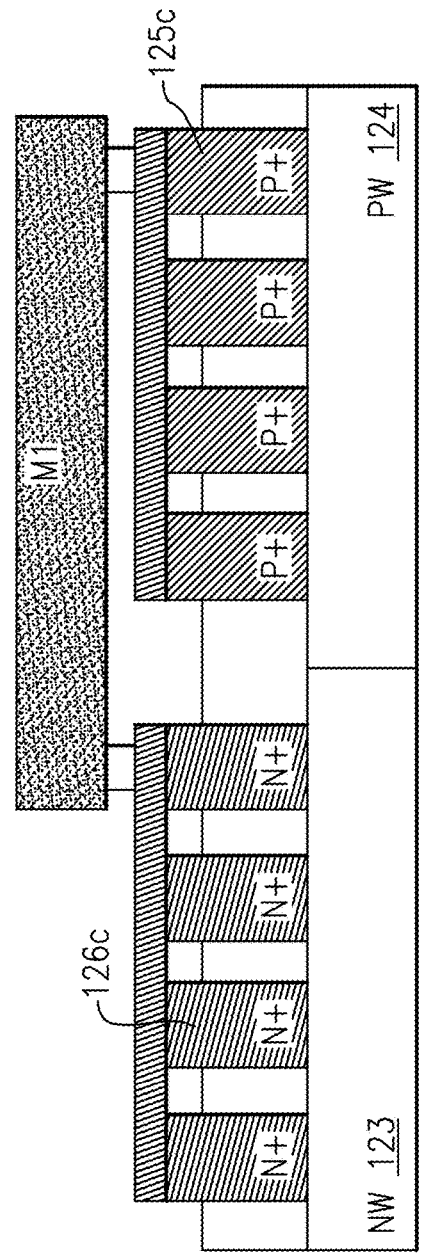

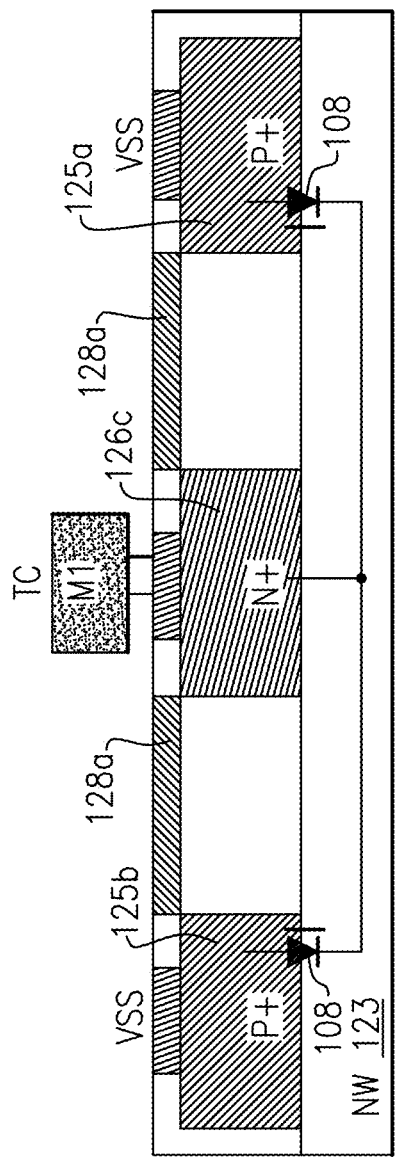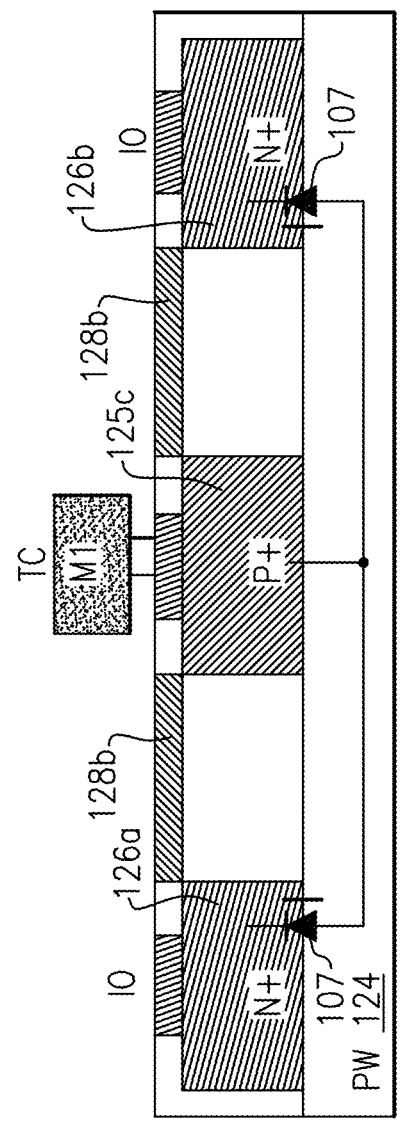

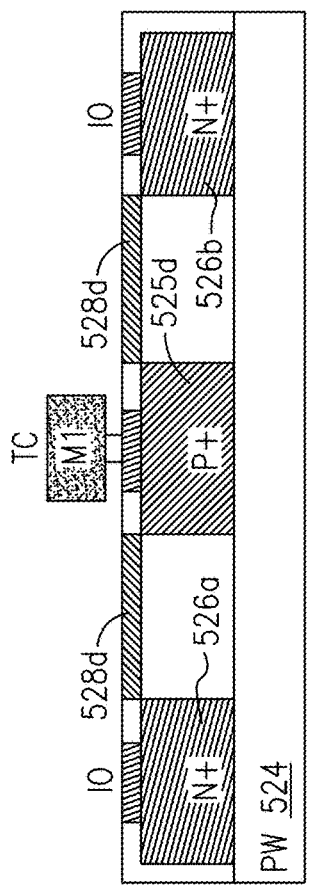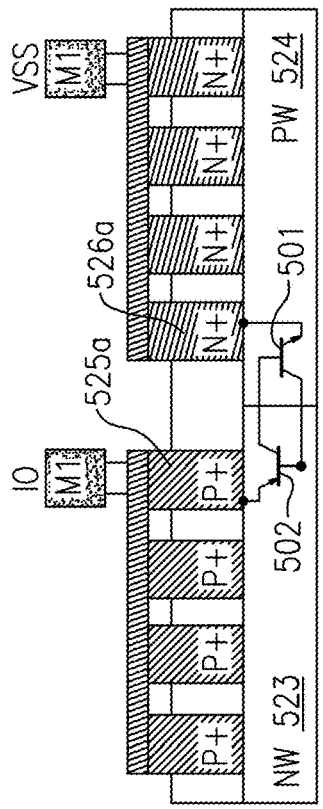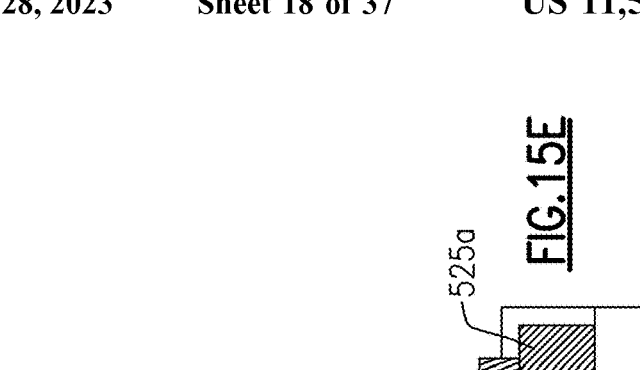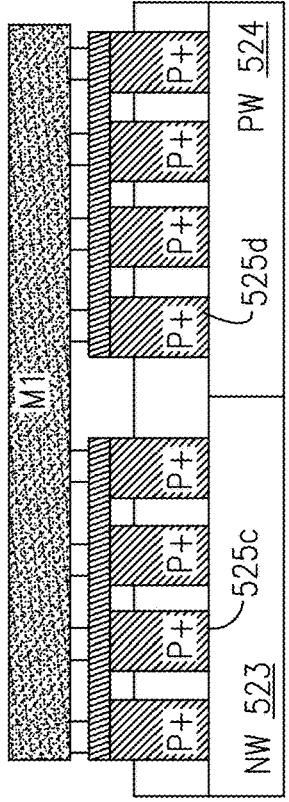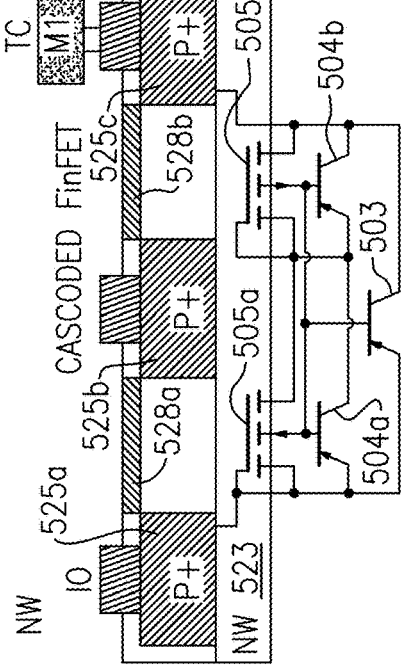

FINFET THYRISTORS FOR PROTECTING HIGH-SPEED COMMUNICATION INTERFACES

FIELD OF THE DISCLOSURE

Embodiments of the invention relate to electronic systems with radio frequency high data rate communication interfaces, and more particularly to, electrical overstress protection for such systems.

BACKGROUND

Electronic systems can be exposed to electrical overstress events, or electrical signals of short duration having rapidly changing voltage and high power during manufacturing, assembly, and end-user application environment. Electrical overstress events include, for example, electrical overstress (EOS), electromagnetic interference (EMI), and electrostatic discharge (ESD) arising from the abrupt release of charge from an object or person to an electronic system. The electronic systems design constraints to safely handle these type of environmental overstress conditions is more complex in fin field-effect-transistor (FinFET) systems-on-a-chip (SoC) for high frequency and high data rate applications.

Electrical overstress events can damage or destroy integrated circuits (ICs) by generating overvoltage conditions and high levels of power dissipation in relatively small areas of the ICs. High power dissipation can increase IC temperature, and can lead to numerous problems, such as gate oxide punch-through, junction damage, metal damage, and surface charge accumulation.

SUMMARY OF THE DISCLOSURE

Fin field-effect transistor (FinFET) thyristors for protecting high-speed communication interfaces are provided. In certain embodiments herein, high voltage tolerant FinFET thyristors are provided for handling high stress current and high RF power handling capability while providing low capacitance to allow wide bandwidth operation. Thus, the FinFET thyristors can be used to provide electrical overstress protection for ICs fabricated using FinFET technologies, while addressing tight radio frequency design window and robustness. The FinFET thyristors include FinFET triggering circuitry that enhances turn-on speed of the thyristor and/or reduces total on-state resistance.

In one aspect, a FinFET thyristor protection structure for protecting a high-speed communication interface is provided. The FinFET thyristor protection structure includes a first terminal, a second terminal, and a thyristor connected between the first terminal and the second terminal and including a PNP bipolar transistor and an NPN bipolar transistor that are cross-coupled. The PNP bipolar transistor includes an emitter formed from a first plurality of p-type active (P+) regions in an n-type well (NW), a base formed from the NW, and a collector formed from a p-type well (PW). The NPN bipolar transistor includes an emitter formed from a first plurality of n-type active (N+) regions in the PW, a base formed from the PW, and a collector formed from the NW. The FinFET thyristor protection structure further includes FinFET triggering circuitry formed in the NW and PW and configured to activate to provide a current path from the first terminal to the second terminal in response to an electrical overstress event received between the first terminal and the second terminal, and to trigger activation of the thyristor in response to the electrical overstress event.

In another aspect, a FinFET thyristor protection circuit is provided. The FinFET thyristor protection circuit includes a thyristor having an anode connected to a first terminal and a cathode connected to a second terminal. The thyristor includes a PNP bipolar transistor cross-coupled with an NPN bipolar transistor. The FinFET thyristor protection circuit further includes FinFET triggering circuitry configured to activate to provide a current path from the first terminal to the second terminal in response to an electrical overstress event received between the first terminal and the second terminal. The FinFET triggering circuitry is further configured to trigger activation of the thyristor in response to the electrical overstress event.

In another aspect, a method of protecting a high-speed interface of a FinFET die from electrical overstress is provided. The method includes providing a first current path from a first terminal to a second terminal through FinFET triggering circuitry in response to an electrical overstress event received between the first terminal and the second terminal, triggering activation of a thyristor using the FinFET triggering circuitry, wherein the thyristor includes an anode connected to the first terminal and a cathode connected to the second terminal, and providing a second current path from the first terminal to the second terminal through the thyristor.

BRIEF DESCRIPTION OF THE DRAWINGS

FIG. 1A is a schematic diagram of a high-speed receiver with electrical overstress protection according to one embodiment.

FIG. 1B is a schematic diagram of a high-speed transmitter with electrical overstress protection according to one embodiment.

FIG. 4B is a cross section of the FinFET thyristor protection structure of FIG. 4A taken along the lines 4B-4B.

FIG. 4C is a cross section of the FinFET thyristor protection structure of FIG. 4A taken along the lines 4C-4C.

FIG. 4D is a cross section of the FinFET thyristor protection structure of FIG. 4A taken along the lines 4D-4D.

FIG. 4E is a cross section of the FinFET thyristor protection structure of FIG. 4A taken along the lines 4E-4E.

FIG. 15B is a cross section of the FinFET thyristor protection structure of FIG. 15A taken along the lines 15B-15B.

FIG. 15C is a cross section of the FinFET thyristor protection structure of FIG. 15A taken along the lines 15C-15C.

FIG. 15D is a cross section of the FinFET thyristor protection structure of FIG. 15A taken along the lines 15D-15D.

FIG. 15E is a cross section of the FinFET thyristor protection structure of FIG. 15A taken along the lines 15E-15E.

DETAILED DESCRIPTION

Figure 1C:
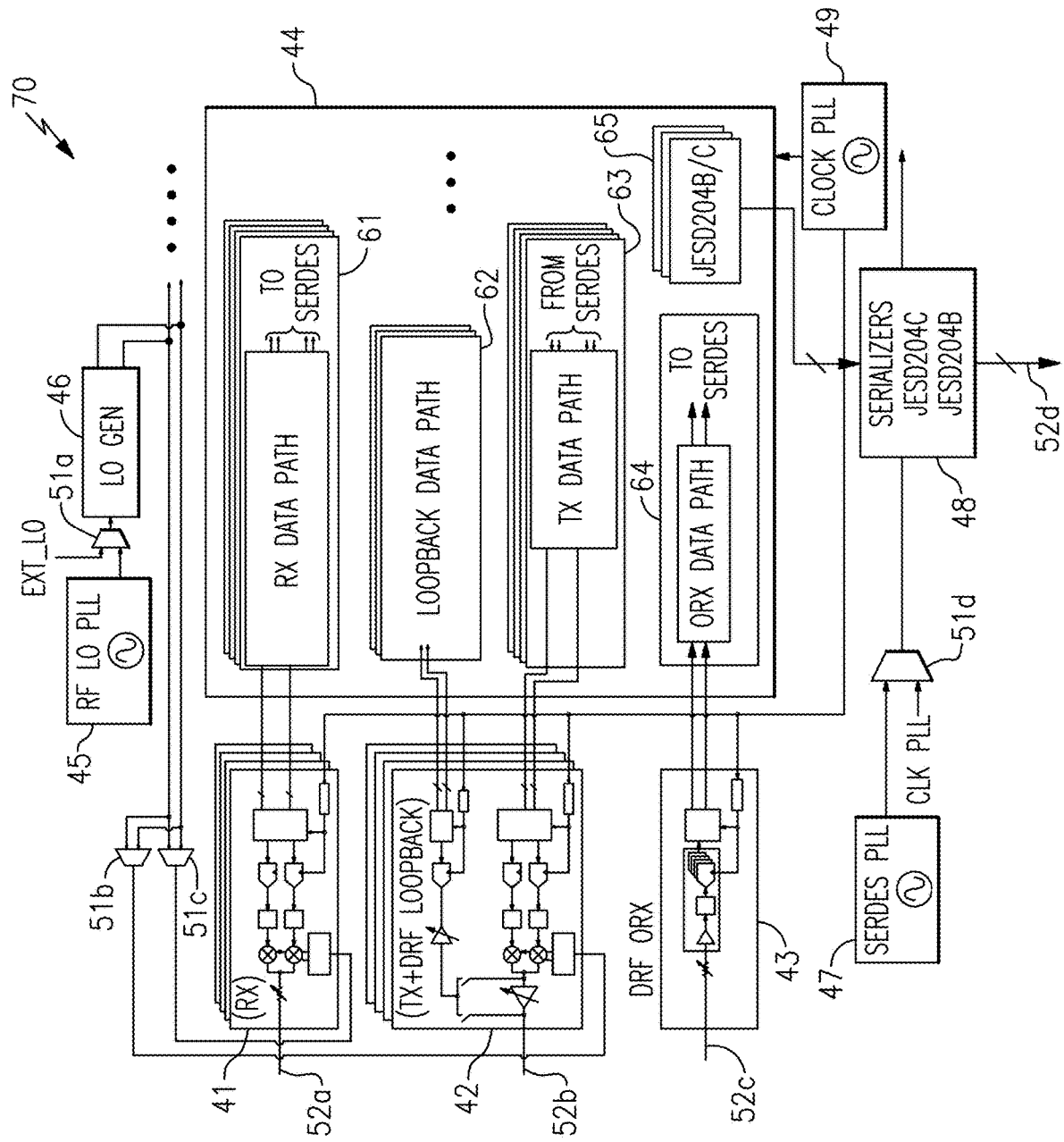
FIG. 1C is a schematic diagram of a fifth generation (5G) communication system with electrical overstress protection according to one embodiment.

The following detailed description of embodiments presents various descriptions of specific embodiments of the invention. However, the invention can be embodied in a multitude of different ways in fin field-effect-transistor (FinFET) technology. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Certain electronic systems include overstress protection circuits to protect circuits or components from electrical overstress events. To help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of electrical overstress events, including electrical overstress (EOS) and/or electrostatic discharge (ESD).

FIG. 1A is a schematic diagram of a high-speed receiver 20 with electrical overstress protection according to one embodiment. The receiver 20 includes a receiver front end 1, an in-phase (I) path transimpedance amplifier (TIA) 2a, a quadrature-phase (Q) path TIA 2b, an I path analog-to-digital converter (ADC) 3a, a Q-path ADC 3b, a digital baseband system 4, offset digital-to-analog converters (DACs) 5, and a TIA tuner 6.

As shown in FIG. 1A, the receiver front end 1 is coupled to a differential radio frequency input (RFIN) interface, and includes a first fin field-effect-transistor (FinFET) thyristor protection structure 11a, a second FinFET thyristor protection structure 11b, a receive attenuator 12, an I path mixer 13a, a Q path mixer 13b, and a tunable capacitor bank 14 including an I path tunable capacitor 15a and a Q path tunable capacitor 15b.

The high-speed receiver 20 illustrates one example application for the FinFET thyristor protection structures disclosed herein. For example, the first FinFET thyristor protection structure 11a is connected between a non-inverted RF input of the RFIN interface and ground, while the second FinFET thyristor protection structure 11b is connected between an inverted RF input of the RFIN interface and ground. The FinFET thyristor protection structures 11a-11b are turned off during normal operating conditions of the interface RFIN, but activate to provide overstress protection in response to an electrical overstress event.

As shown in FIG. 1A, the FinFET thyristor protection structures capacitively load the RFIN interface, even when turned off. By implementing the FinFET thyristor protection structures in accordance with the teachings herein, robust protection to the RFIN interface is provided while providing low parasitic capacitance to allow the interface to operate with high-speed and wide bandwidth.

Although FIG. 1A illustrates one example application for FinFET thyristor protection structures, the teachings herein are applicable to a wide variety of high-speed interfaces.

FIG. 1B is a schematic diagram of a high-speed transmitter 40 with electrical overstress protection according to one embodiment. The high-speed transmitter 40 includes a transmitter slice 21, an observation receiver slice 22, a first DC blocking capacitor 23a, a second DC blocking capacitor 23b, a first balun 24a, and a second balun 24b.

As shown in FIG. 1B, the transmitter slice 21 includes a DAC 25, a low pass filter 26, a mixer 27, and a first FinFET thyristor protection structure 28a coupled between an output of the mixer 27 and ground. Additionally, the observation receiver 22 includes an ADC 29, a third DC blocking capacitor 23c, a controllable attenuator 31 (for instance, a voltage variable attenuator or digital step attenuator), and a second FinFET thyristor protection structure 28b connected between an input of the controllable attenuator 31 and ground.

The high-speed transmitter 40 illustrates another example application for the FinFET thyristor protection structures disclosed herein. Although FIG. 1B illustrates another example application for FinFET thyristor protection structures, the teachings herein are applicable to a wide variety of high-speed interfaces.

FIG. 1C is a schematic diagram of a fifth generation (5G) communication system 70 with electrical overstress protection according to one embodiment. The 5G communication system 70 illustrates another example application for FinFET thyristor protection structures. However, the teachings herein are applicable to other implementation of systems.

In the illustrated embodiment, the 5G communication system 70 includes a receiver 41, a transmitter 42 (with direct digital to RF (DRF) loopback, in this example), a DRF observation receiver 43, a baseband processor 44, an RF local oscillator (LO) phase-locked loop (PLL) 45, an LO generator 46, a serializer/deserializer (SERDES) PLL 47, serializers 48 (operating in compliance with JESD204B and/or JESD204C, in this example), a clock PLL 49, a first multiplexer 51a (multiplexing between an external LO clock signal EXT_LO and a clock signal from the RF LO PLL 45, in this example), a second multiplexer 51b, a third multiplexer 51c, a fourth multiplexer 51d (multiplexing between a clock PLL signal CLK PLL and a clock signal from the SERDES PLL 47, in this example), an RF receiver interface 52a, an RF transmitter interface 52b, an RF observation receiver interface 52c, and a high-speed serializer interface 52d.

As shown in FIG. 1C, the baseband processor 44 includes a receive data path 61 (for providing data recovered from the receiver 41 to SERDES), a loopback data path 62 (for processing data from DRF loopback of the transmitter 42), a transmit data path 63 (for processing data received from SERDES to generate data for the transmitter 42), an observation data path 64 (for calibrating the transmitter 42 based on observation data recovered from the observation receiver 43 and/or for providing the observation data to SERDES), and a JESD204B/JESD204C controller 65 (for controlling communications associated with the Joint Electron Devices Engineering Council (JESD) 204B and 204C standards).

In the illustrated embodiment, a wide variety of interfaces can be protected by the FinFET thyristor protection structures described herein. For example, the RF receiver interface 52a, the RF transmitter interface 52b, the RF observation receiver interface 52c, and/or the high-speed serializer interface 52d can be protected using the FinFET thyristor protection structures disclosed herein. However, the teachings herein are applicable to other implementations of high-speed interfaces.

In certain implementations, the 5G communication system 70 operates as part of a massive multi-input multiple-output (MIMO) system, which is a key communication infrastructure technology for delivering mobile 5G. For example, massive MIMO essentially groups together antennas at the transmitter and receiver to scale throughput and improve spectrum efficiency. Massive MIMO is used to multiply the capacity of wireless channels in a variety of communication standards, including not only 5G, but also 802.11n (Wi-Fi), 802.11ac (Wi-Fi), HSPA+, WiMAX, and LTE as well as other proprietary and non-proprietary communication standards.

There are significant design constraints to achieve robustness and performance trade-offs design targets in the main signal transmitter and receiver channels due to constraints in the operating voltage and capacitance linearity. To address limitations in existing art, a protection device that is high voltage tolerant, low capacitance, high linearity and robust to electrical overstress (including ESD) is critical in enabling reliable operation of these system. The protection device should provide little to no degradation to RF performance parameters such as second-order harmonic distortion (HD2), third-order harmonic distortion (HD3), third-order intermodulation distortion (IMD3), and/or third-order intercept point (IP3) at the required high power and/or small radio frequency (RF) signal. Furthermore, it is desirable for the protection device to behave linearly with respect to capacitance and current characteristics such that presence of the protection device does not interference with operation of the interface.

Conventional diode-based RF IO protection poses significant limitations in achieving RF performance for advancing 5G communication requirements while preserving interface robustness.

Figure 2:
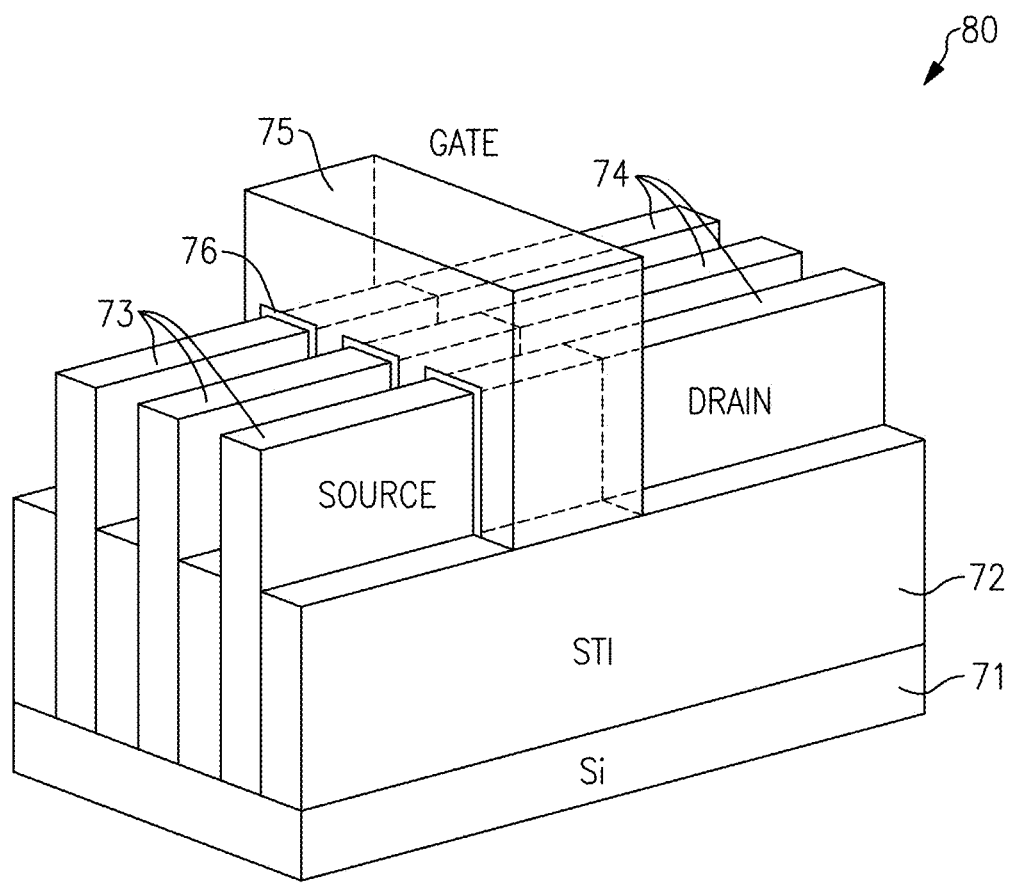
FIG. 2 is a perspective view of a fin field-effect transistor (FinFET) according to one embodiment.

FIG. 2 is a perspective view of a fin field-effect transistor (FinFET) 80 according to one embodiment. The FinFET 80 is fabricated in a silicon (Si) substrate 71, and includes shallow trench isolation (STI) regions 72, source fins 73, drain fins 74, a gate fin 75, and a high-k metal gate (HKMG) region 76.

The FinFET 80 can provide a number of advantages relative to other transistor technologies. For example, the FinFET 80 facilitates higher level of integration and technology scaling, the FinFET 80 can provide higher electrical control over a channel, more effective leakage suppression, enhanced driving current, and/or higher intrinsic gain for superior analog performance.

Thus, the FinFET 80 provides a number of advantages suitable for deployment in ICs for high-speed data conversion, wide bandwidth wireless communications, and/or other high-performance applications. For example, a semiconductor chip implemented with FinFETs can be used to enable the high-speed applications discussed above with reference to FIGS. 1A-1C.

For example, to aid in meeting bandwidth constraints for 5G, it is desirable use FinFET technology to fabricate semiconductor dies (also referred to herein as integrated circuits or ICs) for high-performance transceivers and/or high-speed interfaces.

Although FinFET technology can provide a number of advantages, such FinFETs can operate with higher parasitic resistance, higher parasitic capacitance, and/or poorer thermal characteristics (for instance, higher thermal impedance and/or more self-heating) relative to transistors fabricated using a conventional complementary metal oxide semiconductor (CMOS) process. Such characteristics can render FinFETs susceptible to damage from electrical overstress. In addition, backend metallization interconnect introduces a relatively high parasitic capacitance the can account for over 40% of the total loading capacitance of the interface devices.

The teachings herein can be used to provide electrical overstress protection for ICs fabricated using FinFET technologies, thereby helping to meet tight design windows for robustness. For example, in certain embodiments herein, high voltage tolerant FinFET thyristors are provided for handling high stress current and high RF power handling capability, while providing low capacitance to allow wide bandwidth operation.

Figure 3:
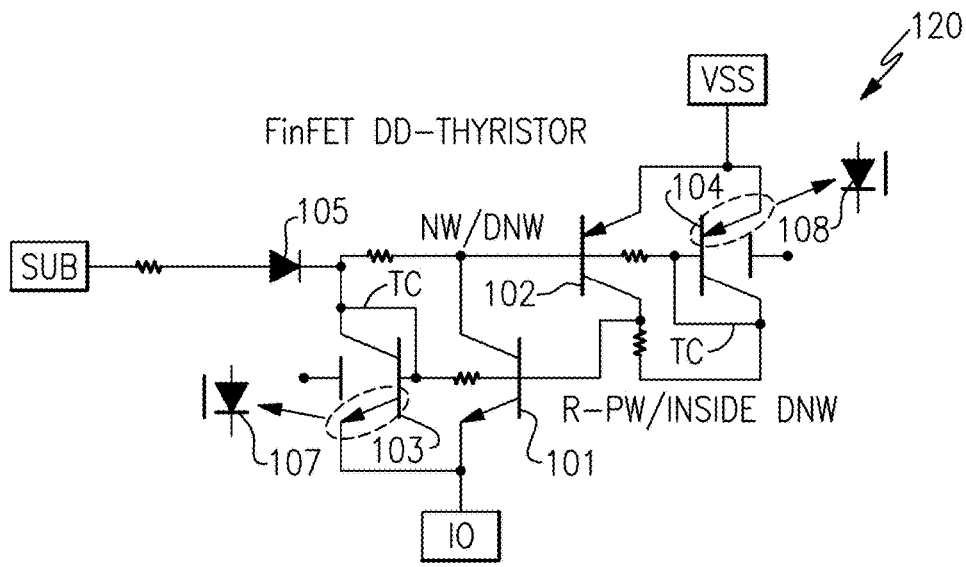
FIG. 3 is a circuit diagram of a FinFET thyristor protection circuit according to one embodiment.

FIG. 3 is a circuit diagram of a FinFET thyristor protection circuit 120 according to one embodiment. The FinFET thyristor protection circuit 120 includes an NPN bipolar transistor 101, a PNP bipolar transistor 102, a FinFET gated NPN bipolar transistor 103, a FinFET gated PNP bipolar transistor 104, and a diode 105. One example connectivity of the FinFET thyristor protection circuit 120 to an input and/or output (TO) terminal, a substrate (SUB) terminal, and a ground (VSS) terminal is depicted.

In the illustrated embodiment, the FinFET thyristor protection circuit 120 provides electrical overstress protection between the IO terminal and the VSS terminal. In particular, the FinFET thyristor protection circuit 120 activates to provide overstress protection when a voltage difference between the VSS terminal and the IO terminal is greater than a trigger voltage. Although depicted as being connected between the IO terminal and the VSS terminal, the FinFET thyristor protection circuits herein can be connected in other ways.

The PNP bipolar transistor 102 and the NPN bipolar transistor 101 are cross-coupled to form a thyristor, which is also referred to herein as a silicon-controlled rectifier (SCR). In particular, a collector of the NPN bipolar transistor 101 is connected to a base of the PNP bipolar transistor 102, and a collector of the PNP bipolar transistor 102 is connected to a base of the NPN bipolar transistor 101. As shown in FIG. 3, the thyristor includes an anode (corresponding to the emitter of the PNP bipolar transistor 102) connected to the VSS terminal and a cathode (corresponding to the emitter of the NPN bipolar transistor 101) connected to the IO terminal. Once the thyristor is activated, the cross-coupling provides regenerative feedback and low impedance between the VSS terminal and the IO terminal to provide overstress protection.

In addition to the thyristor associated with the PNP bipolar transistor 102 and the NPN bipolar transistor 101, the FinFET thyristor protection circuit 120 further includes FinFET triggering circuitry that provides a current path between the VSS terminal and the IO terminal. The FinFET triggering circuitry includes the FinFET gated NPN bipolar transistor 103 and the FinFET gated PNP bipolar transistor 104, in this embodiment. The current path provided by the FinFET triggering circuitry serves to provide overstress protection during a time period before the thyristor is activated, to enhance turn-on speed of the thyristor by providing current to the bases of the thyristor's bipolar transistors, and/or to reduce total on-state resistance of the FinFET thyristor protection circuit 120 after the thyristor has activated (by providing a first current path through the FinFET triggering circuitry and a second current path through the thyristor).

As shown in FIG. 3, the FinFET gated NPN bipolar transistor 103 includes an emitter connected to the IO terminal, and a base and a collector connected to one another. Additionally, the FinFET gated PNP bipolar transistor 104 includes an emitter connected to the VSS terminal, and a base and a collector connected to one another and to the bases of the NPN bipolar transistor 101, the PNP bipolar transistor 102, and the FinFET gated NPN bipolar transistor 103. The FinFET gated PNP bipolar transistor 104 and the FinFET gated NPN bipolar transistor 103 each include a gate structure (at least one gate fin corresponding to those used to fabricate fins of FETs in a FinFET manufacturing process), which are electrically floating in this embodiment.

Thus, although the FinFET triggering circuitry of FIG. 3 includes gate fins, the FinFET triggering circuitry of FIG. 3 does not include any FETs. As will be discussed later, certain embodiments of FinFET triggering circuitry herein do include actual FETs.

Implementing the FinFET thyristor protection circuit of FIG. 3 with the FinFET triggering circuitry provides a current path between the VSS terminal and the IO terminal. For example, the base-emitter junction of the FinFET gated NPN bipolar transistor 103 is associated with a first FinFET gated diode 107 including an anode connected to the base of the NPN bipolar transistor 101 and a cathode connected to the IO terminal. Additionally, the base-emitter junction of the FinFET gated PNP bipolar transistor 104 is associated with a second FinFET gated diode 108 including an anode connected to the VSS terminal and a cathode connected to the base of the NPN bipolar transistor 101.

Thus, the first FinFET gated diode 107 and the second FinFET gated diode 108 are in series between the VSS terminal and the IO terminal. The first FinFET gated diode 107 and the second FinFET gated diode 108 provide a dual diode (DD) response, which is in addition to the thyristor response provided by the NPN bipolar transistor 101 and the PNP bipolar transistor 102. Thus, the FinFET thyristor protection circuit 120 is also referred to herein as a FinFET DD-thyristor.

Using a gated diode provides a number of advantages, such as reduced leakage current, lower parasitic capacitance, and/or higher holding voltage relative to a p-n junction diode with no gate structure over the p-n junction. Furthermore, a gated diode can have superior low capacitance characteristics in the presence of PVT variation. In certain implementations herein, the gate of a gated diode or gated bipolar transistor is electrically floating during operation.

In certain implementations, the bases and collectors of the FinFET gated PNP bipolar transistor 103 and the FinFET gated NPN bipolar transistor 104 are connected to one another in metallization using a conductor TC.

In certain implementations, the base of the PNP bipolar transistor 102 is associated with an n-type well (NW)/deep n-type well (DNW), while the base of the NPN bipolar transistor 101 is associated with a p-type well (PW) that is isolated from a p-type substrate (and the terminal SUB) by the DNW. In such implementations, the diode 105 is present between the p-type substrate and the NW/DNW.

The FinFET thyristor protection circuit 120 has been annotated to depict various resistors that can be present between various nodes of the FinFET thyristor protection circuit 120. The resistors can correspond to resistances of metallization, n-type semiconductor regions, and/or p-type semiconductor regions.

Figure 4A:
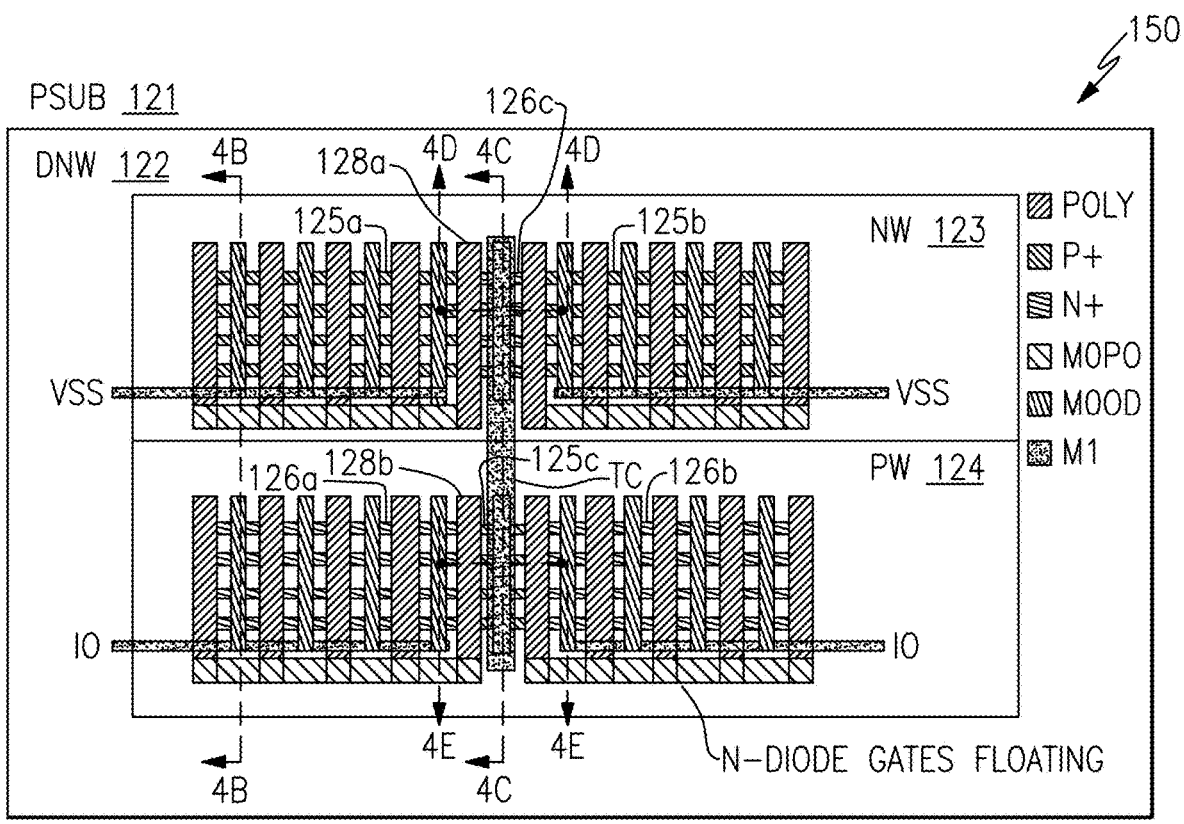
FIG. 4A is a plan view of a FinFET thyristor protection structure according to one embodiment.

FIGS. 4A-4E illustrate one embodiment of a FinFET thyristor protection structure 150 that can be included in electrical overstress protection circuitry for a chip interface. FIG. 4A is a plan view of the FinFET thyristor protection structure 150. FIG. 4B is a cross section of the FinFET thyristor protection structure 150 of FIG. 4A taken along the lines 4B-4B. FIG. 4C is a cross section of the FinFET thyristor protection structure 150 of FIG. 4A taken along the lines 4C-4C. FIG. 4D is a cross section of the FinFET thyristor protection structure 150 of FIG. 4A taken along the lines 4D-4D. FIG. 4E is a cross section of the FinFET thyristor protection structure 150 of FIG. 4A taken along the lines 4E-4E.

The FinFET thyristor protection structure 150 illustrates one embodiment of a chip layout used to implement the FinFET thyristor protection circuit 120 of FIG. 3. However, the FinFET thyristor protection circuit 120 of FIG. 3 can be implemented in other ways. One or more instantiations of the FinFET thyristor protection structure 150 can be included on a semiconductor die to protect circuitry of the die's interface from damage arising from electrical overstress events, such as ESD events.

The FinFET thyristor protection structures herein can include various wells (for instance, n-type well (NW) and/or p-type well (PW) regions), various active regions (for instance, n-type active (N+) and/or p-type active (P+) regions), gates, and/or other structures. As persons of ordinary skill in the art will appreciate, P+ regions have a higher doping concentration than the PWs. Additionally, N+ regions have a higher doping concentration than NWs. Persons having ordinary skill in the art will appreciate various concentrations of dopants in the regions.

It should be appreciated that because regions within a semiconductor device are defined by doping different parts of a semiconductor material with differing impurities or differing concentrations of impurities, discrete physical boundaries between different regions may not actually exist in the completed device but instead regions may transition from one to another. Some boundaries as shown in the figures of this type and are illustrated as abrupt structures merely for the assistance of the reader. As persons having ordinary skill in the art will appreciate, p-type regions can include a p-type semiconductor material, such as boron, as a dopant. Furthermore, n-type regions can include an n-type semiconductor material, such as phosphorous, as a dopant.

With reference to FIGS. 4A-4E, the FinFET thyristor protection structure 150 is fabricated in a p-type substrate (PSUB) 121. Additionally, a deep n-type well (DNW) 122 is formed in the PSUB 121, and an NW 123 and a PW 124 are formed adjacent to one another in the DNW 122. The DNW 122 and PSUB 121 are not depicted in the cross-sections.

A first group of P+ regions 125a and a second group of P+ regions 125b are formed in the NW 123. Additionally, a first group of N+ regions 126a and a second group of N+ regions 126b are formed in the PW 124. Furthermore, a third group of N+ regions 126c is formed in the NW 123 between the first group of P+ regions 125a and the second group of P+ regions 125b. Additionally, a third group of P+ regions 125c is formed in the PW 124 between the first group of N+ regions 126a and the second group of N+ regions 126b. Additionally, a first group of gate fin regions 128a is formed over the NW 123 and a second group of gate fin regions 128b is formed over the PW 124. Various metallization including metal zero routes (M0PO and M0OD), metal one routes (M1), and vias and contacts are depicted. Although various numbers of device fingers are shown, other numbers of device fingers are possible, such as a number of fingers selected to achieve desired current handling.

The cross sections are also annotated to show various devices formed from the layout. The devices correspond to those of the FinFET thyristor protection circuit 120 of FIG. 3.

For example, the FinFET thyristor protection structure 150 includes an NPN bipolar transistor 101 having an emitter, a base, and a collector corresponding to the N+ regions 126a-126b, the PW 124, and the NW 123, respectively. Additionally, the FinFET thyristor protection structure 150 includes a PNP bipolar transistor 102 having an emitter, a base, and a collector corresponding to the P+ regions 125a-125b, the NW 123, and the PW 124, respectively.

With continuing reference to FIGS. 4A-4E, the FinFET thyristor protection structure 150 further includes a FinFET gated NPN bipolar transistor 103 having an emitter, a base, a collector, and a gate associated with N+ regions 126a-126b, PW 124, NW 123, and gate fin regions 128b, respectively. The base-emitter junction of the FinFET gated NPN bipolar transistor 103 corresponds to a first FinFET gated diode 107 having an anode, a cathode, and a gate associated with PW 124, N+ regions 126a-126b, and gate fin regions 128b, respectively. Additionally, the FinFET thyristor protection structure 150 further includes a FinFET gated PNP bipolar transistor 104 having an emitter, a base, a collector, and a gate associated with P+ regions 125a-125b, NW 123, PW 124, and gate fin regions 128a, respectively. The base-emitter junction of the FinFET gated PNP bipolar transistor 104 corresponds to a second FinFET gated diode 108 having an anode, a cathode, and a gate associated with P+ regions 125a-125b, NW 123, and gate fin regions 128a, respectively.

A conductor TC is used to connect the anode of first FinFET gated diode 107 to the cathode of the second FinFET gated diode 108, and thus the first FinFET gated diode 107 and the second FinFET gated diode 108 are connected in series between the IO terminal and the VSS terminal to provide the FinFET thyristor protection structure 150 with a dual diode response.

In the illustrated embodiment, conduction of the dual diode response is in a first direction, while conduction of the thyristor is in a second direction that is substantially perpendicular to the first direction. For example, with respect to the page orientation of FIG. 4A, conduction through the first FinFET gated diode 107 and the second FinFET gated diode 108 is lateral, while conduction through the thyristor is vertical. Implementing the FinFET thyristor protection structure 150 in this manner increases total current handling capability and mitigates issues arising from overheating.

Figure 5:
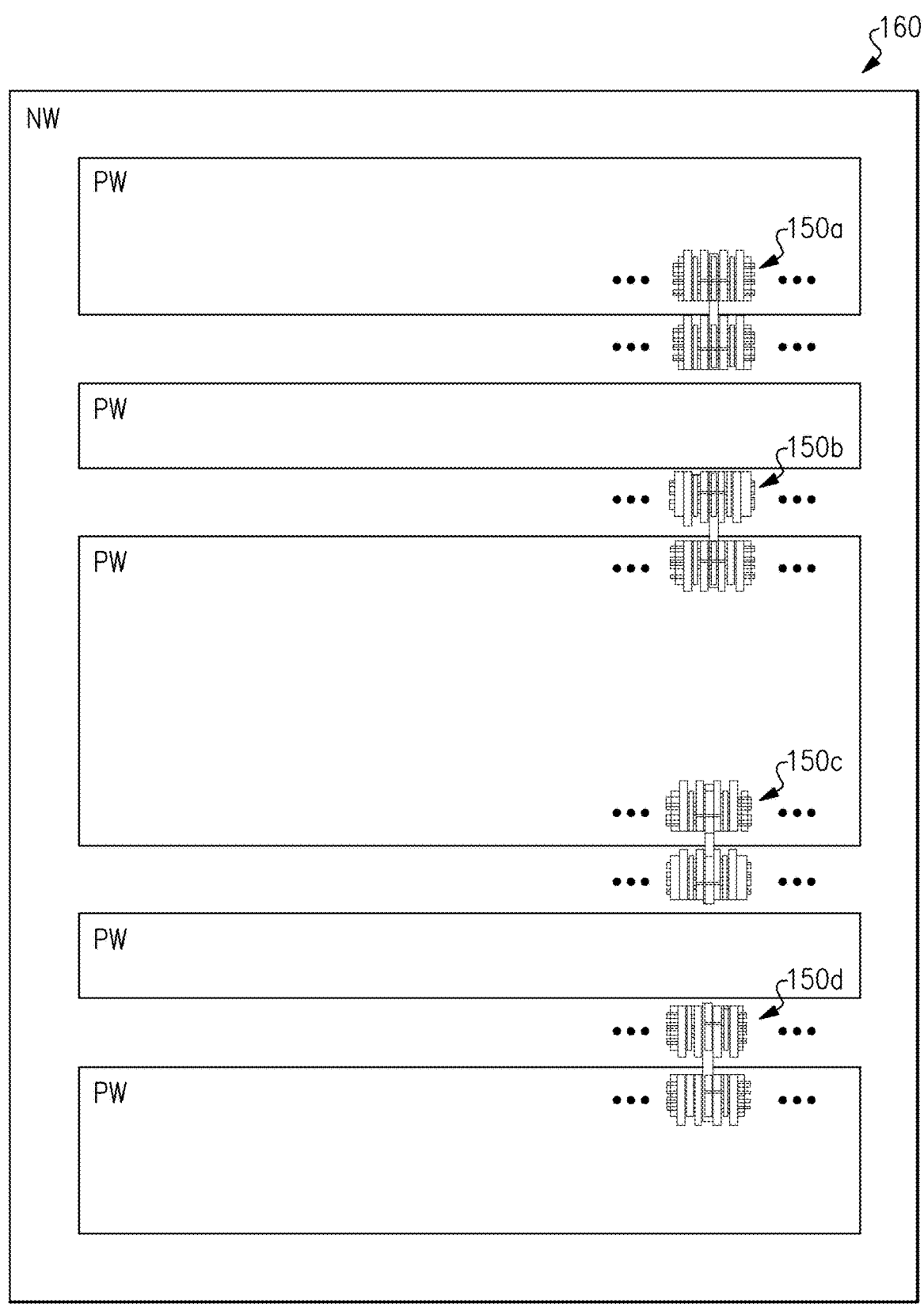
FIG. 5 is a plan view of an array of the FinFET thyristor protection structures of FIG. 4A.

FIG. 5 is a plan view of an array 160 of the FinFET thyristor protection structures of FIG. 4A. As shown in FIG. 5, multiple PWs are formed in the NW and separated from one another. Additionally, a first FinFET thyristor protection structure 150a, a second FinFET thyristor protection structure 150b, a third FinFET thyristor protection structure 150c, and a fourth FinFET thyristor protection structure 150d are depicted.

Although four FinFET thyristor protection structures are depicted, more and fewer can be included as indicated by the ellipsis.

The array 160 includes multiple FinFET thyristor protection structures that have been replicated. Additionally, metallization can be used to connect the corresponding terminals of the FinFET thyristor protection structures to one another. By implementing the array 160 in this manner, a desired amount of current handling can be achieved using a layout that is compact for small area, low parasitic capacitance, and/or flexibility to control or configure current handling capability. Any of the FinFET thyristor protection structures herein can be arranged in an array.

Figure 6:
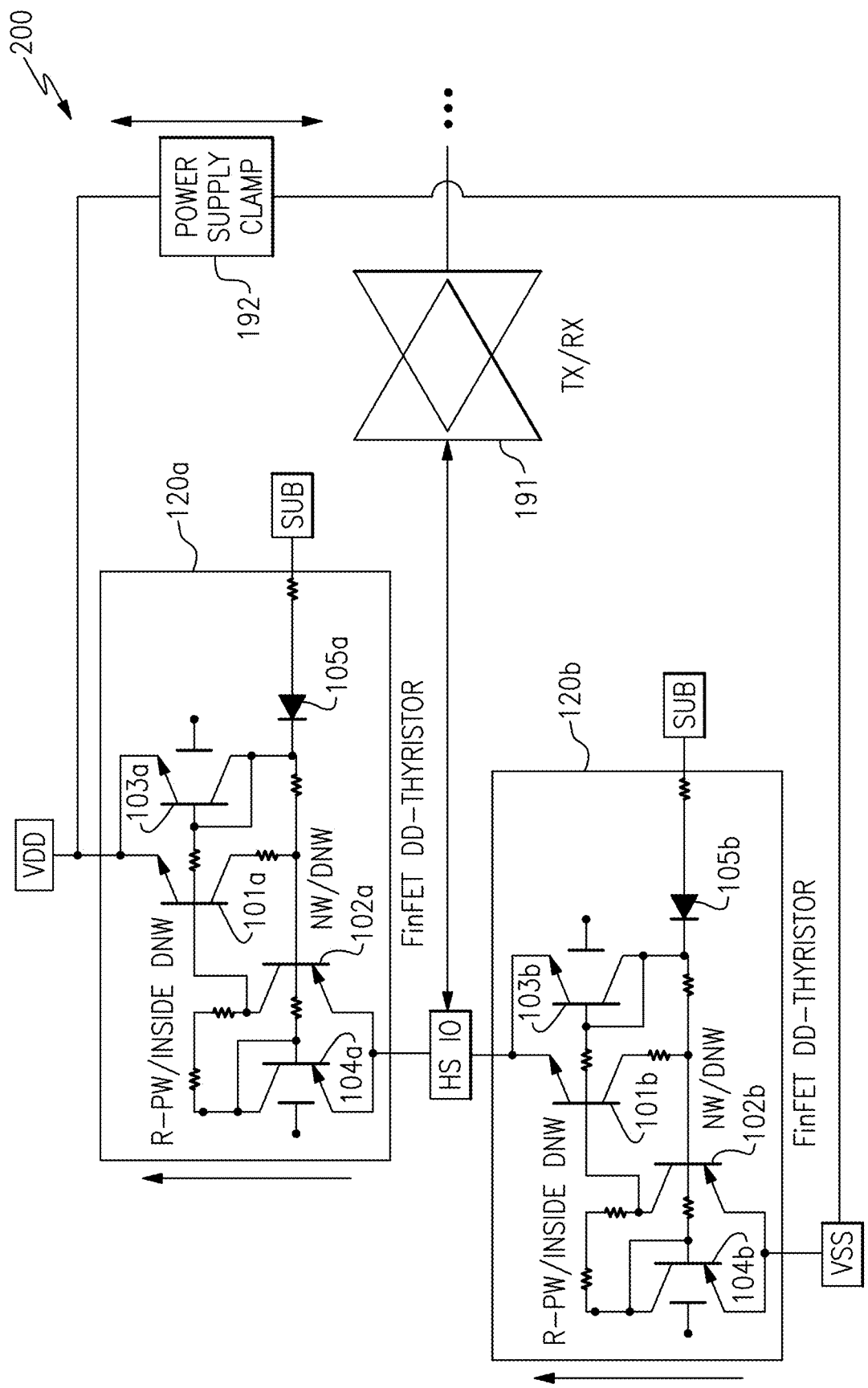
FIG. 6 is a schematic diagram of a high-speed transceiver interface protected using instantiations of the FinFET thyristor protection circuit of FIG. 3.

FIG. 6 is a schematic diagram of a high-speed transceiver interface 200 protected using instantiations of the FinFET thyristor protection circuit 120 of FIG. 3.

As shown in FIG. 6, the interface 200 includes a transceiver 191 that is coupled to a high-speed input and/or output (HS IO) pin. To protect the interface from damage, a first FinFET thyristor protection circuit 120a is connected between a power supply (VDD) pin and the HS IO pin, and a second FinFET thyristor protection circuit 120b is connected between the HS IO pin and a ground (VSS) pin. A power supply clamp 192 is also included between the VDD pin and the VSS pin.

The first FinFET thyristor protection circuit 120a and the second FinFET protection structure 120b are each implemented using an instantiation of the FinFET thyristor protection circuit 120 of FIG. 3.

For example, the first FinFET thyristor protection circuit 120a includes an NPN bipolar transistor 101a, a PNP bipolar transistor 102a, a FinFET gated NPN bipolar transistor 103a, a FinFET gated PNP bipolar transistor 104a, and a diode 105a. Additionally, the second FinFET thyristor protection circuit 120b includes an NPN bipolar transistor 101b, a PNP bipolar transistor 102b, a FinFET gated NPN bipolar transistor 103b, a FinFET gated PNP bipolar transistor 104b, and a diode 105b.

Figure 7B:
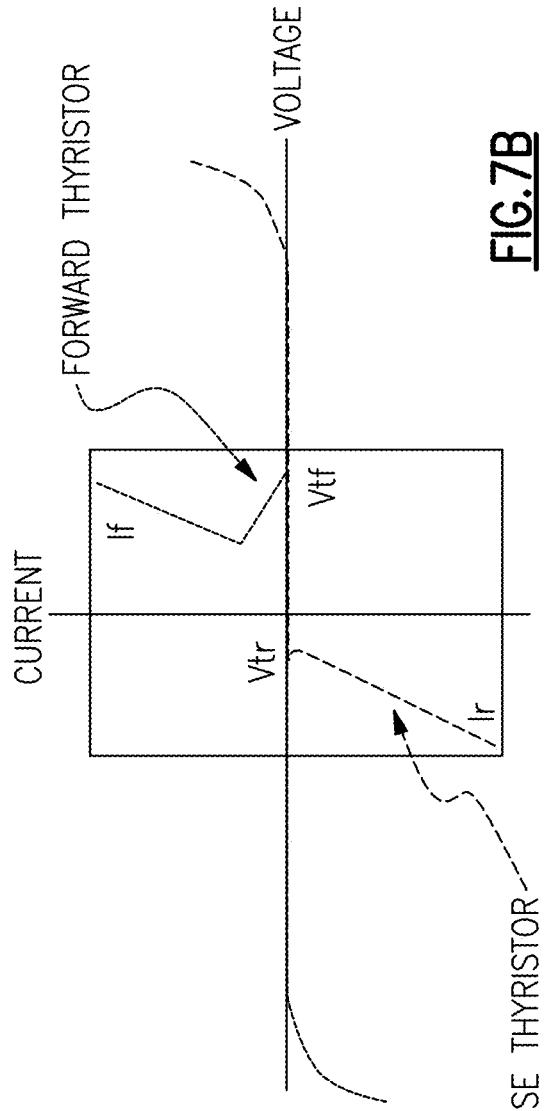
FIG. 7B is a graph of forward and reverse protection characteristics for the bidirectional FinFET thyristor protection structure of FIG. 7A.
Figure 7A:
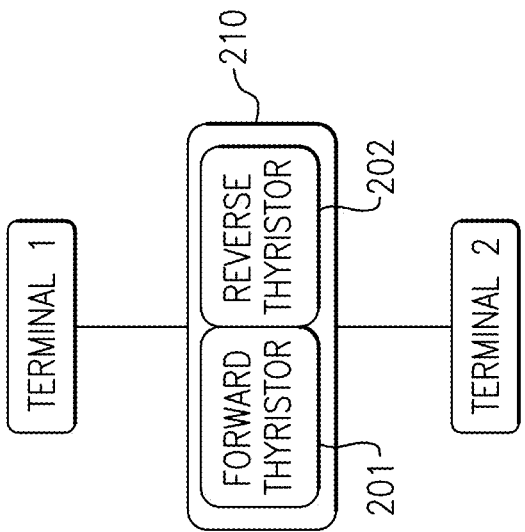
FIG. 7A is a schematic diagram of a bidirectional FinFET thyristor protection structure.

FIG. 7A is a schematic diagram of a bidirectional FinFET thyristor protection structure 210. The bidirectional FinFET thyristor protection structure 210 includes a forward thyristor protection structure 201 and a reverse thyristor protection structure 202 connected in parallel with one another between a first terminal and a second terminal. FIG. 7B is a graph of forward and reverse protection characteristics for the bidirectional FinFET thyristor protection structure 210 of FIG. 7A. The graph includes a voltage versus current plot depicting forward trigger voltage (Vtf), forward current (If), reverse trigger voltage Vtr, and reverse current (Jr).

With reference to FIGS. 7A and 7B, the forward protection characteristics of the bidirectional FinFET thyristor protection structure 210 are established by the forward thyristor protection structure 201, while the reverse protection characteristics of the bidirectional FinFET thyristor protection 210 are established by the reverse thyristor protection structure 202. Thus, the forward thyristor protection structure 201 provides little to no impact on reverse protection characteristics, while the reverse thyristor protection structure 202 provides little to no impact on forward protection characteristics.

Accordingly, the forward thyristor protection structure 201 can be designed/fine-tuned for high voltage tolerant operation to positive polarity overstress (increases the voltage of the first terminal relative to the second terminal) with very high blocking voltage for negative overstress. Additionally, the reverse thyristor protection structure 202 can be designed/fine-tuned for low trigger voltage operation to negative polarity overstress (decreases the voltage of the first terminal relative to the second terminal) with very high blocking voltage for positive polarity overstress. Thus, separate structures can be used to define forward and reverse protection characteristics.

Various FinFET thyristor protection structures herein can be used to define the forward or reverse characteristics of the bidirectional FinFET thyristor protection structure 210. Thus, the same or different types of FinFET thyristor protection structures can be used with connectivity made to proper terminals to achieve protection in a desired direction. In certain implementations herein, FinFET thyristor protection structures for reverse protection include DNW structures to aid in providing sufficient blocking voltage suitable for achieving a reverse protection characteristic.

Figure 8:
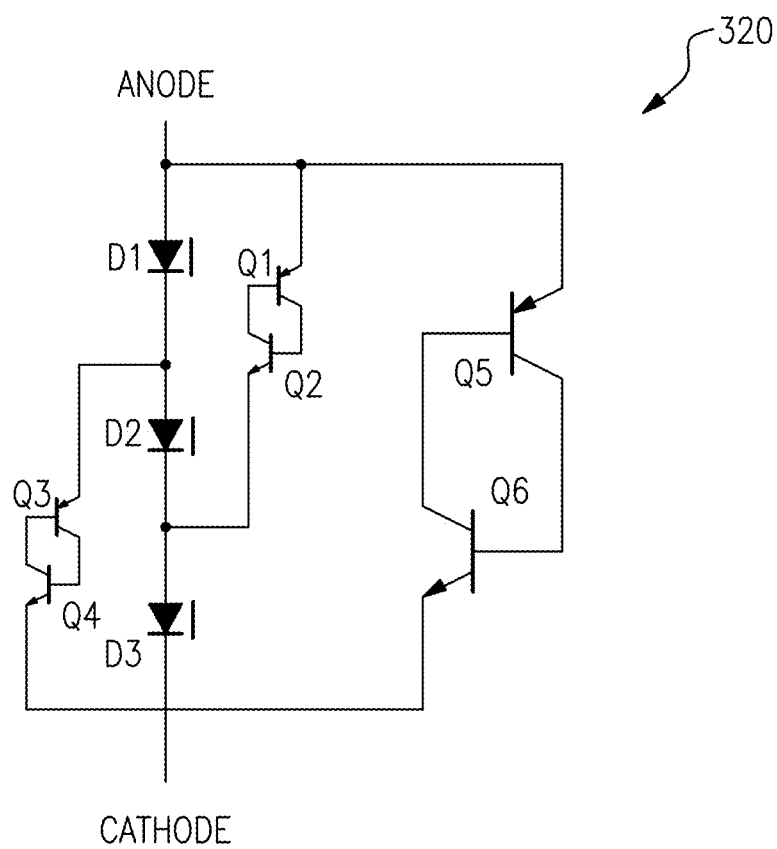
FIG. 8 is a circuit diagram of a FinFET thyristor protection circuit according to another embodiment.

FIG. 8 is a circuit diagram of a FinFET thyristor protection circuit 320 according to one embodiment. The FinFET thyristor protection circuit 320 includes an anode terminal, a cathode terminal, a first FinFET gated diode D1, a second FinFET gated diode D2, a third FinFET gated diode D3, a first bipolar transistor Q1 (p-type or PNP), a second bipolar transistor Q2 (n-type or NPN), a third bipolar transistor Q3 (PNP), a fourth bipolar transistor Q4 (NPN), a fifth bipolar transistor Q5 (PNP), and a sixth bipolar transistor Q6 (NPN). The revere thyristor protection circuit 320 illustrates one embodiment of a reverse protection circuit for establishing reverse protection characteristics of a bidirectional FinFET thyristor protection structure. However, other implementation of reverse protection structures are possible.

As shown in FIG. 8, the first FinFET gated diode D1, the second FinFET gated diode D2, and the third FinFET gated diode D3 are connected in series, from anode to cathode, between the anode terminal and the cathode terminal. The first bipolar transistor Q1 and the second bipolar transistor Q2 operate as a first thyristor connected between the anode terminal and the anode of the third FinFET gated diode D3. Additionally, the third bipolar transistor Q3 and the fourth bipolar transistor Q4 operate as a second thyristor connected between the cathode of the first FinFET gated diode D1 and the cathode terminal. Furthermore, the fifth bipolar transistor Q5 and the sixth bipolar transistor Q6 operate as a third thyristor connected between the anode terminal and the cathode terminal.

The series combination of FinFET gated diodes in parallel with the third thyristor provides low trigger voltage operation to negative polarity overstress (decreases in the voltage of the cathode terminal relative to the anode terminal), with the series combination of FinFET gated diodes activating first. Additionally, the series combination of FinFET gated diodes provides with very high blocking voltage for positive polarity overstress (increases the voltage of the cathode terminal relative to the anode terminal).

Figure 9A:
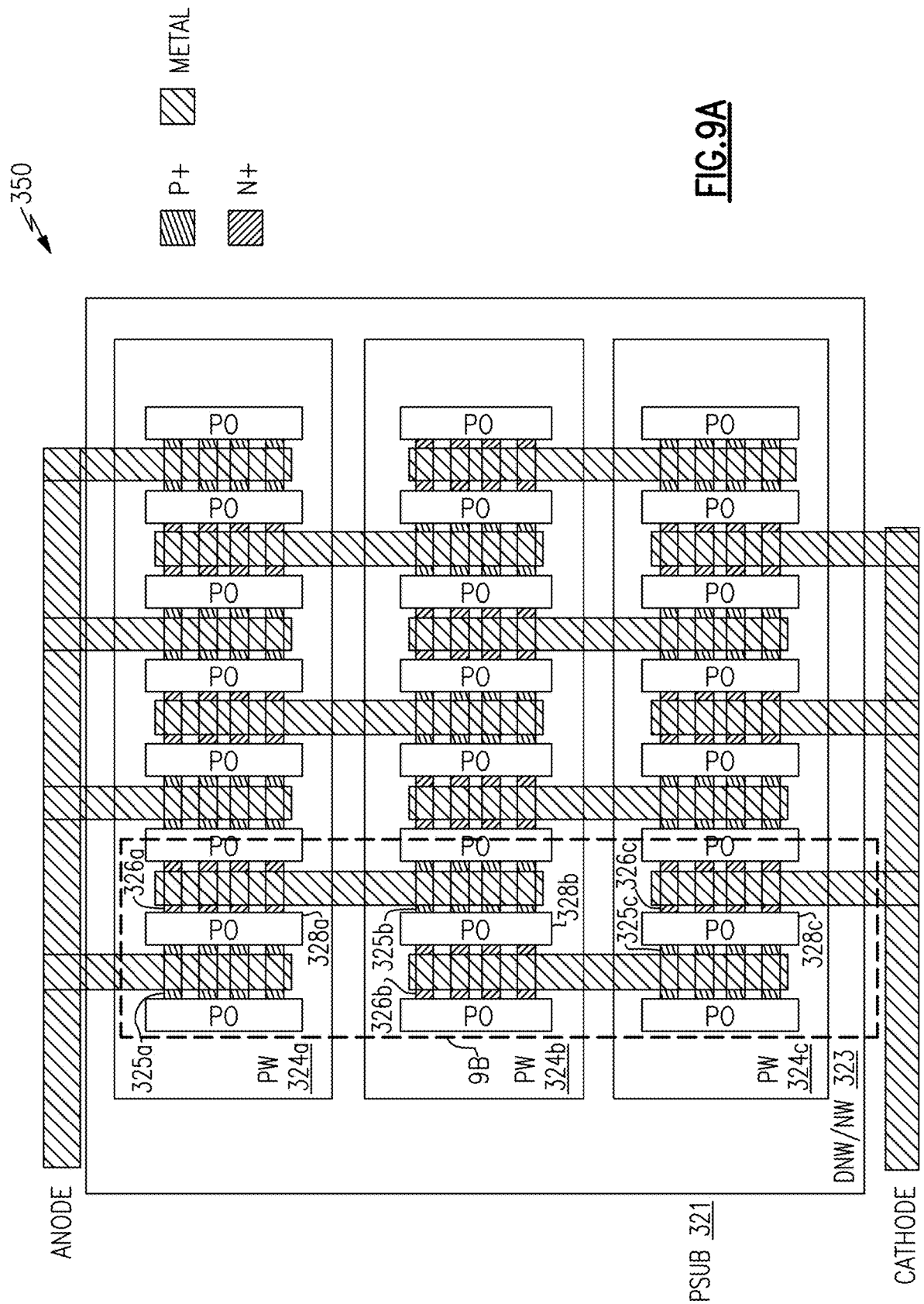
FIG. 9A is a plan view of a FinFET thyristor protection structure according to another embodiment.
Figure 9B:
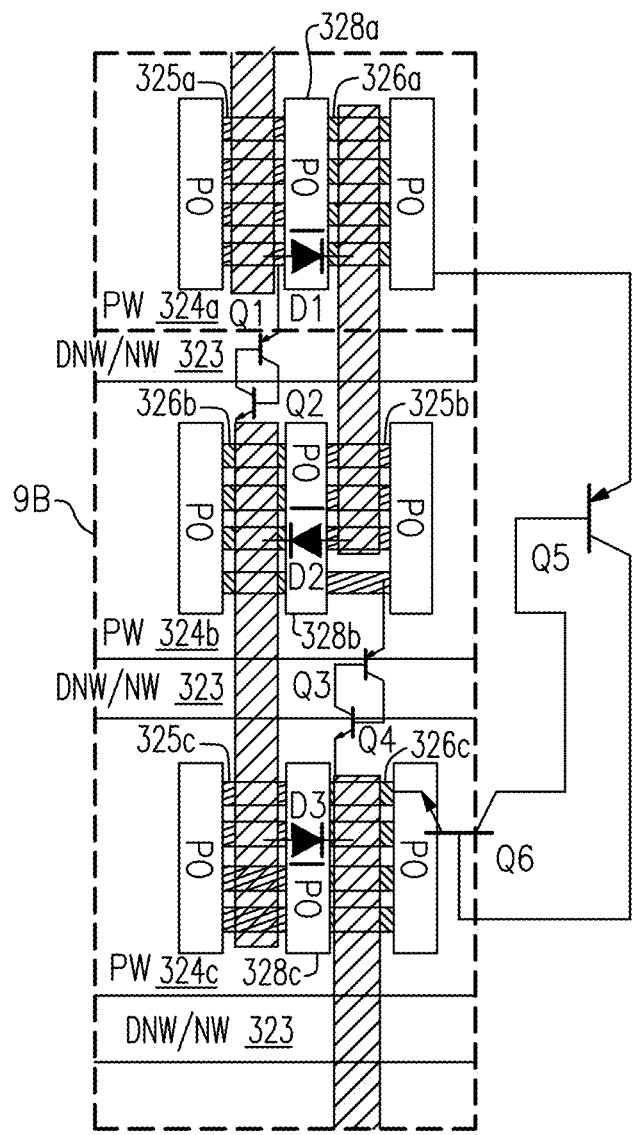
FIG. 9B is an annotated plan view of a portion of the FinFET thyristor protection structure of FIG. 9A.

FIG. 9A is a plan view of a FinFET thyristor protection structure 350 according to one embodiment. FIG. 9B is an annotated plan view of a portion 9B of the FinFET thyristor protection structure 350 of FIG. 9A. The FinFET thyristor protection structure 350 illustrates one embodiment of a chip layout used to implement the FinFET thyristor protection circuit 320 of FIG. 8. However, the FinFET thyristor protection circuit 320 of FIG. 8 can be implemented in other ways. One or more instantiations of the FinFET thyristor protection structure 350 can be included on a semiconductor die for overstress protection.

With reference to FIGS. 9A-9B, the FinFET thyristor protection structure 350 is fabricated in a PSUB 321, and includes a DNW/NW 323 formed in the PSUB 321. The FinFET thyristor protection structure 350 further includes a first PW 324a, a second PW 324b, and a third PW 324c each formed in the DNW/NW 323 and spaced apart from one another, with the second PW 324b positioned between the first PW 324a and the third PW 324c. NW is not present where the first PW 324a, the second PW 324b, and the third PW 324c are located, but DNW is present beneath the PWs.

With reference to the portion 9B shown in FIG. 9B, a first group of P+ regions 325a and a first group of N+ regions 326a are formed in the first PW 324a. Additionally, a second group of P+ regions 325b and a second group of N+ regions 326b are formed in the second PW 324b. Furthermore, a third group of P+ regions 325c and a third group of N+ regions 326c are formed in the third PW 324c. Additionally, a first group of gate fin regions 328a is formed over the first PW 324a, a second group of gate fin regions 328b is formed over the second PW 324b, and a third group of gate fin regions 328c is formed over the third PW 324c. Various metallization is depicted.

The cross sections are also annotated to show various devices formed from the layout. The devices correspond to those of the FinFET thyristor protection circuit 320 of FIG. 8.

For example, the FinFET thyristor protection structure 350 includes a first gated diode D1 having an anode, a cathode, and a gate associated with P+ regions 325a, N+ regions 326a, and gate fin regions 328a, respectively. Additionally, the FinFET thyristor protection structure 350 includes a second gated diode D2 having an anode, a cathode, and a gate associated with P+ regions 325b, N+ regions 326b, and gate fin regions 328b, respectively. Furthermore, the FinFET thyristor protection structure 350 includes a third gated diode D3 having an anode, a cathode, and a gate associated with P+ regions 325c, N+ regions 326c, and gate fin regions 328c, respectively.

The FinFET thyristor protection structure 350 further includes a first bipolar transistor Q1 (PNP) having an emitter, a base, and a collector associated with PW 324a, DNW/NW 323, and PW 324b, respectively. Furthermore, the FinFET thyristor protection structure 350 further includes a second bipolar transistor Q2 (NPN) having an emitter, a base, and a collector associate with N+ regions 326b, PW 324b, and DNW/NW 323, respectively. Additionally, the FinFET thyristor protection structure 350 further includes a third bipolar transistor Q3 (PNP) having an emitter, a base, and a collector associated with the PW 324b, the DNW/NW 323, and the PW 324c, respectively. Furthermore, the FinFET thyristor protection structure 350 further includes a fourth bipolar transistor Q4 (NPN) having an emitter, a base, and a collector associated with the N+ regions 326c, PW 324c, and DNW/NW 323, respectively. Additionally, the FinFET thyristor protection structure 350 further includes a fifth bipolar transistor Q5 (PNP) having an emitter, a base, and a collector associated with the PW 324a, the DNW/NW 323, and the PW 324c, respectively. Furthermore, the FinFET thyristor protection structure 350 further includes a sixth bipolar transistor Q6 (NPN) having an emitter, a base, and a collector associated with the N+ regions 326c, the PW 324c and the DNW/NW 323, respectively.

Figure 10:
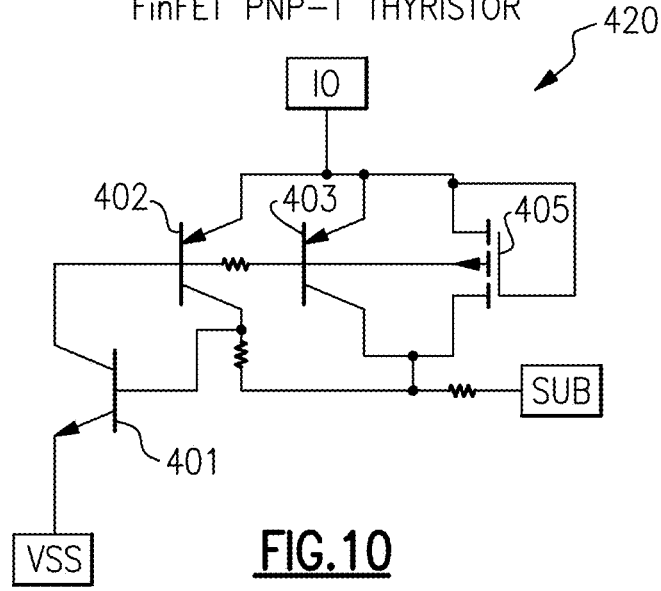
FIG. 10 is a circuit diagram of a FinFET thyristor protection circuit according to another embodiment.

FIG. 10 is a circuit diagram of a FinFET thyristor protection circuit 420 according to another embodiment. The FinFET thyristor protection circuit 420 includes an NPN bipolar transistor 401, a PNP bipolar transistor 402, a triggering PNP transistor 403, and a triggering p-type FinFET 405. One example connectivity of the FinFET thyristor protection circuit 420 to an IO terminal, a SUB terminal, and a VSS terminal is depicted. However, the FinFET thyristor protection circuit 420 can be connected between other terminals.

The PNP bipolar transistor 402 and the NPN bipolar transistor 401 are cross-coupled to form a thyristor. In addition to the thyristor, the FinFET thyristor protection circuit 420 further includes the triggering PNP bipolar transistor 403 and the triggering p-type FinFET 405, which aid in activating the thyristor, providing overstress protection during a time period before the thyristor is activated, and/or reducing total on-state resistance of the FinFET thyristor protection circuit 420 after the thyristor has activated.

As shown in FIG. 10, the NPN bipolar transistor 401 includes an emitter connected to the VSS terminal, a base connected to a collector of the PNP bipolar transistor 402, and a collector connected to a base of the PNP bipolar transistor 402. The PNP bipolar transistor 402 further includes an emitter connected to the IO terminal. The triggering p-type FinFET 405 includes a body connected to a base of the PNP bipolar transistor 402, a drain connected to the base of the NPN bipolar transistor 401, and a source and a gate connected to the IO terminal. In certain implementations, the source to gate connection of the triggering p-type FinFET 405 is made in metallization. The triggering PNP bipolar transistor 403 includes an emitter connected to the IO terminal, a base connected to the body of the triggering p-type FinFET 405, and a collector connected to the drain of the triggering p-type FinFET 405.

Although illustrated for an implementation in which the FinFET 405 is p-type, the teachings herein are also applicable to implementations in which the FinFET is n-type. Likewise, although the triggering PNP bipolar transistor 403 is p-type, the teachings herein are also applicable to implementations using triggering NPN bipolar transistors.

In response to overstress, the triggering p-type FinFET 405 and/or the triggering PNP bipolar transistor 403 activate to provide a current path for overstress protection. The current path is from the IO terminal to the VSS terminal through the triggering p-type FinFET 405 and/or the triggering PNP bipolar transistor 403 and the base-to-emitter junction of the NPN bipolar transistor 401. The FinFET thyristor protection circuit 420 is also referred to herein as a FinFET PNP triggered (PNP-T) thyristor.

Figure 11A:
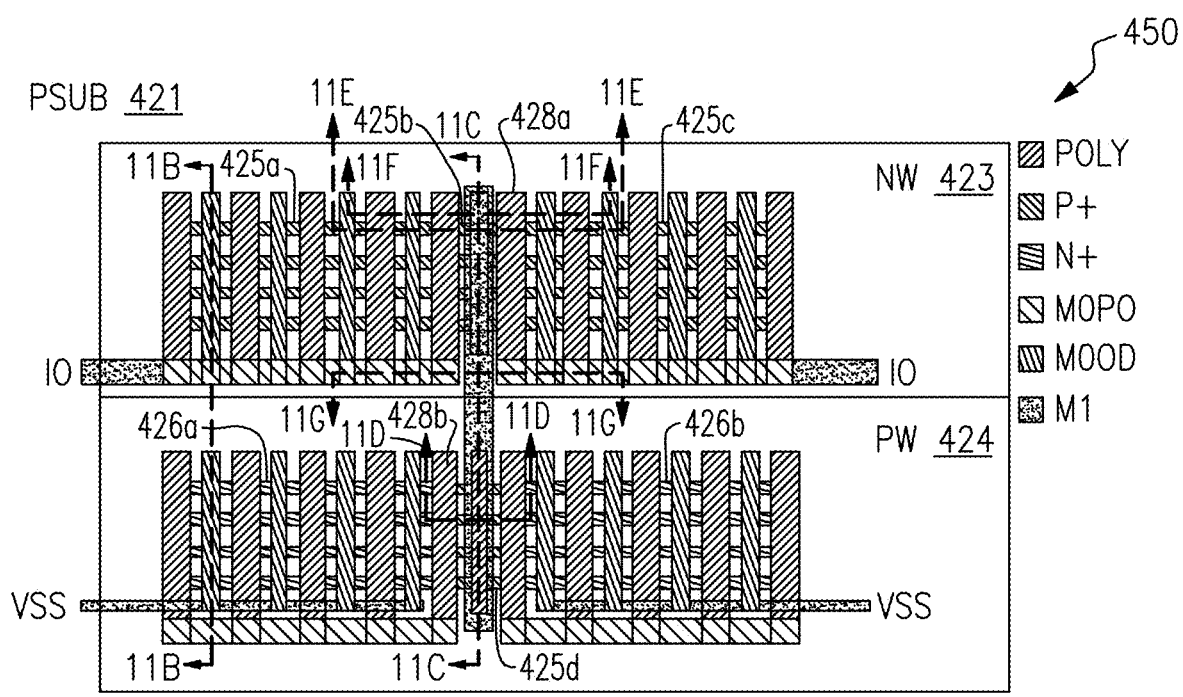
FIG. 11A is a plan view of a FinFET thyristor protection structure according to another embodiment.
Figure 11B:
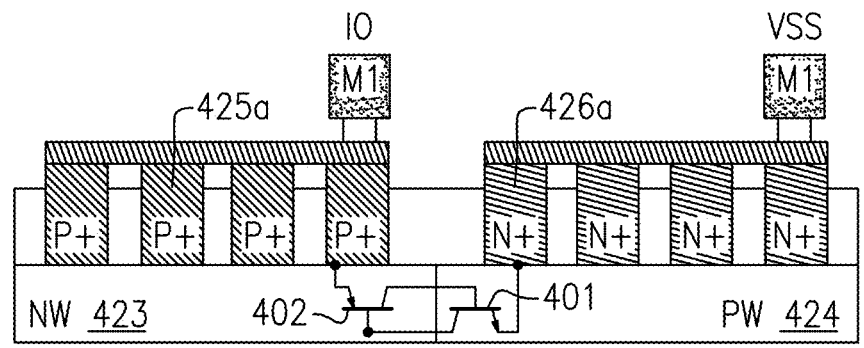
FIG. 11B is a cross section of the FinFET thyristor protection structure of FIG. 11A taken along the lines 11B-11B.
Figure 11C:
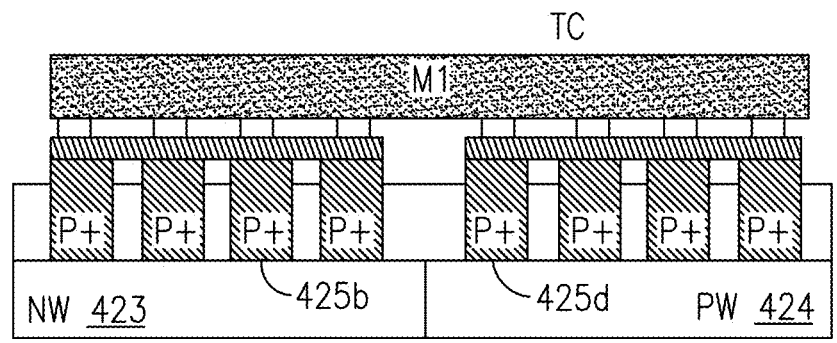
FIG. 11C is a cross section of the FinFET thyristor protection structure of FIG. 11A taken along the lines 11C-11C.
Figure 11D:
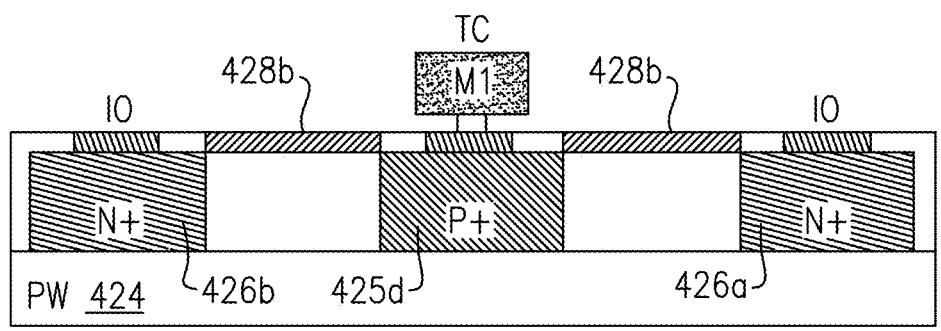
FIG. 11D is a cross section of the FinFET thyristor protection structure of FIG. 11A taken along the lines 11D-11D.
Figure 11E:
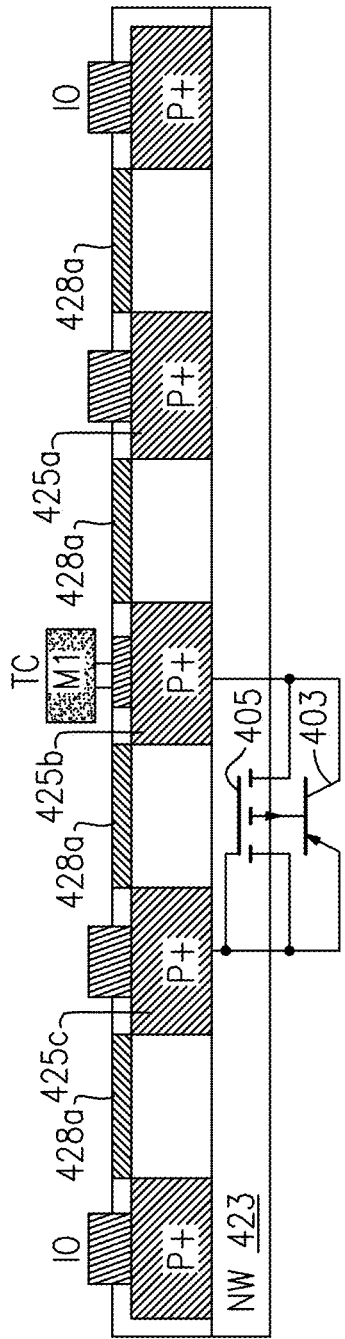
FIG. 11E is a cross section of the FinFET thyristor protection structure of FIG. 11A taken along the lines 11E-11E.
Figure 11F:
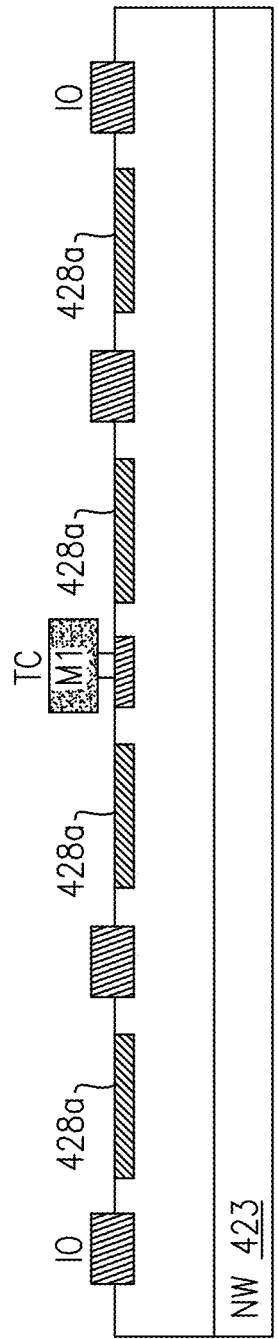
FIG. 11F is a cross section of the FinFET thyristor protection structure of FIG. 11A taken along the lines 11F-11F.
Figure 11G:
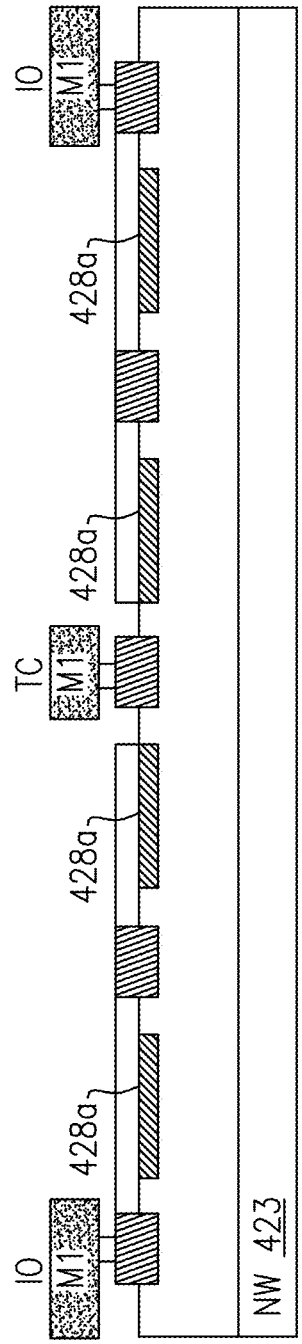
FIG. 11G is a cross section of the FinFET thyristor protection structure of FIG. 11A taken along the lines 11G-11G.

FIGS. 11A-11G illustrate another embodiment of a FinFET thyristor protection structure 450. FIG. 11A is a plan view of the FinFET thyristor protection structure 450. FIG. 11B is a cross section of the FinFET thyristor protection structure 450 of FIG. 11A taken along the lines 11B-11B. FIG. 11C is a cross section of the FinFET thyristor protection structure 450 of FIG. 11A taken along the lines 11C-11C. FIG. 11D is a cross section of the FinFET thyristor protection structure 450 of FIG. 11A taken along the lines 11D-11D. FIG. 11E is a cross section of the FinFET thyristor protection structure 450 of FIG. 11A taken along the lines 11E-11E. FIG. 11F is a cross section of the FinFET thyristor protection structure 450 of FIG. 11A taken along the lines 11F-11F. FIG. 11G is a cross section of the FinFET thyristor protection structure 450 of FIG. 11A taken along the lines 11G-11G.

The FinFET thyristor protection structure 450 of FIGS. 11A-11G illustrates one embodiment of a chip layout used to implement the FinFET thyristor protection circuit 420 of FIG. 10. However, the FinFET thyristor protection circuit 420 of FIG. 10 can be implemented in other ways.

With reference to FIGS. 11A-11G, the FinFET thyristor protection structure 450 is fabricated in a PSUB 421, and includes an NW 423 and a PW 424 formed adjacent to one another in the PSUB 421.

A first group of P+ regions 425a, a second group of P+ regions 425b, and a third group of P+ regions 425c are formed in the NW 423, with the second group of P+ regions 425b positioned between the first group of P+ regions 425a and the third group of P+ regions 425c. Additionally, a first group of N+ regions 426a, a fourth group of P+ regions 425d, and a second group of N+ regions 426b are formed in the PW 424, with the fourth group of P+ regions 425d positioned between the first group of N+ regions 426a and the second group of N+ regions 426b. Additionally, a first group of gate fin regions 428a is formed over the NW 423 and a second group of gate fin regions 428b is formed over the PW 424. Various metallization including metal zero routes (M0PO and M0OD), metal one routes (M1), and vias and contacts are depicted.

The cross sections are also annotated to show various devices formed from the layout. The devices correspond to those of the FinFET thyristor protection circuit 420 of FIG. 10.

For example, the FinFET thyristor protection structure 450 includes an NPN bipolar transistor 401 having an emitter, a base, and a collector corresponding to the N+ regions 426a-426b, the PW 424, and the NW 423, respectively. Additionally, the FinFET thyristor protection structure 450 includes a PNP bipolar transistor 402 having an emitter, a base, and a collector corresponding to the P+ regions 425a/425c, the NW 423, and the PW 424, respectively.

With continuing reference to FIGS. 11A-11G, the FinFET thyristor protection structure 450 further includes a triggering p-type FinFET 405 having a body, a source, a gate, and a drain associated with NW 423, P+ regions 425a/425c, gate fin regions 428a, and P+ regions 425b, respectively. Additionally, the FinFET thyristor protection structure 450 further includes a triggering PNP bipolar transistor 403 having an emitter, a base, and a collector associated with P+ regions 425a-425b, NW 423, and PW 424, respectively. A conductor TC is used to connect the PW 424 to the P+ regions 425b, thereby connecting the collector of the triggering PNP bipolar transistor 403 to the drain of the triggering p-type FinFET 405 as well as to the base of the NPN bipolar transistor 401. FIG. 11G depicts the gate-to-source connection of the triggering p-type FinFET 405.

Figure 12:
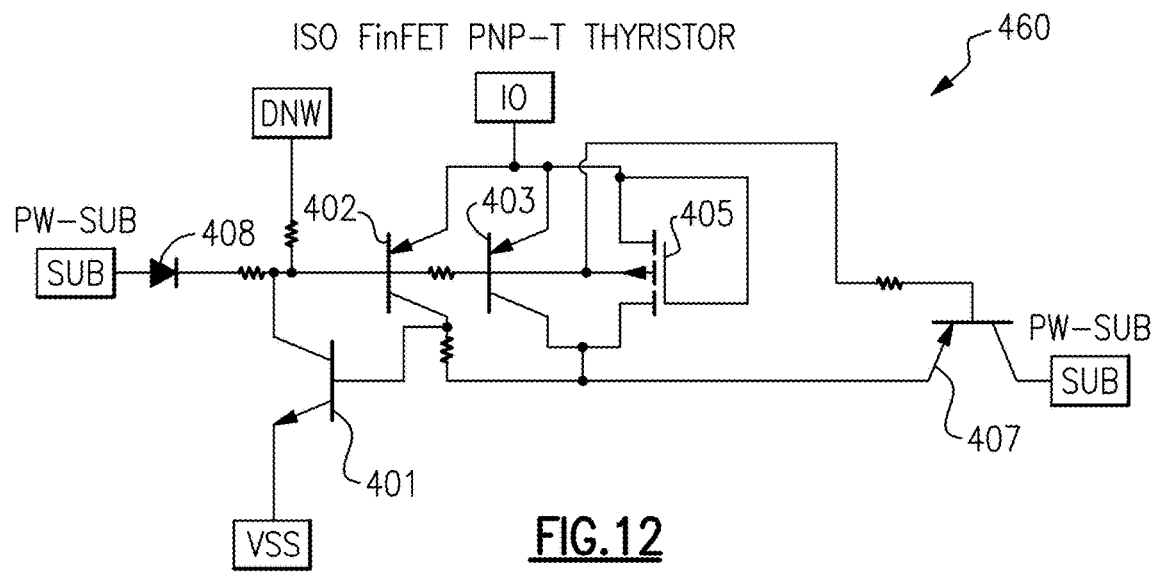
FIG. 12 is a circuit diagram of a FinFET thyristor protection circuit according to another embodiment.

FIG. 12 is a circuit diagram of a FinFET thyristor protection circuit 460 according to another embodiment. The FinFET thyristor protection circuit 460 includes an NPN bipolar transistor 401, a PNP bipolar transistor 402, a triggering PNP transistor 403, a triggering p-type FinFET 405, a substrate PNP bipolar transistor 407, and a substrate diode 408. One example connectivity of the FinFET thyristor protection circuit 460 to an IO terminal, a SUB terminal, and a VSS terminal is depicted. However, the FinFET thyristor circuit 460 can be connected to other terminals.

The FinFET thyristor protection circuit 460 of FIG. 12 is similar to the FinFET thyristor protection circuit 420 of FIG. 10, except that the FinFET thyristor protection circuit 460 further includes the substrate PNP bipolar transistor 407 and the substrate diode 408, which are associated with isolating the FinFET thyristor protection circuit 420 of FIG. 10 from a PSUB using a DNW isolation tub. Furthermore, in certain implementations, a PW guard ring is included around the DNW isolation tub to reduce carrier injection into the PSUB. The FinFET thyristor protection circuit 460 of FIG. 12 is also referred to herein as an ISO FinFET PNP-T thyristor.

Figure 13:
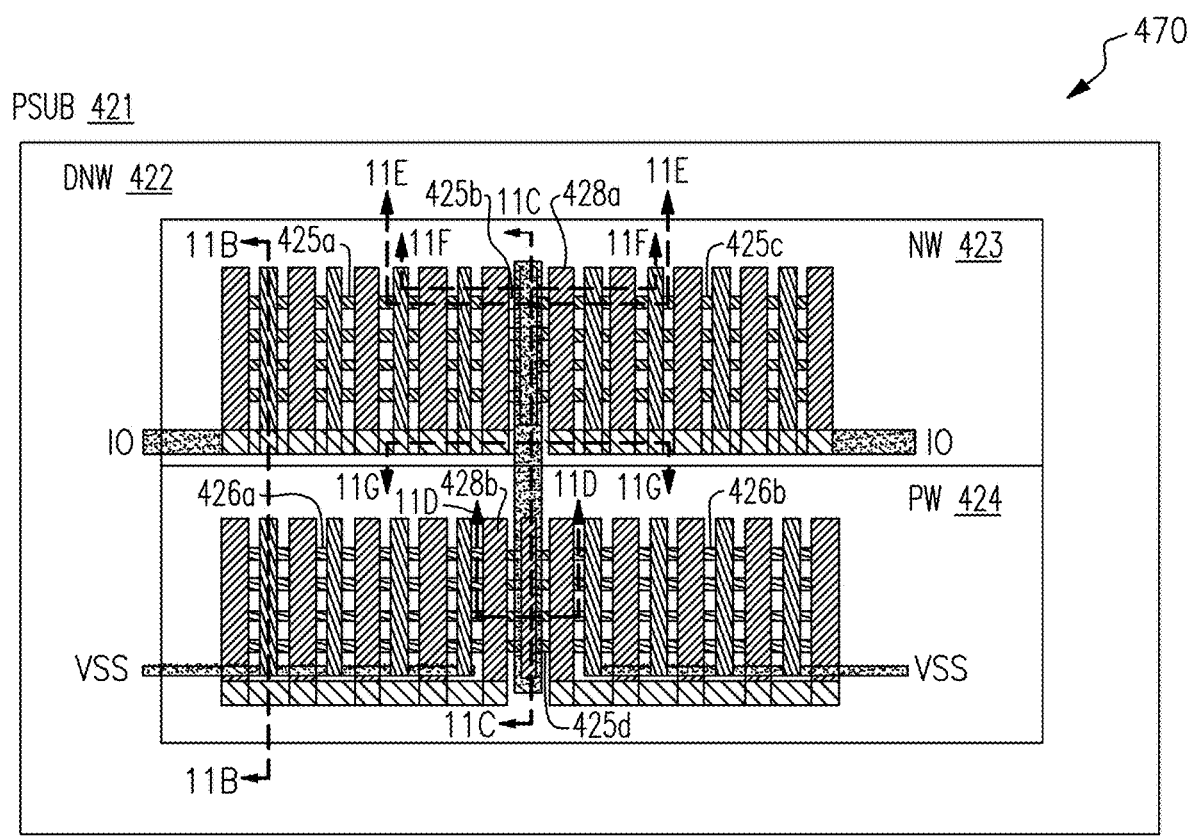
FIG. 13 is a plan view of a FinFET thyristor protection structure according to another embodiment.

FIG. 13 is a plan view of a FinFET thyristor protection structure 470 according to another embodiment. The FinFET thyristor protection structure 470 of FIG. 13 illustrates one embodiment of a chip layout used to implement the FinFET thyristor protection circuit 460 of FIG. 12. However, the FinFET thyristor protection circuit 460 of FIG. 12 can be implemented in other ways.

The FinFET thyristor protection structure 470 of FIG. 13 is similar to the FinFET thyristor protection structure 450 of FIGS. 11A-11G, except that the FinFET thyristor protection structure 470 further includes a DNW 422.

Figure 14:
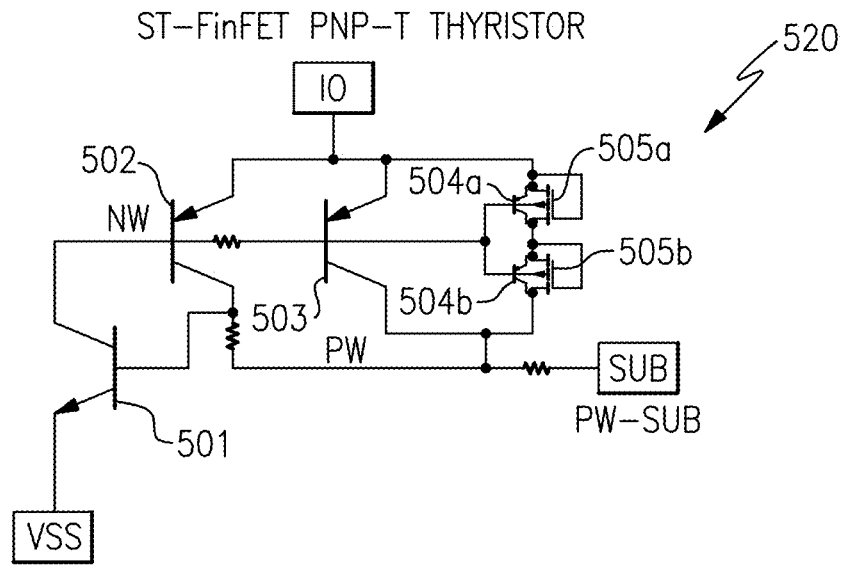
FIG. 14 is a circuit diagram of a FinFET thyristor protection circuit according to another embodiment.

FIG. 14 is a circuit diagram of a FinFET thyristor protection circuit 520 according to another embodiment. The FinFET thyristor protection circuit 520 includes an NPN bipolar transistor 501, a PNP bipolar transistor 502, a triggering PNP transistor 503, a first stacked PNP transistor 504a, a second stacked PNP transistor 504b, a first stacked p-type FinFET 505a, and a second stacked p-type FinFET 505b. The stacked FinFETs are also referred to herein as cascoded FinFETs. One example connectivity of the FinFET thyristor protection circuit 520 to an IO terminal, a SUB terminal, and a VSS terminal is depicted. However, the FinFET thyristor circuit 520 can be connected to other terminals.

The PNP bipolar transistor 502 and the NPN bipolar transistor 501 are cross-coupled to form a thyristor. In addition to the thyristor, the FinFET thyristor protection circuit 520 further includes FinFET triggering circuitry that aids in activating the thyristor, providing overstress protection during a time period before the thyristor is activated, and/or reducing total on-state resistance of the FinFET thyristor protection circuit 520 after the thyristor has activated. The FinFET triggering circuitry includes the triggering PNP bipolar transistor 503, the first stacked PNP transistor 504a, the second stacked PNP transistor 504b, the first stacked p-type FinFET 505a, and the second stacked p-type FinFET 505b.

As shown in FIG. 14, the NPN bipolar transistor 501 includes an emitter connected to the VSS terminal, a base connected to a collector of the PNP bipolar transistor 502, and a collector connected to a base of the PNP bipolar transistor 502. The PNP bipolar transistor 502 further includes an emitter connected to the IO terminal. The first stacked p-type FinFET 505a includes a body connected to a base of the first stacked PNP bipolar transistor 504a, a drain connected to a collector of the first stacked PNP bipolar transistor 504a, and a source and a gate connected to the IO terminal and to an emitter of the first stacked PNP bipolar transistor 504a. In certain implementations, the source to gate connection of the first stacked p-type FinFET 505a is made in metallization. The second stacked p-type FinFET 505b includes a body connected to a base of the second stacked PNP bipolar transistor 504b, a drain connected to a collector of the second stacked PNP bipolar transistor 504b, and a source and a gate connected to an emitter of the second stacked PNP bipolar transistor 504a and to the drain of the first stacked p-type FinFET 505a. In certain implementations, the source to gate connection of the second stacked p-type FinFET 505b is made in metallization.

As shown in FIG. 14, the triggering PNP bipolar transistor 503 includes an emitter electrically connected to the IO terminal, a base connected to the bases of the stacked PNP bipolar transistors 504a-504b, and a collector connected to the base of the NPN bipolar transistor 501 and to the collector of the second stacked PNP bipolar transistor 504b.

Although illustrated for an implementation in which the FinFET triggering circuitry is p-type, the teachings herein are also applicable to implementations using n-type devices or a combination of n-type and p-type devices.

In response to overstress, the FinFET triggering circuitry activates to provide a current path for overstress protection. The current path is from the IO terminal to the VSS terminal through the FinFET triggering circuitry and the base-to-emitter junction of the NPN bipolar transistor 501. The FinFET thyristor protection circuit 520 is also referred to herein as a stacked FinFET (ST-FinFET) PNP triggered (PNP-T) thyristor.

Inclusion of stacked FinFET devices aids in providing a mechanism for fine-tuning the protection characteristics and/or for providing greater robustness to high RF power.

Figure 15A:
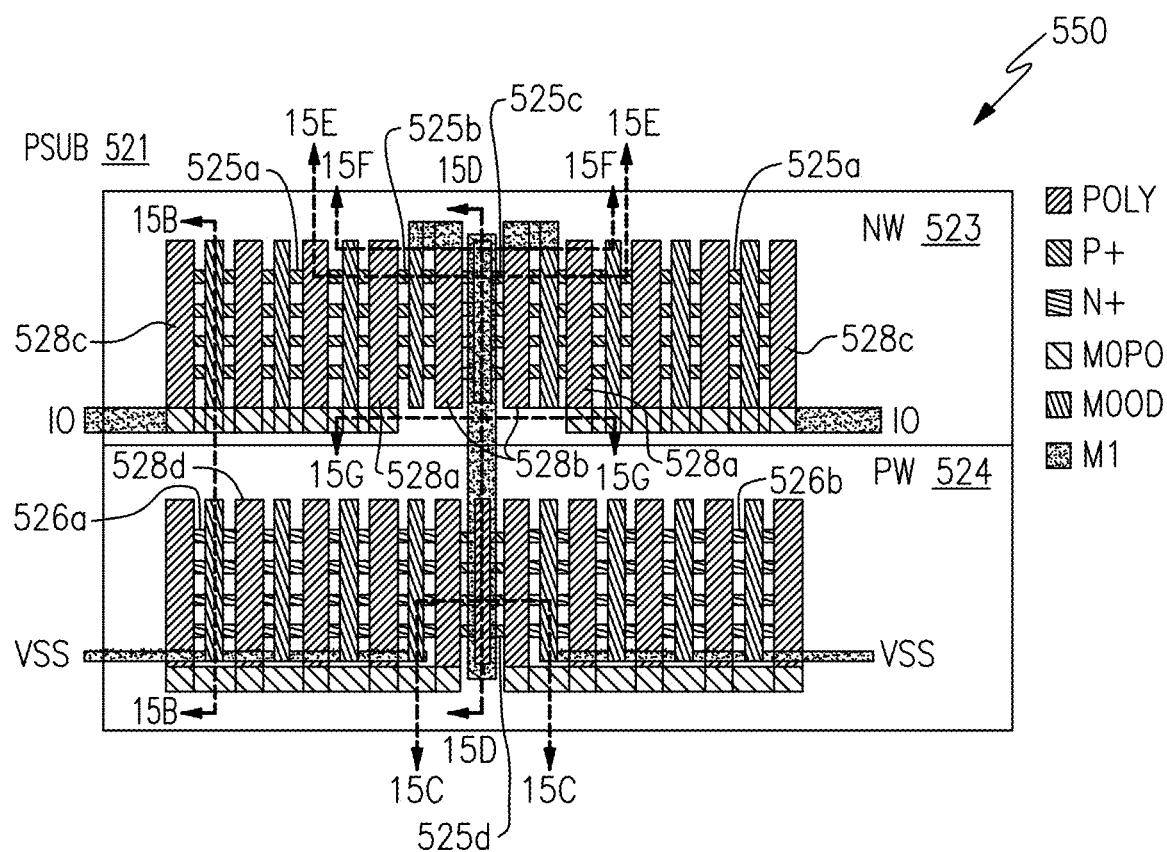
FIG. 15A is a plan view of a FinFET thyristor protection structure according to another embodiment.
Figure 15F:
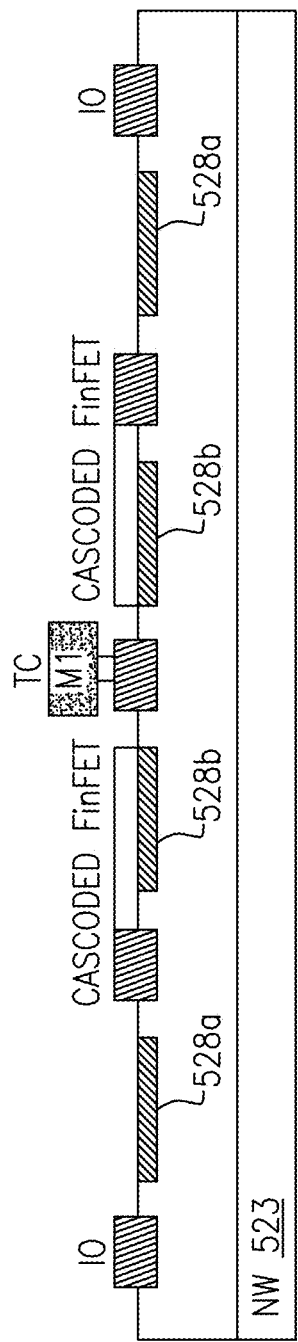
FIG. 15F is a cross section of the FinFET thyristor protection structure of FIG. 15A taken along the lines 15F-15F.
Figure 15G:
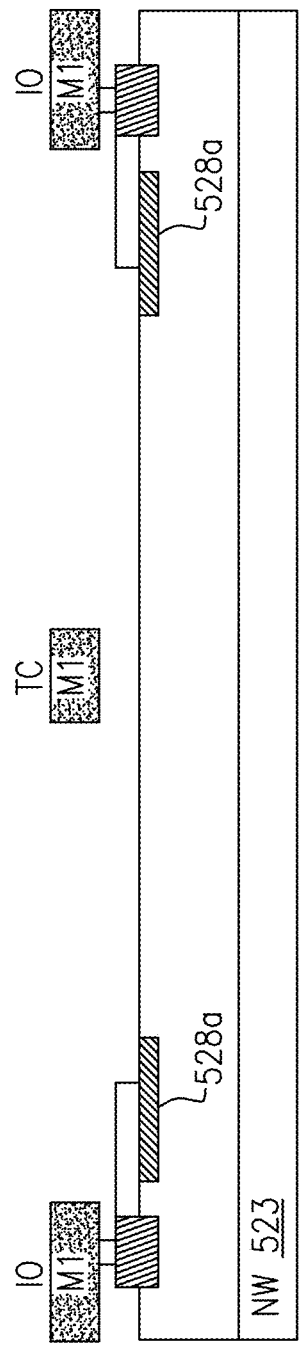
FIG. 15G is a cross section of the FinFET thyristor protection structure of FIG. 15A taken along the lines 15G-15G.

FIGS. 15A-15G illustrate another embodiment of a FinFET thyristor protection structure 550. FIG. 15A is a plan view of the FinFET thyristor protection structure 550. FIG. 15B is a cross section of the FinFET thyristor protection structure 550 of FIG. 15A taken along the lines 15B-15B. FIG. 15C is a cross section of the FinFET thyristor protection structure 550 of FIG. 15A taken along the lines 15C-15C. FIG. 15D is a cross section of the FinFET thyristor protection structure 550 of FIG. 15A taken along the lines 15D-15D. FIG. 15E is a cross section of the FinFET thyristor protection structure 550 of FIG. 15A taken along the lines 15E-15E. FIG. 15F is a cross section of the FinFET thyristor protection structure 550 of FIG. 15A taken along the lines 15F-15F. FIG. 15G is a cross section of the FinFET thyristor protection structure 550 of FIG. 15A taken along the lines 15G-15G.

The FinFET thyristor protection structure 550 of FIGS. 15A-15G illustrates one embodiment of a chip layout used to implement the FinFET thyristor protection circuit 520 of FIG. 14. However, the FinFET thyristor protection circuit 520 of FIG. 14 can be implemented in other ways.

With reference to FIGS. 15A-15G, the FinFET thyristor protection structure 550 is fabricated in a PSUB 521, and includes an NW 523 and a PW 524 formed adjacent to one another in the PSUB 521.

A first group of P+ regions 525a, a second group of P+ regions 525b, and a third group of P+ regions 525c are formed in the NW 423, with the second group of P+ regions 525b positioned between the first group of P+ regions 525a and the third group of P+ regions 525c (the P+ regions have horizontal mirror symmetry, in this embodiment). Additionally, a first group of N+ regions 526a, a fourth group of P+ regions 525d, and a second group of N+ regions 526b are formed in the PW 524, with the fourth group of P+ regions 525d positioned between the first group of N+ regions 526a and the second group of N+ regions 526b. Additionally, a first group of gate fin regions 528a, a second group of gate fin regions 528b, and a third group of gate fin regions 528c are formed over the NW 523, while a fourth group of gate fin regions 528d is formed over the PW 524. Various metallization including metal zero routes (M0P0 and M0OD), metal one routes (M1), and vias and contacts are depicted.

The cross sections are also annotated to show various devices formed from the layout. The devices correspond to those of the FinFET thyristor protection circuit 520 of FIG. 14.

For example, the FinFET thyristor protection structure 550 includes an NPN bipolar transistor 501 having an emitter, a base, and a collector corresponding to the N+ regions 526a-526b, the PW 524, and the NW 523, respectively. Additionally, the FinFET thyristor protection structure 550 includes a PNP bipolar transistor 502 having an emitter, a base, and a collector corresponding to the P+ regions 525a, the NW 523, and the PW 524, respectively. Furthermore, the FinFET thyristor protection structure 550 further include a triggering PNP bipolar transistor 503 having an emitter, a base, and a collector associated with P+ regions 525a, NW 523, and P+ regions 525c.

With continuing reference to FIGS. 15A-15G, the FinFET thyristor protection structure 550 further includes a first stacked p-type FinFET 505a having a body, a source, a gate, and a drain associated with NW 523, P+ regions 525a, gate fin regions 528a, and P+ regions 525b, respectively. Additionally, the FinFET thyristor protection structure 550 further includes a first stacked PNP bipolar transistor 505a having an emitter, a base, and a collector associated with P+ regions 525a, NW 523, and P+ regions 525b, respectively.

Furthermore the FinFET thyristor protection structure 550 further includes a second stacked p-type FinFET 505b having a body, a source, a gate, and a drain associated with NW 523, P+ regions 525b, gate fin regions 528b, and P+ regions 525c, respectively. Additionally, the FinFET thyristor protection structure 550 further includes a second stacked PNP bipolar transistor 505b having an emitter, a base, and a collector associated with P+ regions 525b, NW 523, and P+ regions 525c, respectively. A conductor TC is used to connect the PW 524 to the P+ regions 525b-525c, thereby connecting the base of the NPN bipolar transistor 501 to the drain of the second stacked p-type FinFET 505b, the collector of the second stacked PNP bipolar transistor 504b, and to the collector of the PNP triggering bipolar transistor 503. FIGS. 15F and 15G depict the gate-to-source connections of the stacked p-type FinFETs 505a and 505b, respectively.

Figure 16:
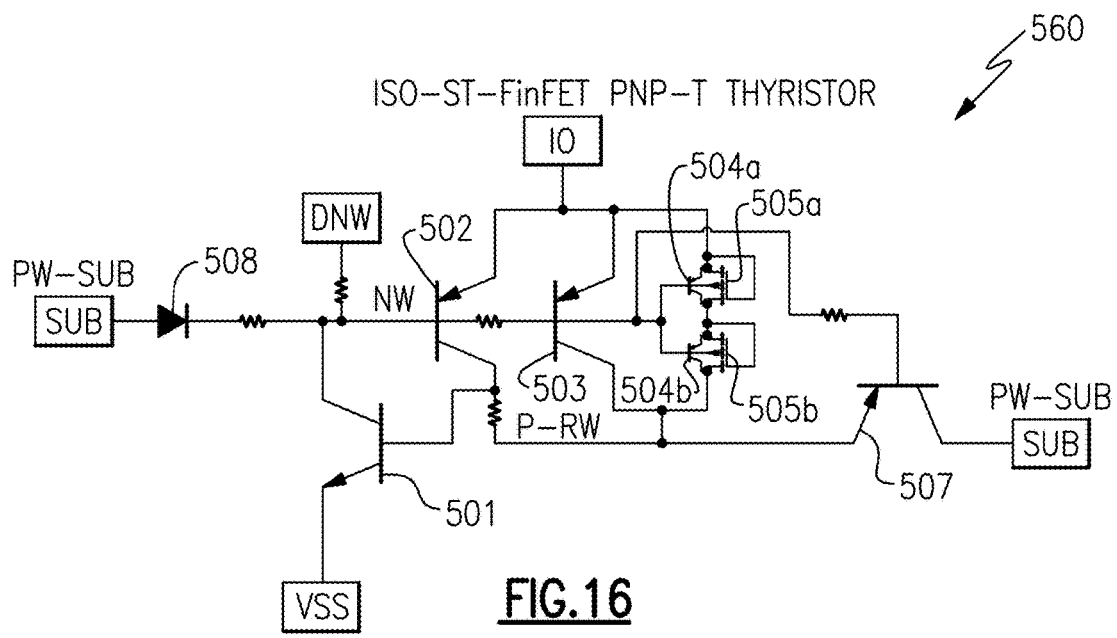
FIG. 16 is a circuit diagram of a FinFET thyristor protection circuit according to another embodiment.

FIG. 16 is a circuit diagram of a FinFET thyristor protection circuit 560 according to another embodiment. The FinFET thyristor protection circuit 560 includes an NPN bipolar transistor 501, a PNP bipolar transistor 502, a triggering PNP transistor 503, a first stacked PNP bipolar transistor 504a, a second stacked PNP bipolar transistor 504b, a first stacked p-type FinFET 505a, a second stacked p-type FinFET 505b, a substrate PNP bipolar transistor 507, and a substrate diode 508. One example connectivity of the FinFET thyristor protection circuit 560 to an IO terminal, a SUB terminal, and a VSS terminal is depicted. However, the FinFET thyristor circuit 560 can be connected to other terminals.

The FinFET thyristor protection circuit 560 of FIG. 16 is similar to the FinFET thyristor protection circuit 520 of FIG. 14, except that the FinFET thyristor protection circuit 560 further includes the substrate PNP bipolar transistor 507 and the substrate diode 508, which are associated with isolating the FinFET thyristor protection circuit 520 of FIG. 14 from a PSUB using a DNW isolation tub.

Figure 17:
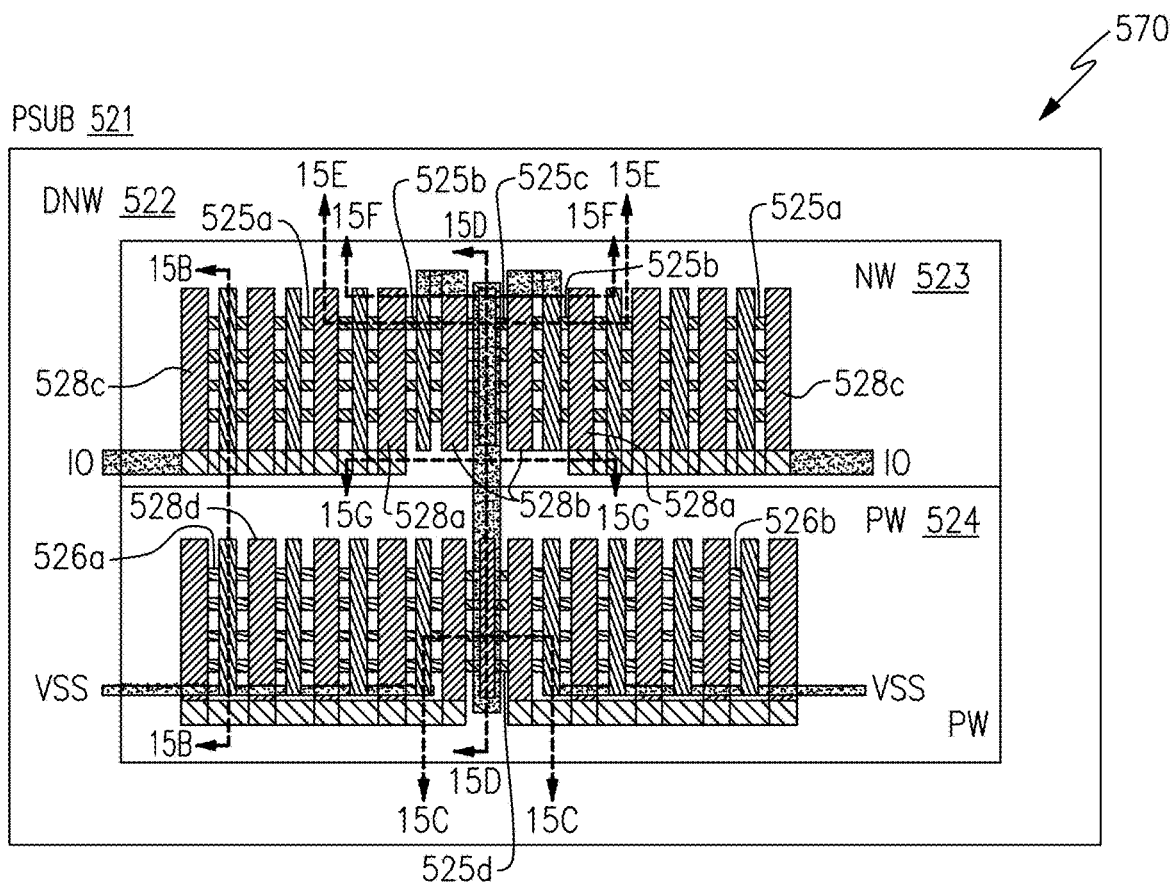
FIG. 17 is a plan view of a FinFET thyristor protection structure according to another embodiment.
Figure 18A:
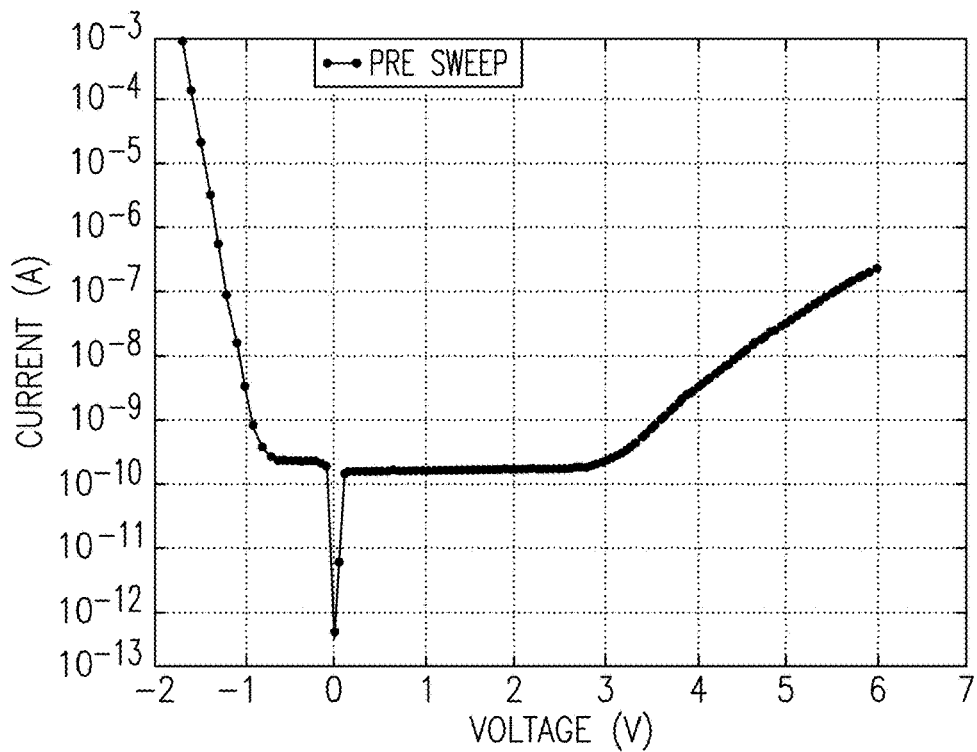
FIG. 18A is a graph of one example of pre-sweep current versus voltage characteristics for one implementation of the FinFET thyristor protection structure of FIG. 4A.
Figure 18B:
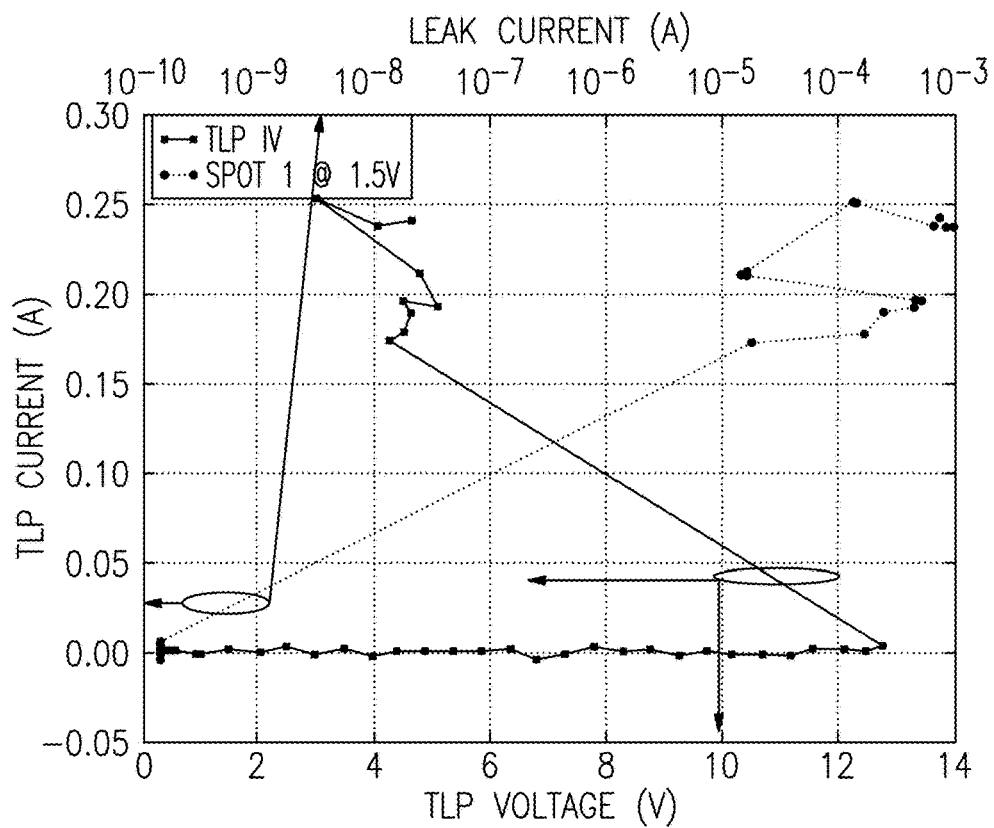
FIG. 18B is a graph of one example of positive transmission line pulsing (TLP) measurements for one implementation of the FinFET thyristor protection structure of FIG. 4A.
Figure 18C:
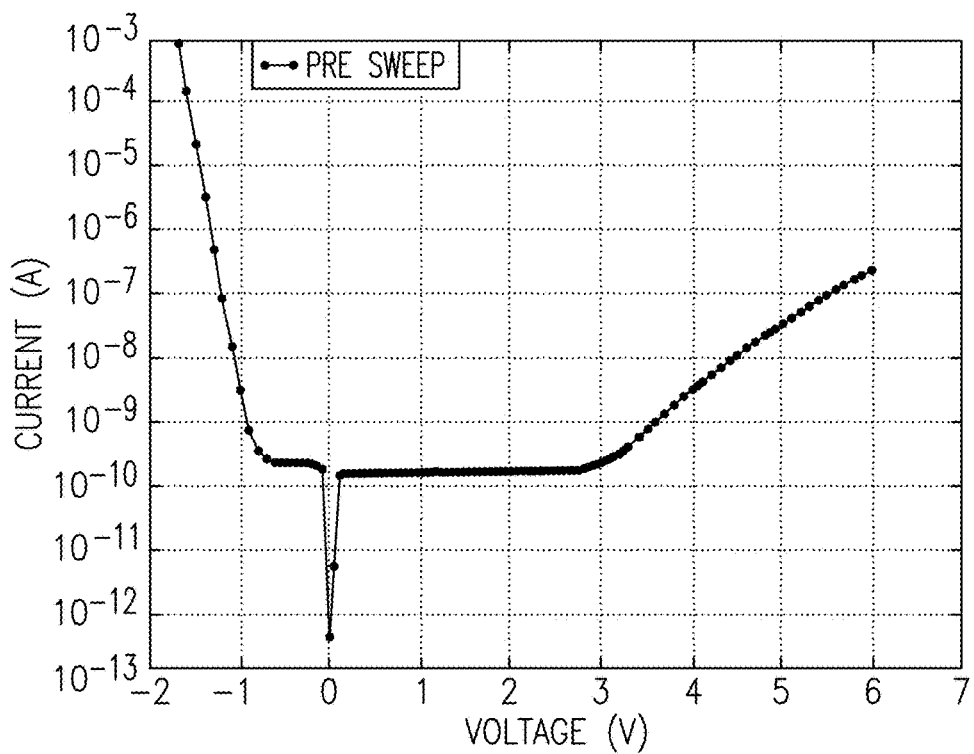
FIG. 18C is a graph of another example of pre-sweep current versus voltage characteristics for one implementation of the FinFET thyristor protection structure of FIG. 4A.
Figure 18D:
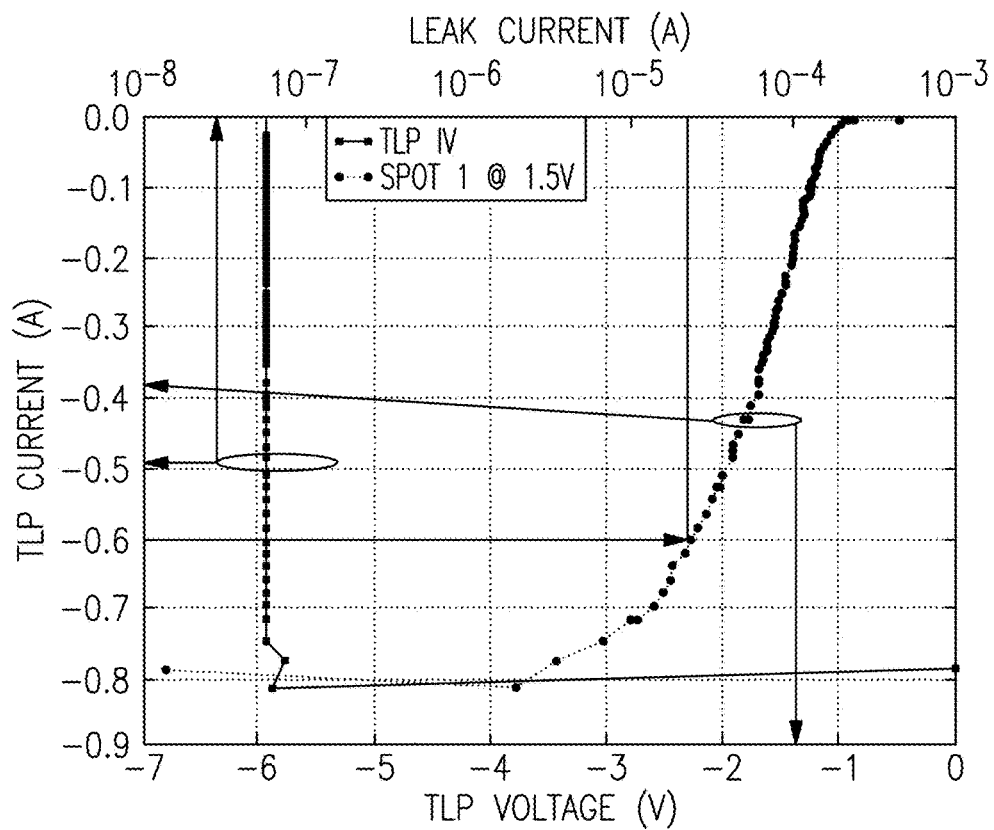
FIG. 18D is a graph of one example of negative TLP measurements for one implementation of the FinFET thyristor protection structure of FIG. 4A.
Figure 19A:
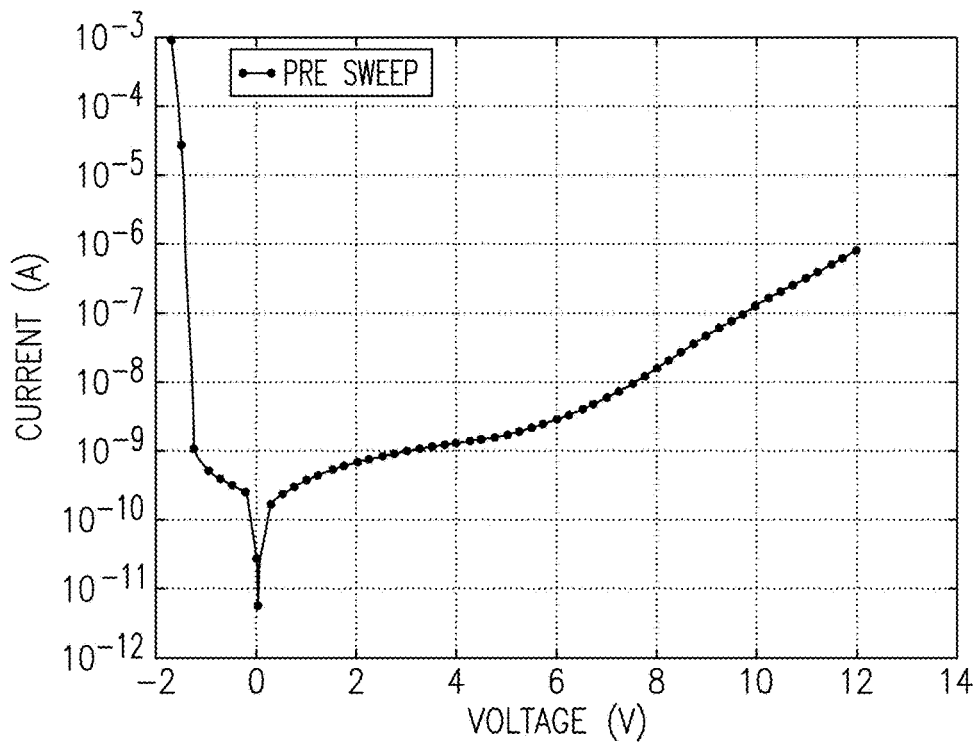
FIG. 19A is a graph of one example of pre-sweep current versus voltage characteristics for one implementation of the FinFET thyristor protection structure of FIG. 9A.
Figure 19B:
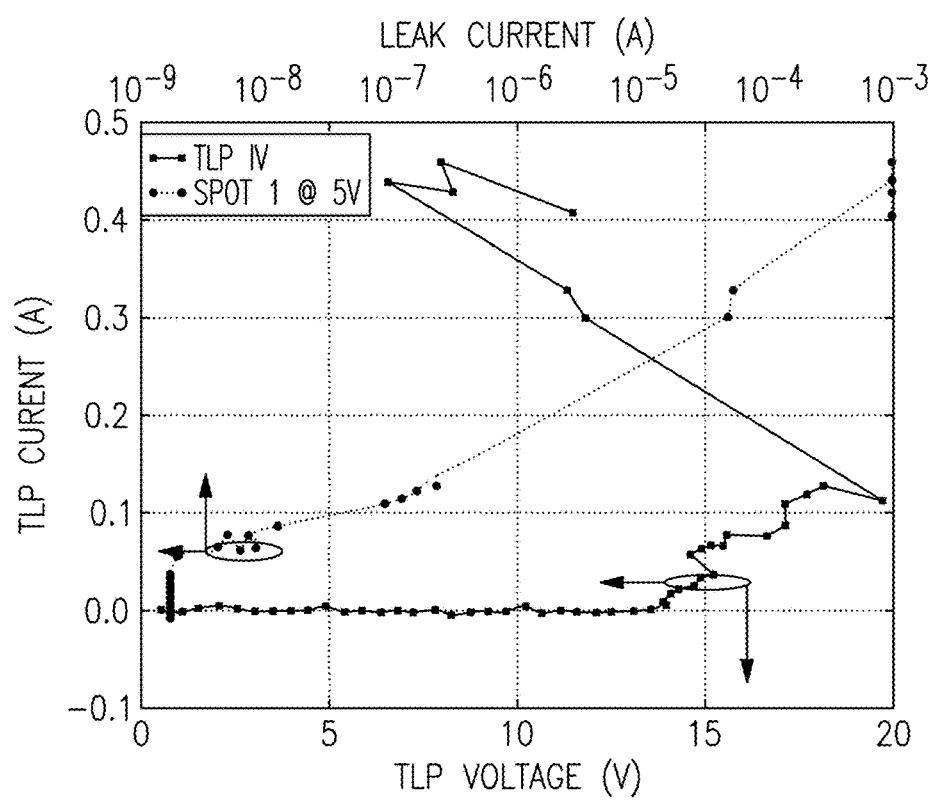
FIG. 19B is a graph of one example of positive TLP measurements for one implementation of the FinFET thyristor protection structure of FIG. 9A.
Figure 19C:
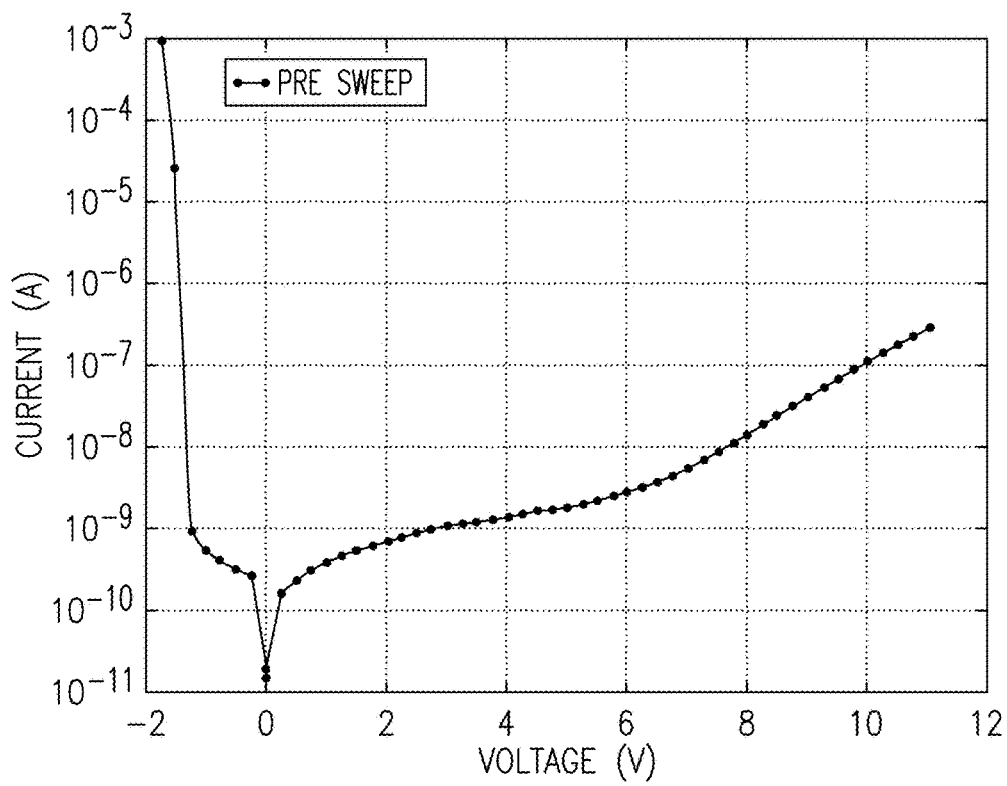
FIG. 19C is a graph of another example of pre-sweep current versus voltage characteristics for one implementation of the FinFET thyristor protection structure of FIG. 9A.
Figure 19D:
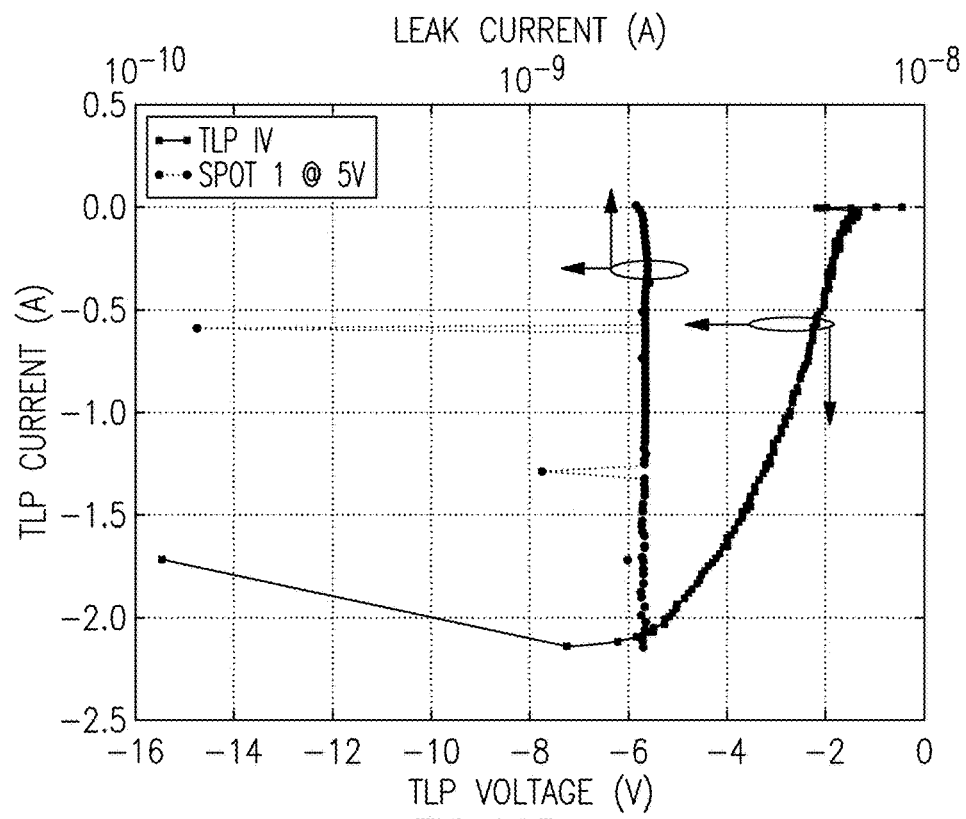
FIG. 19D is a graph of one example of negative TLP measurements for one implementation of the FinFET thyristor protection structure of FIG. 11A.
Figure 20A:
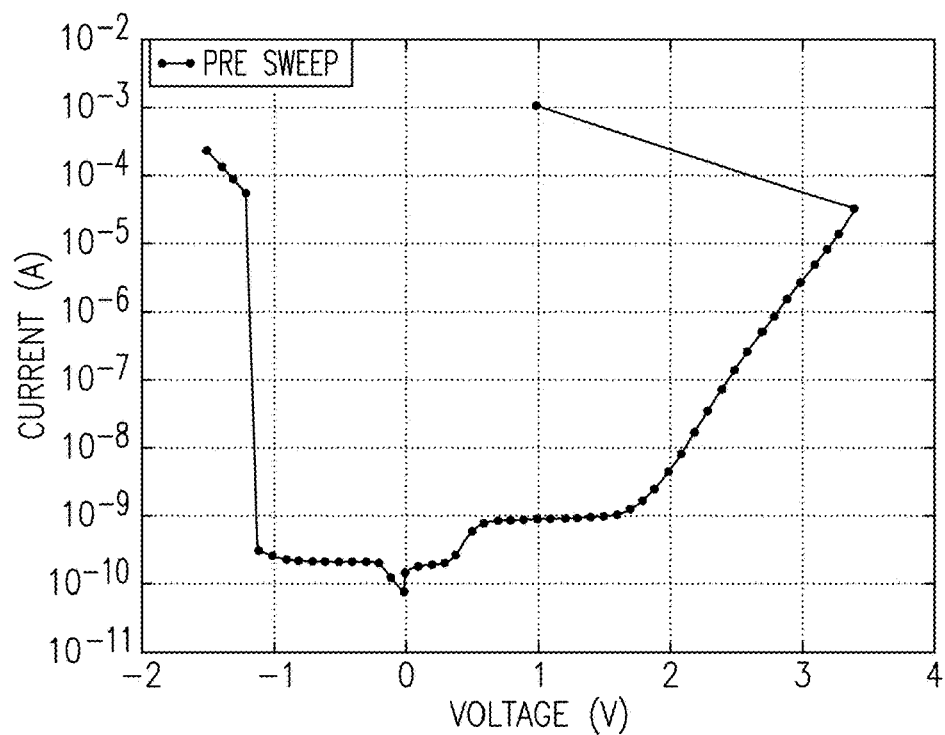
FIG. 20A is a graph of one example of pre-sweep current versus voltage characteristics for one implementation of the FinFET thyristor protection structure of FIG. 11A.
Figure 20B:
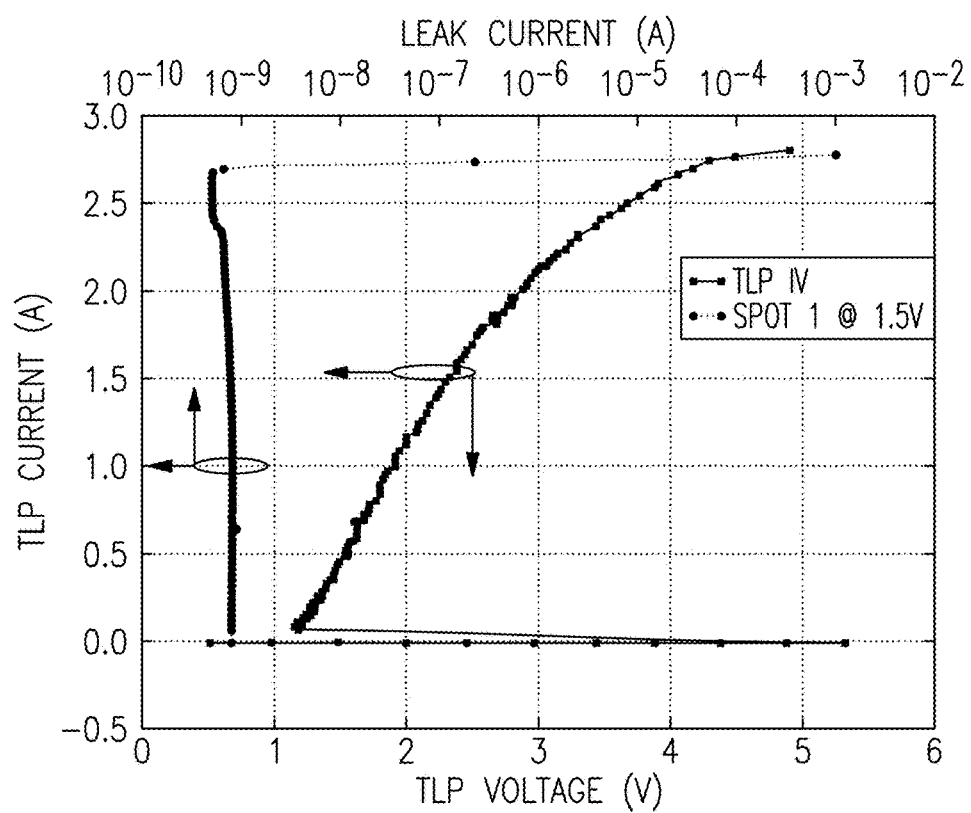
FIG. 20B is a graph of one example of positive TLP measurements for one implementation of the FinFET thyristor protection structure of FIG. 11A.
Figure 20C:
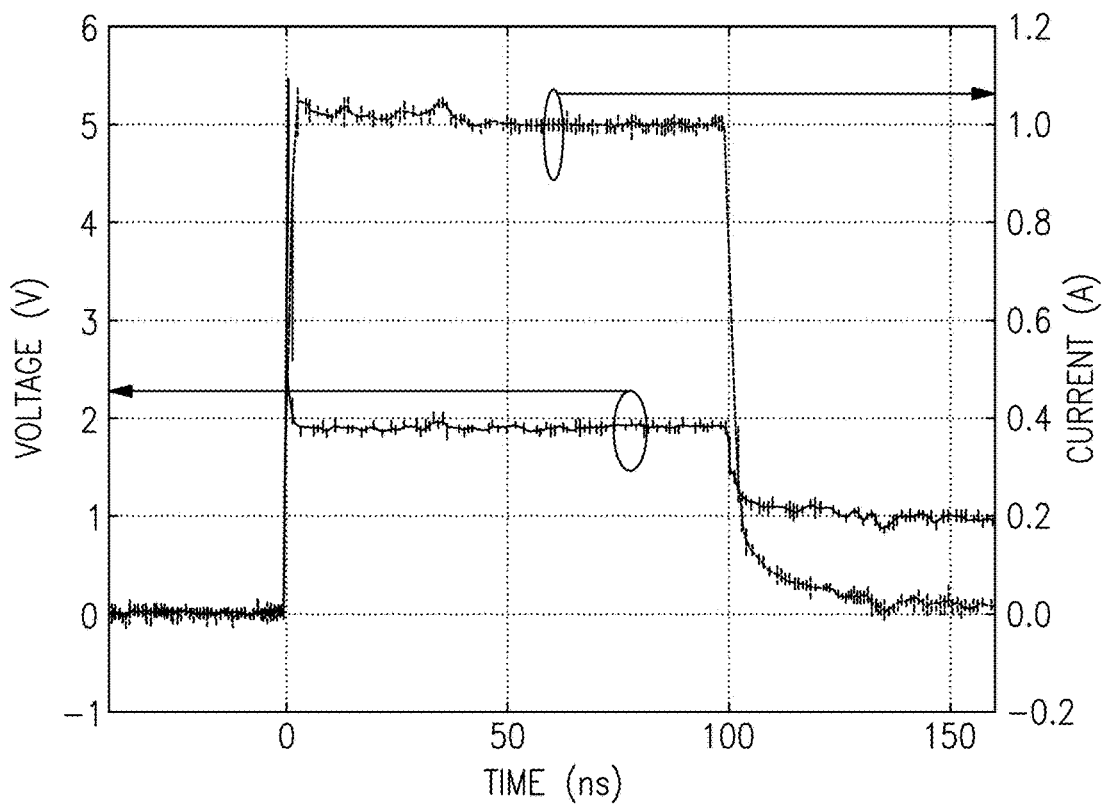
FIG. 20C is a graph of one example of voltage versus time characteristics for one implementation of the FinFET thyristor protection structure of FIG. 11A.
Figure 20D:
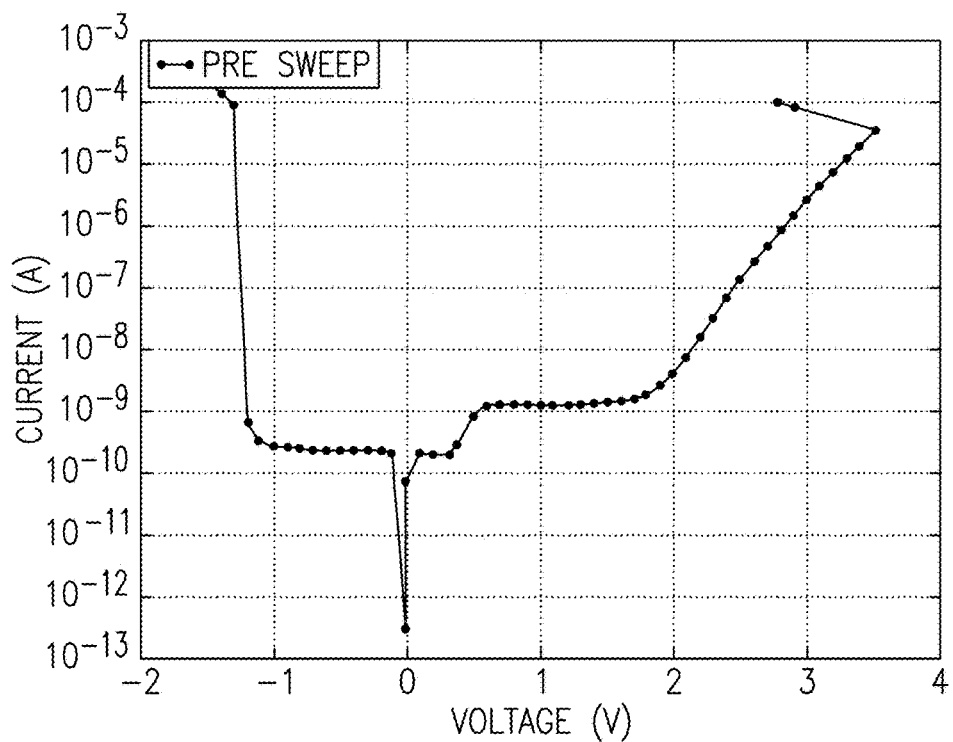
FIG. 20D is a graph of another example of pre-sweep current versus voltage characteristics for one implementation of the FinFET thyristor protection structure of FIG. 11A.
Figure 20E:
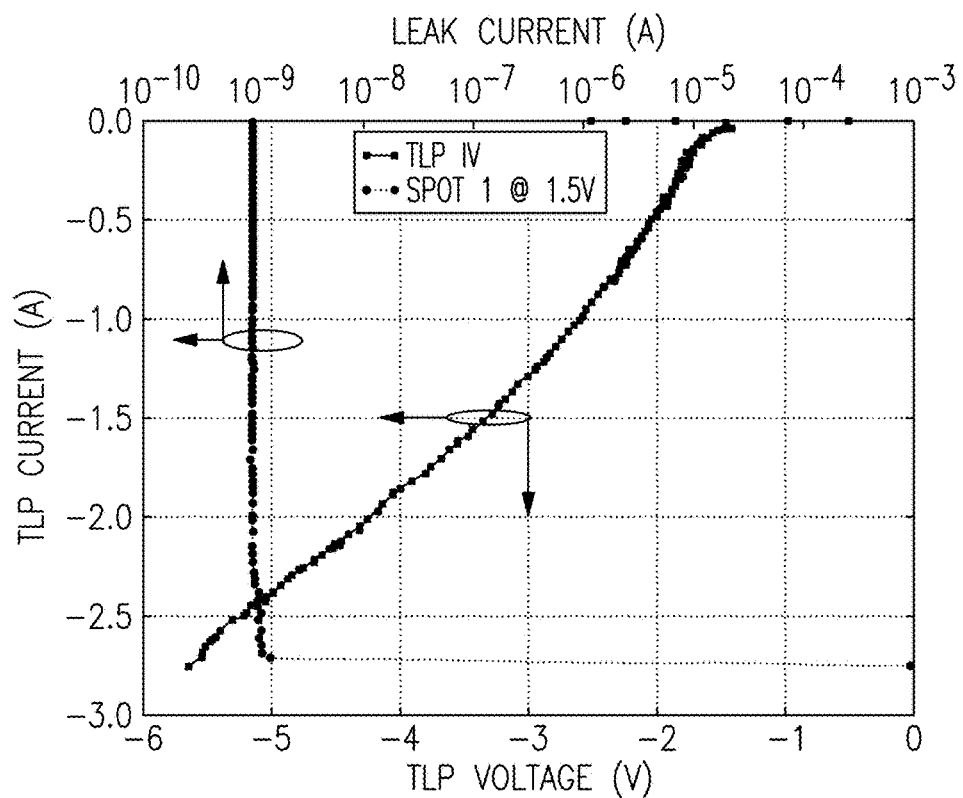
FIG. 20E is a graph of one example of negative TLP measurements for one implementation of the FinFET thyristor protection structure of FIG. 11A.
Figure 20F:
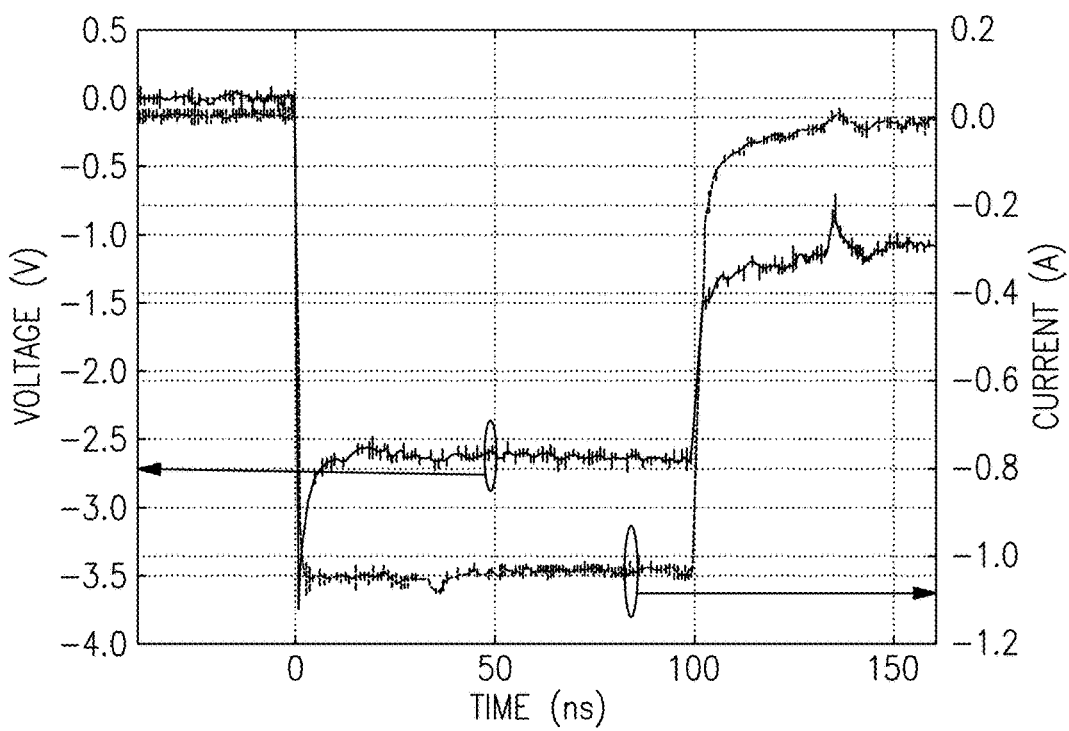
FIG. 20F is a graph of another example of voltage versus time characteristics for one implementation of the FinFET thyristor protection structure of FIG. 11A.
Figure 21A:
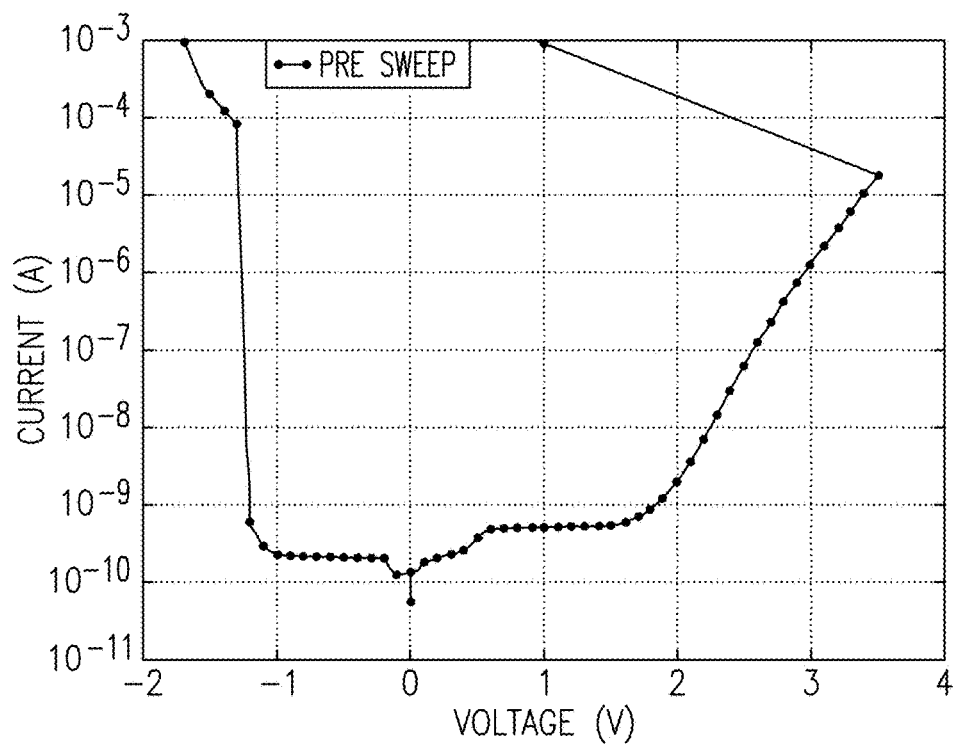
FIG. 21A is a graph of one example of pre-sweep current versus voltage characteristics for one implementation of the FinFET thyristor protection structure of FIG. 15A.
Figure 21B:
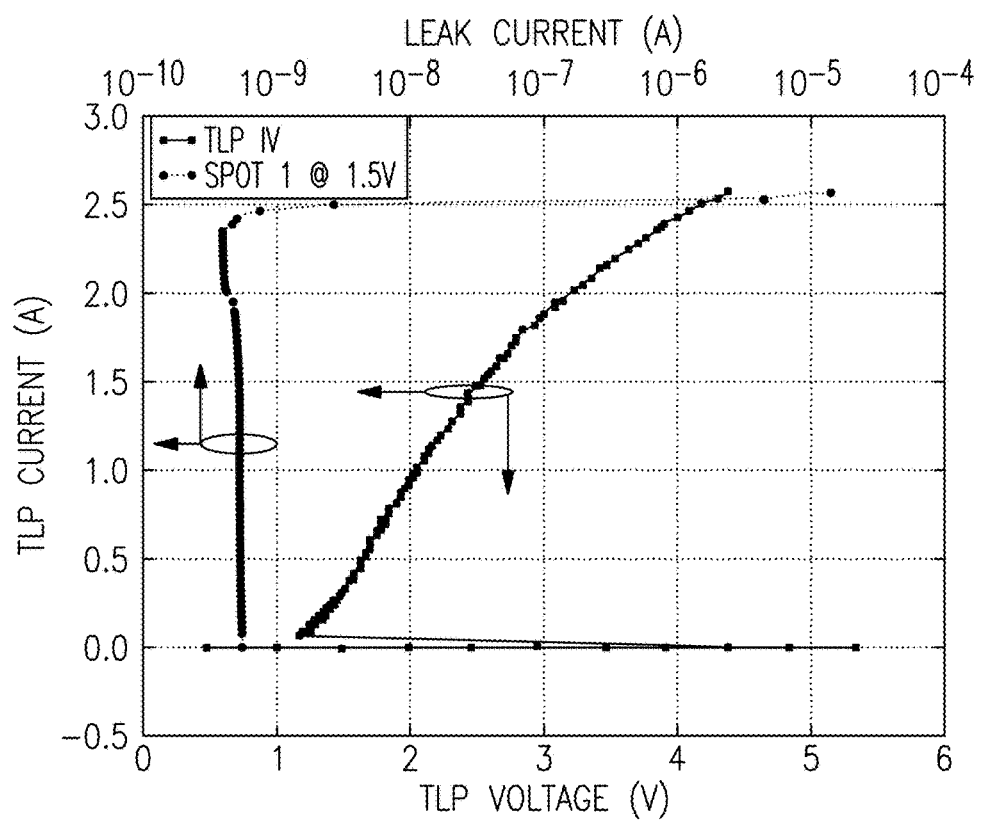
FIG. 21B is a graph of one example of positive TLP measurements for one implementation of the FinFET thyristor protection structure of FIG. 15A.
Figure 21C:
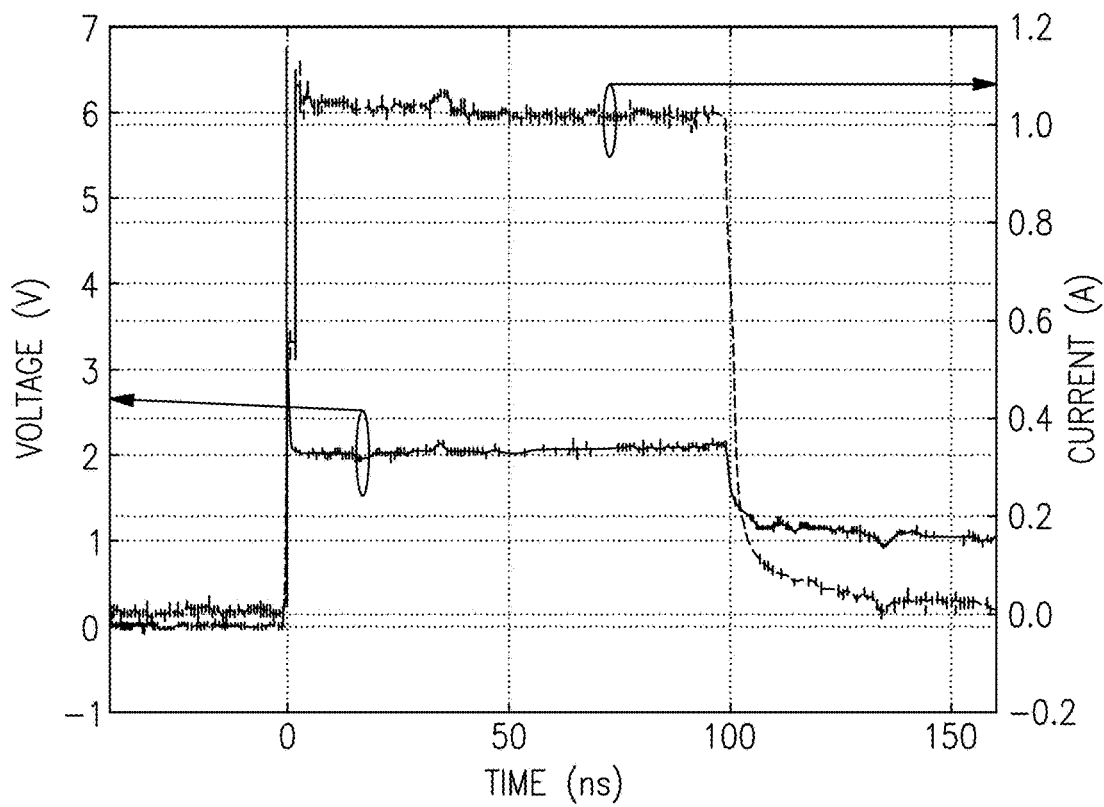
FIG. 21C is a graph of one example of voltage versus time characteristics for one implementation of the FinFET thyristor protection structure of FIG. 15A.
Figure 21D:
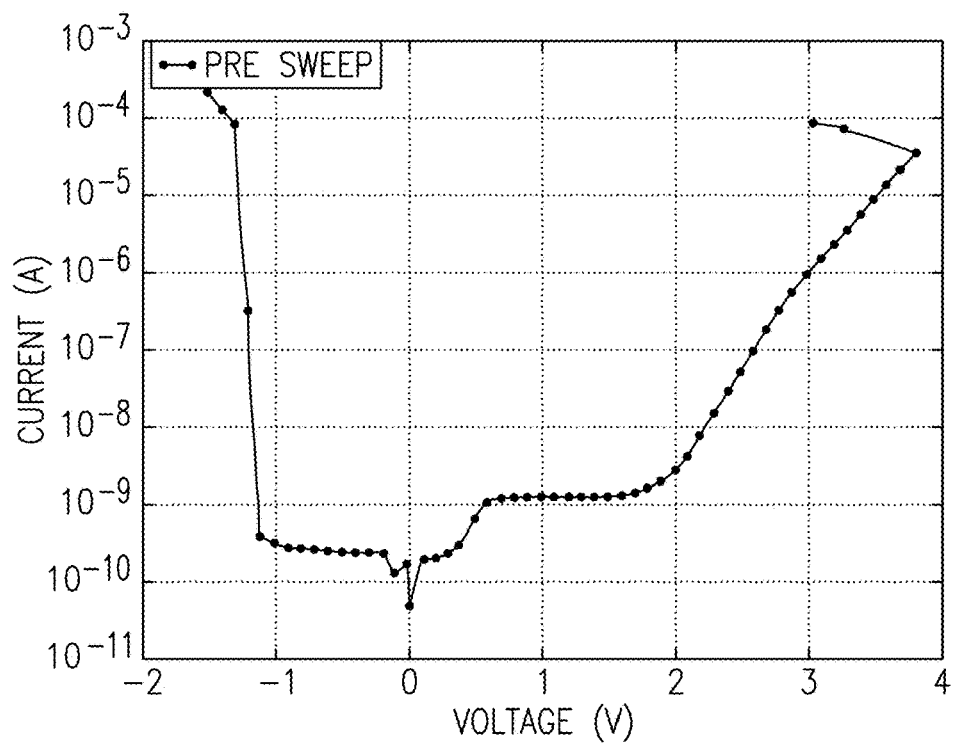
FIG. 21D is a graph of another example of pre-sweep current versus voltage characteristics for one implementation of the FinFET thyristor protection structure of FIG. 15A.
Figure 21E:
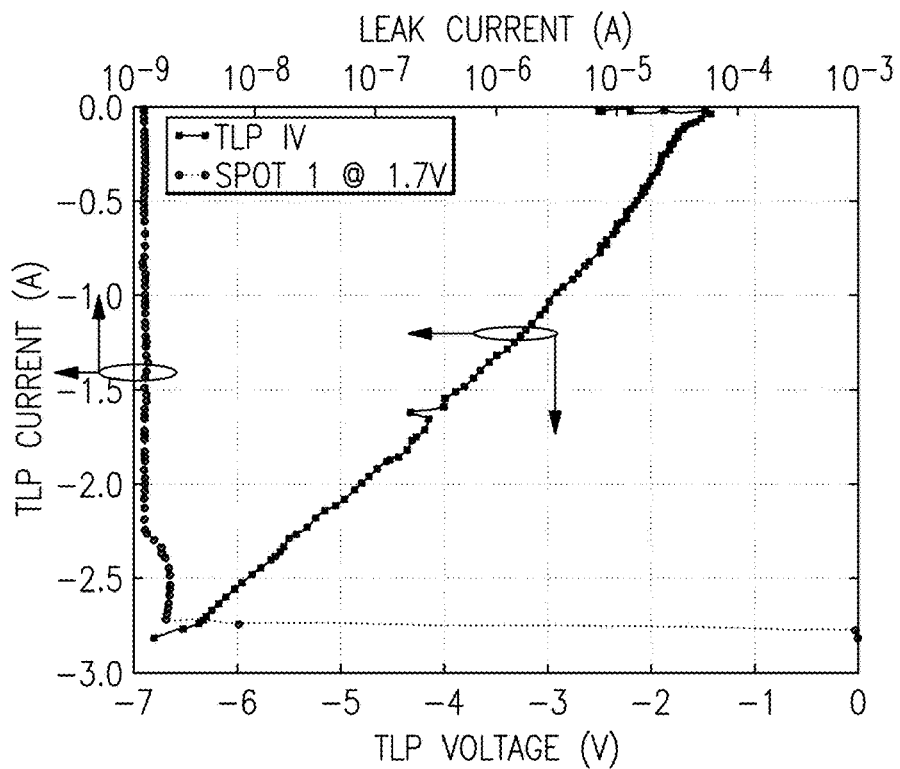
FIG. 21E is a graph of one example of negative TLP measurements for one implementation of the FinFET thyristor protection structure of FIG. 15A.

FIG. 17 is a plan view of a FinFET thyristor protection structure 570 according to another embodiment. The FinFET thyristor protection structure 570 of FIG. 17 illustrates one embodiment of a chip layout used to implement the FinFET thyristor protection circuit 560 of FIG. 16. However, the FinFET thyristor protection circuit 560 of FIG. 16 can be implemented in other ways.

The FinFET thyristor protection structure 570 of FIG. 17 is similar to the FinFET thyristor protection structure 550 of FIGS. 15A-15G, except that the FinFET thyristor protection structure 570 further includes a DNW 522.

FIGS. 18A-18D are graphs of example measurement results for one implementation of the FinFET thyristor protection structure 150 of FIG. 4A. The graphs includes positive transmission line pulsing (TLP) measurements and negative TLP measurements for TLP testing with a 100 ns pulse width and a 600 ps rise time. Pre-sweep current versus voltage graphs are also included.

In the example shown in FIGS. 18A-18D, the FinFET thyristor protection structure 150 exhibits high reverse breakdown for IO to VSS conduction polarity as well as dual-diode thyristor activation at about 1.2 V for VSS to IO conduction polarity.

FIGS. 19A-19D are graphs of example measurement results for one implementation of the FinFET thyristor protection structure 350 of FIG. 9A. The graphs includes positive TLP measurements and negative TLP measurements for TLP testing with a 100 ns pulse width and a 600 ps rise time. Pre-sweep current versus voltage graphs are also included.

In the example shown in FIGS. 19A-19D, the FinFET thyristor protection structure 350 exhibits high blocking voltage for IO to VSS conduction polarity as well as high current conduction for VSS to IO conduction polarity.

FIGS. 20A-20F are graphs of example measurement results for one implementation of the FinFET thyristor protection structure 450 of FIG. 11A. The graphs includes positive TLP measurements and negative TLP measurements for TLP testing with a 100 ns pulse width and a 600 ps rise time. Pre-sweep current versus voltage graphs are also included. The graphs also include transient current versus voltage waveforms for both positive and negative overstress conditions.

FIGS. 21A-21E are graphs of example measurement results for one implementation of the FinFET thyristor protection structure 550 of FIG. 15A. The graphs includes positive TLP measurements and negative TLP measurements for TLP testing with a 100 ns pulse width and a 600 ps rise time. Pre-sweep current versus voltage graphs are also included. The graphs also include transient current versus voltage waveforms for a positive overstress condition.

Figure 22:
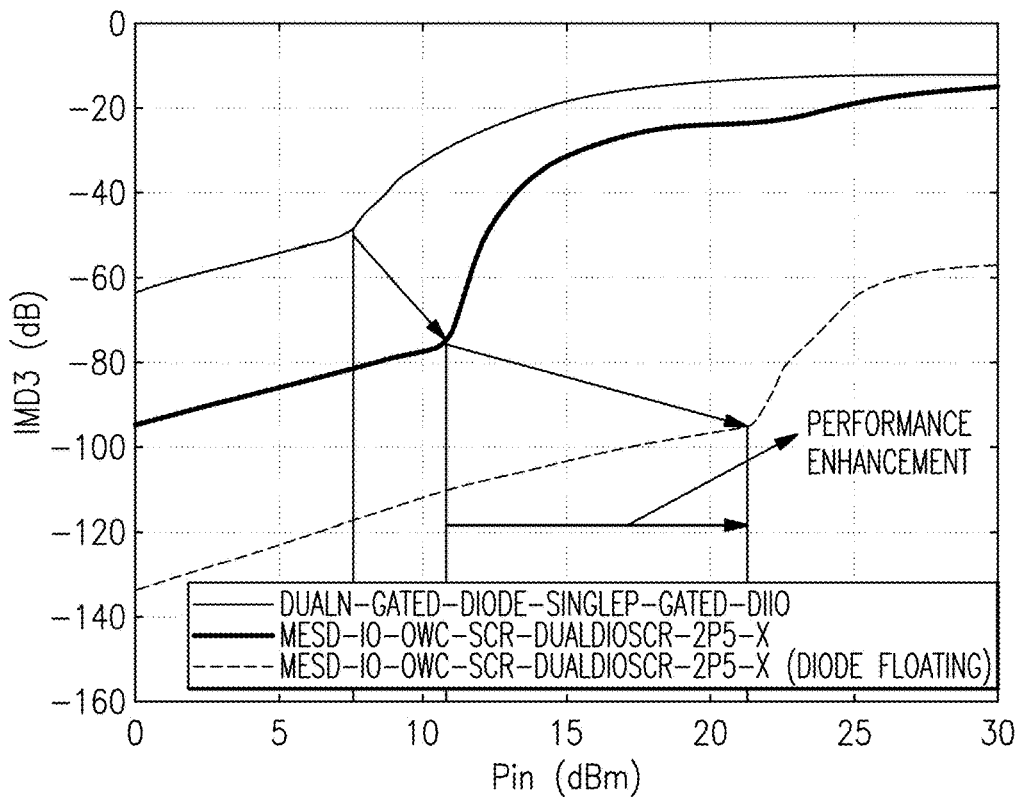
FIG. 22 is a graph of one example of third-order intermodulation (IMD3) versus input power for a high-speed interface protected by various implementations of protection devices.

FIG. 22 is a graph of one example of third-order intermodulation (IMD3) versus input power for a high-speed interface protected by various implementations of protection devices. The graph includes IMD3 performance for one implementation of the FinFET thyristor protection structure 150 of FIG. 4A versus two other designs. As shown in FIG. 22, a maximum input power increase of over 10 dBm is achieved while still maintaining IMD3 specifications.

Figure 23A:
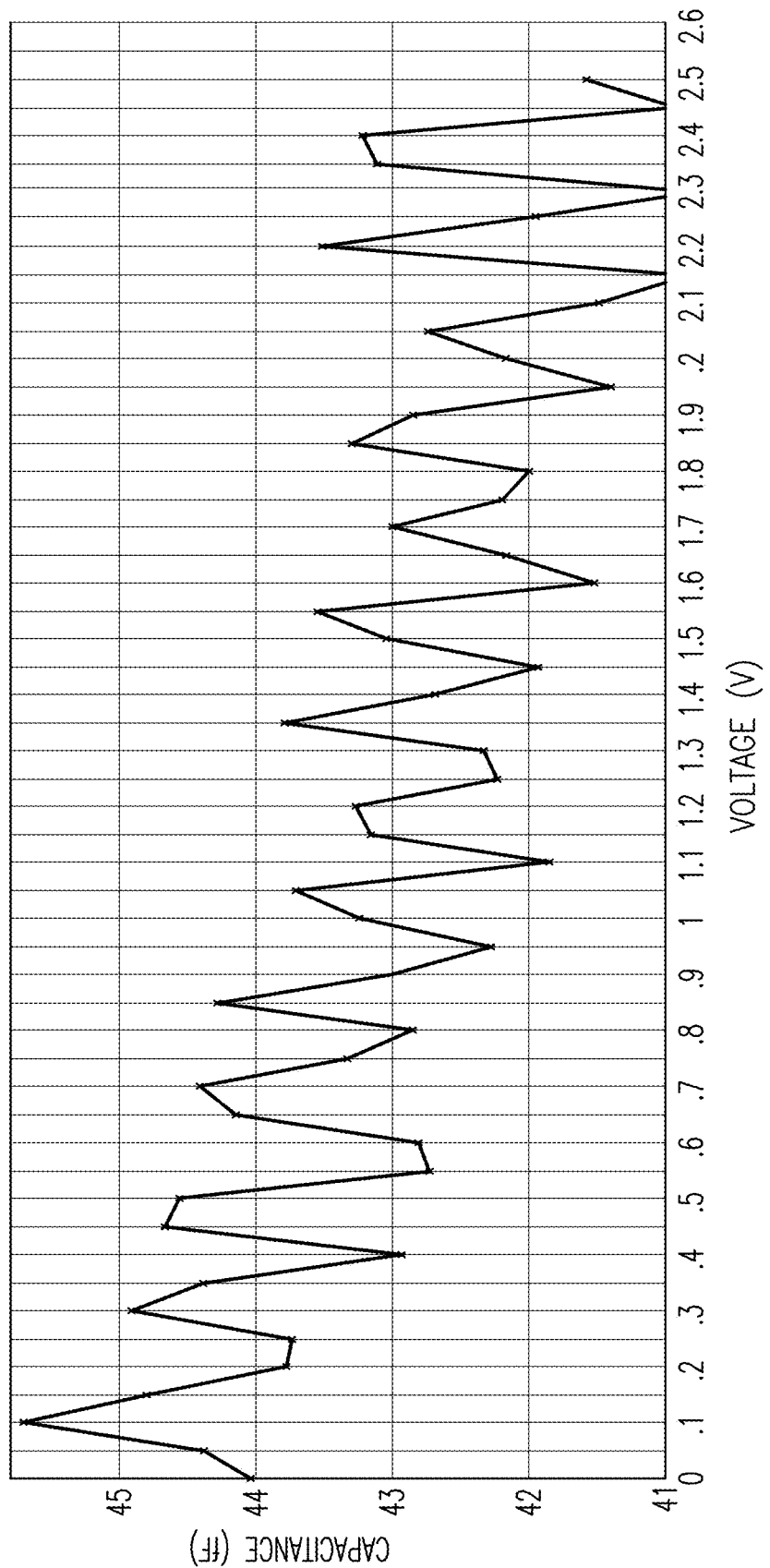
FIG. 23A is a graph of capacitance versus voltage for one implementation of a FinFET thyristor protection structure.

FIG. 23A is a graph of capacitance versus voltage for one implementation of a FinFET thyristor protection structure implemented to provide a current handling capability of greater than 600 mA TLP for greater than 2.5 A very fast TLP (VFTLP). As shown in FIG. 23A, less than 50 fF in capacitance is achieved for this current handling capability.

Figure 23B:
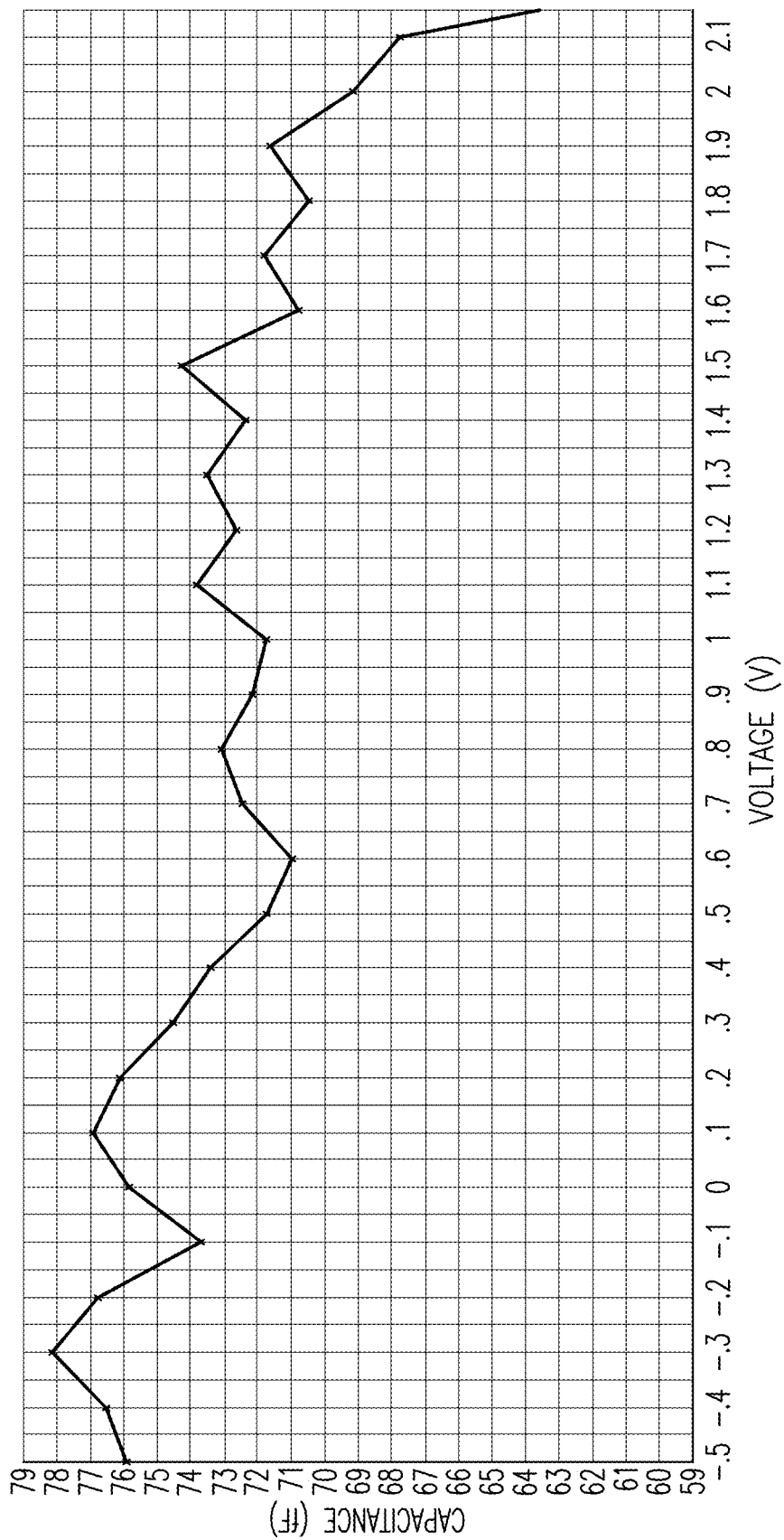
FIG. 23B is a graph of capacitance versus voltage for another implementation of a FinFET thyristor protection structure.

FIG. 23B is a graph of capacitance versus voltage for another implementation of a FinFET thyristor protection structure implemented to provide operation up to 2V and a current handling capability of greater than 2.5 A TLP for greater than 5.5 A TLP.

Figure 23C:
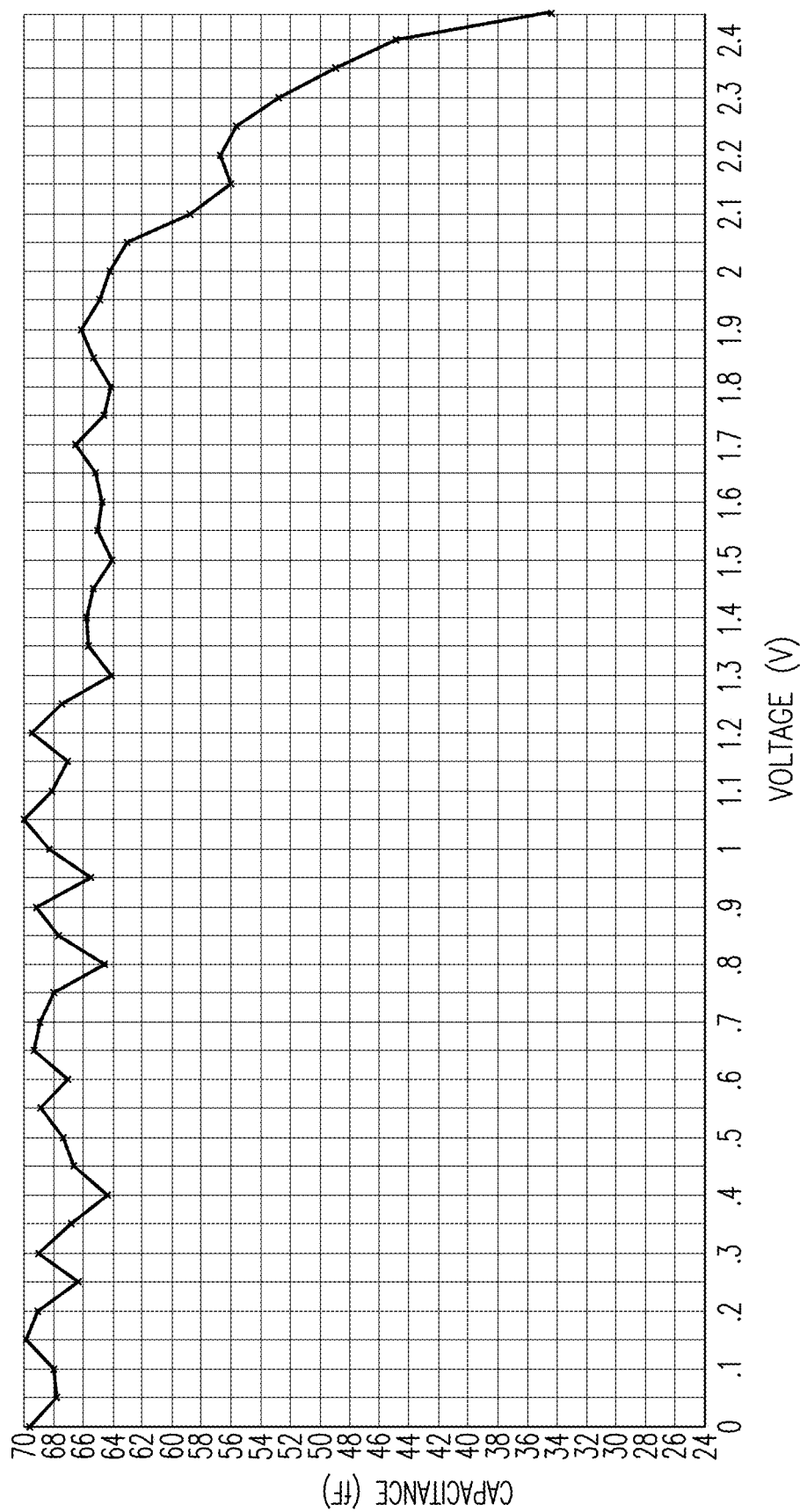
FIG. 23C is a graph of capacitance versus voltage for another implementation of a FinFET thyristor protection structure.

FIG. 23C is a graph of capacitance versus voltage for another implementation of a FinFET thyristor protection structure implemented to provide operation up to 2.5V and a current handling capability of greater than 2.5 A TLP for greater than 5.5 A TLP.

Figure 24:
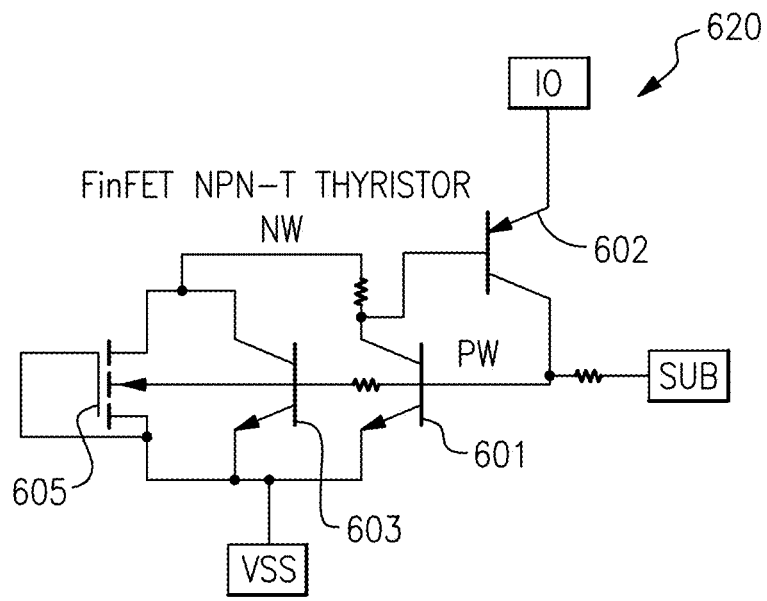
FIG. 24 is a circuit diagram of a FinFET thyristor protection circuit according to another embodiment.

FIG. 24 is a circuit diagram of a FinFET thyristor protection circuit 620 according to another embodiment. The FinFET thyristor protection circuit 620 includes an NPN bipolar transistor 601, a PNP bipolar transistor 602, a triggering NPN transistor 603, and a triggering n-type FinFET 605. One example connectivity of the FinFET thyristor protection circuit 620 to an IO terminal, a SUB terminal, and a VSS terminal is depicted. However, the FinFET thyristor protection circuit 620 can be connected between other terminals.

The FinFET thyristor protection circuit 620 of FIG. 24 is similar the FinFET thyristor protection circuit 420 of FIG. 10, except that the FinFET thyristor protection circuit 620 illustrates an n-type implementation of the FinFET triggering circuitry rather than a p-type implementation. In particular, the FinFET thyristor protection circuit 620 includes the triggering NPN transistor 603 and the triggering n-type FinFET 605 shown in FIG. 24, rather than the triggering PNP transistor 403 and the triggering p-type FinFET 405 shown in FIG. 10. The FinFET thyristor protection circuit 620 of FIG. 24 is also referred to herein as an FinFET NPN-T thyristor.

Figure 25:
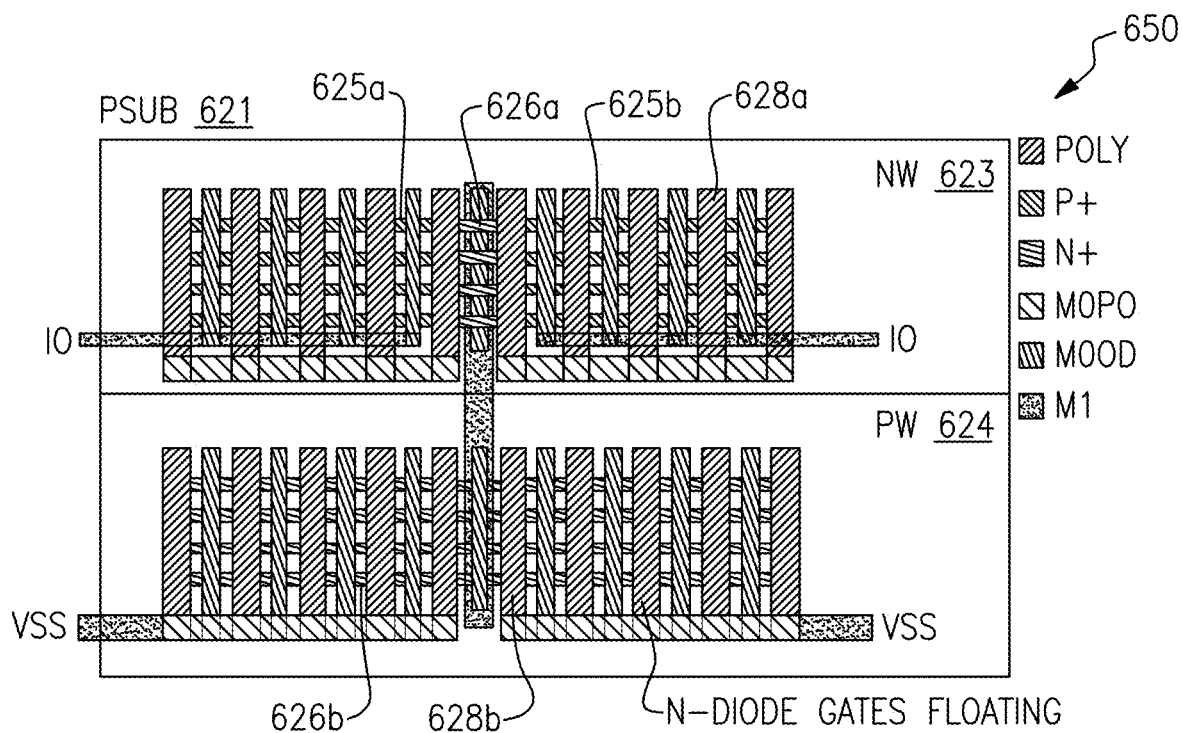
FIG. 25 is a plan view of a FinFET thyristor protection structure according to another embodiment.

FIG. 25 is a plan view of a FinFET thyristor protection structure 650 according to another embodiment.

The FinFET thyristor protection structure 650 of FIG. 25 illustrates one embodiment of a chip layout used to implement the FinFET thyristor protection circuit 620 of FIG. 24. However, the FinFET thyristor protection circuit 620 of FIG. 24 can be implemented in other ways.

With reference to FIG. 25, the FinFET thyristor protection structure 650 is fabricated in a PSUB 621, and includes an NW 623 and a PW 624 formed adjacent to one another in the PSUB 621. Additionally, a first group of P+ regions 625a, a second group of P+ regions 625b, and a first group of N+ regions 626a are formed in the NW 623, with the first group of N+ regions 626a positioned between the first group of P+ regions 625a and the second group of P+ regions 625b. Additionally, a second group of N+ regions 626b are formed in the PW 624. Additionally, a first group of gate fin regions 628a is formed over the NW 623 and a second group of gate fin regions 628b is formed over the PW 624. Various metallization including metal zero routes (M0PO and M0OD), metal one routes (M1), and vias and contacts are depicted.

Figure 26:
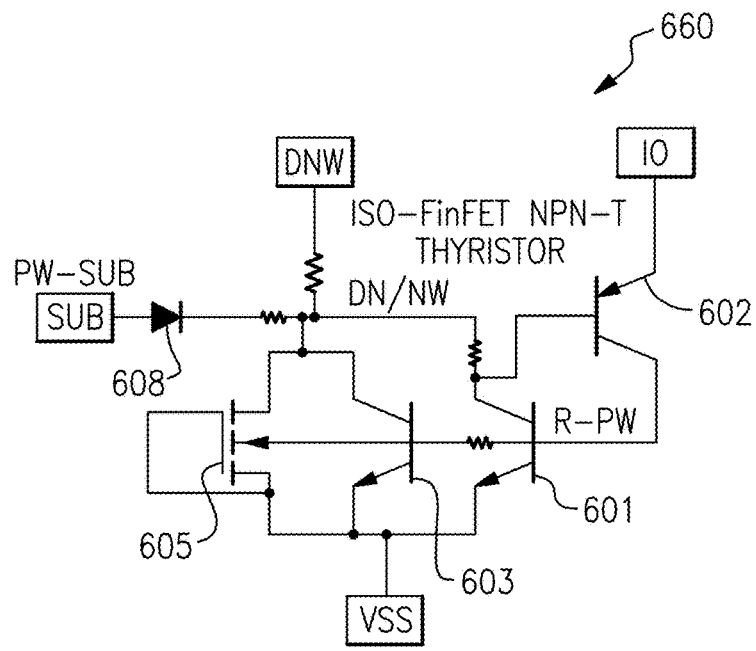
FIG. 26 is a circuit diagram of a FinFET thyristor protection circuit according to another embodiment.

FIG. 26 is a circuit diagram of a FinFET thyristor protection circuit 660 according to another embodiment. The FinFET thyristor protection circuit 660 includes an NPN bipolar transistor 601, a PNP bipolar transistor 602, a triggering NPN transistor 603, a triggering n-type FinFET 605, and a substrate diode 608. One example connectivity of the FinFET thyristor protection circuit 660 to an IO terminal, a SUB terminal, and a VSS terminal is depicted. However, the FinFET thyristor circuit 660 can be connected to other terminals.

The FinFET thyristor protection circuit 660 of FIG. 26 is similar to the FinFET thyristor protection circuit 620 of FIG. 24, except that the FinFET thyristor protection circuit 660 further includes the substrate diode 608, which is associated with isolating the FinFET thyristor protection circuit 620 of FIG. 24 from a PSUB using a DNW isolation tub. The FinFET thyristor protection circuit 660 of FIG. 26 is also referred to herein as an ISO FinFET NPN-T thyristor.

Figure 27:
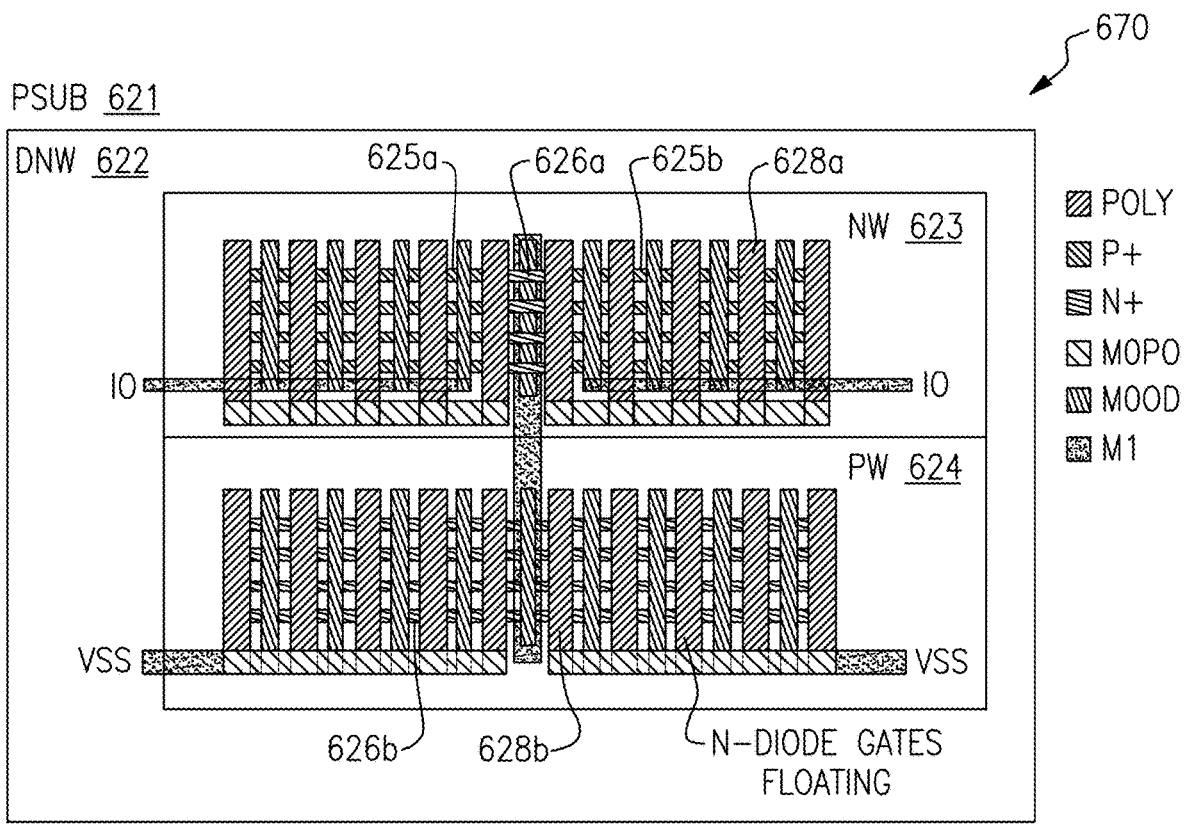
FIG. 27 is a plan view of a FinFET thyristor protection structure according to another embodiment.

FIG. 27 is a plan view of a FinFET thyristor protection structure 670 according to another embodiment. The FinFET thyristor protection structure 670 of FIG. 27 illustrates one embodiment of a chip layout used to implement the FinFET thyristor protection circuit 660 of FIG. 26. However, the FinFET thyristor protection circuit 660 of FIG. 26 can be implemented in other ways.

The FinFET thyristor protection structure 670 of FIG. 27 is similar to the FinFET thyristor protection structure 650 of FIG. 25, except that the FinFET thyristor protection structure 670 further includes a DNW 622.

Figure 28:
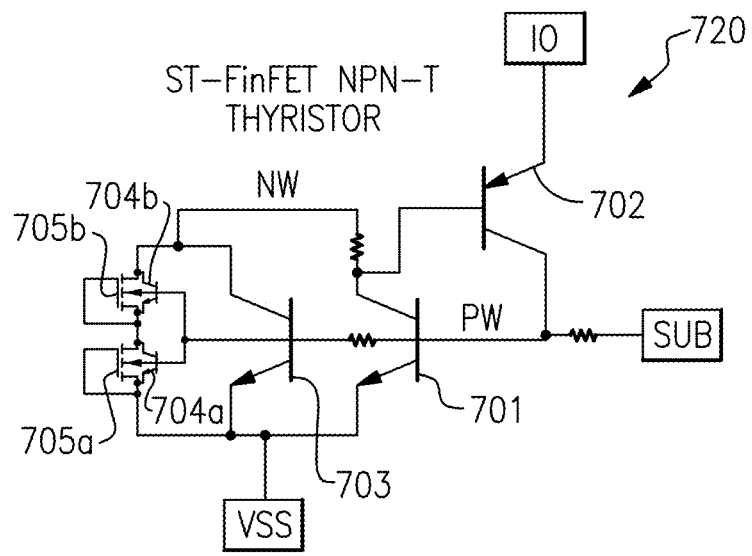
FIG. 28 is a circuit diagram of a FinFET thyristor protection circuit according to another embodiment.

FIG. 28 is a circuit diagram of a FinFET thyristor protection circuit 720 according to another embodiment. The FinFET thyristor protection circuit 720 includes an NPN bipolar transistor 701, a PNP bipolar transistor 702, a triggering NPN transistor 703, a first stacked NPN transistor 704a, a second stacked NPN transistor 704b, a first stacked n-type FinFET 705a, and a second stacked n-type FinFET 705b. One example connectivity of the FinFET thyristor protection circuit 720 to an IO terminal, a SUB terminal, and a VSS terminal is depicted. However, the FinFET thyristor circuit 720 can be connected to other terminals.

The FinFET thyristor protection circuit 720 of FIG. 28 is similar the FinFET thyristor protection circuit 520 of FIG. 14, except that the FinFET thyristor protection circuit 720 illustrates an n-type implementation of the FinFET triggering circuitry rather than a p-type implementation. In particular, the FinFET thyristor protection circuit 720 includes the triggering NPN transistor 703, the first stacked NPN transistor 704a, the second stacked NPN transistor 704b, the first stacked n-type FinFET 705a, and the second stacked n-type FinFET 705b shown in FIG. 28, rather than the triggering PNP transistor 503, the first stacked PNP transistor 504a, the second stacked PNP transistor 504b, the first stacked p-type FinFET 505a, and the second stacked p-type FinFET 505b shown in FIG. 14. The FinFET thyristor protection circuit 720 of FIG. 28 is also referred to herein as an ST FinFET NPN-T thyristor.

Figure 29:
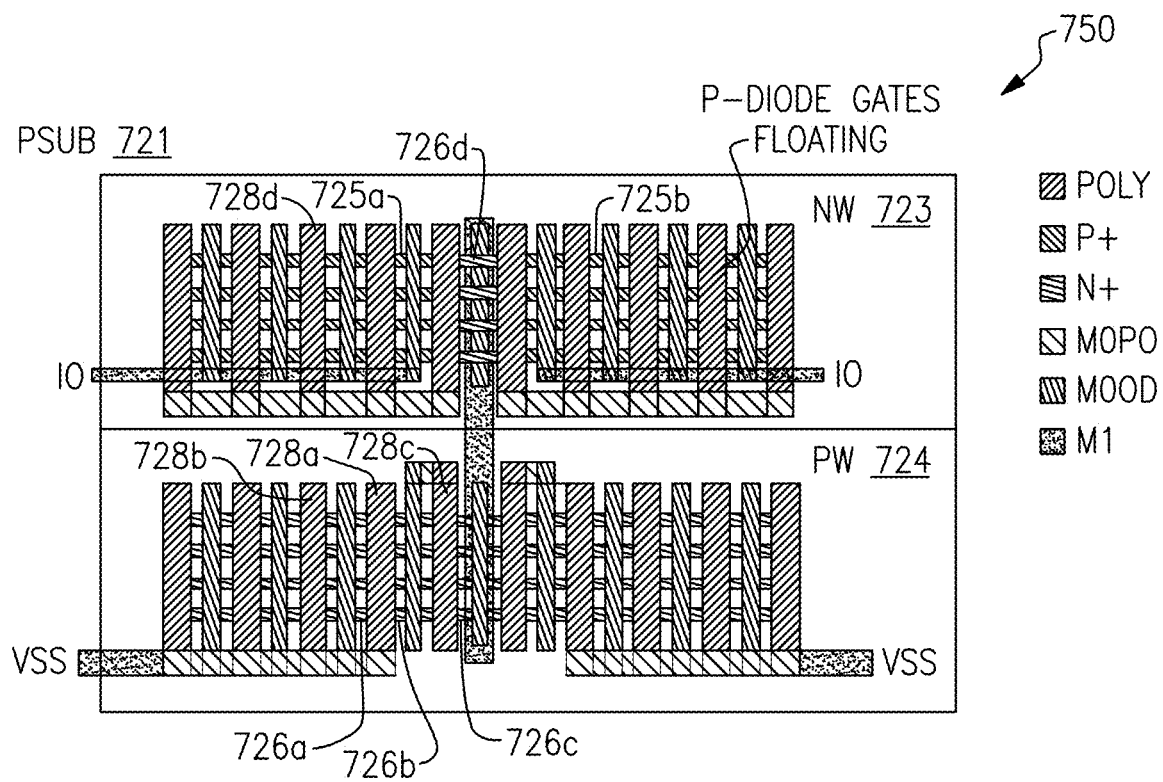
FIG. 29 is a plan view of a FinFET thyristor protection structure according to another embodiment.

FIG. 29 is a plan view of a FinFET thyristor protection structure 750 according to another embodiment. The FinFET thyristor protection structure 750 of FIG. 29 illustrates one embodiment of a chip layout used to implement the FinFET thyristor protection circuit 720 of FIG. 28. However, the FinFET thyristor protection circuit 720 of FIG. 28 can be implemented in other ways.

With reference to FIG. 29, the FinFET thyristor protection structure 750 is fabricated in a PSUB 721, and includes an NW 723 and a PW 724 formed adjacent to one another in the PSUB 721. Additionally, a first group of N+ regions 726a, a second group of N+ regions 726b, and a third group of N+ regions 726c are formed in the PW 724, with the second group of N+ regions 726b positioned between the first group of N+ regions 726a and the third group of N+ regions 726c. Additionally, a first group of P+ regions 725a, a second group of P+ regions 725b, and a fourth group of N+ regions 726d are formed in the NW 723, with the fourth group of N+ regions 726d positioned between the first group of P+ regions 725a and the second group of P+ regions 725b. Additionally, gate fin regions 728a, gate fin regions 728b, and gate fin regions 728c are formed over the PW 724. Furthermore, gate fin regions 728d are formed over NW 723. Various metallization including metal zero routes (M0PO and M0OD), metal one routes (M1), and vias and contacts are depicted.

Figure 30:
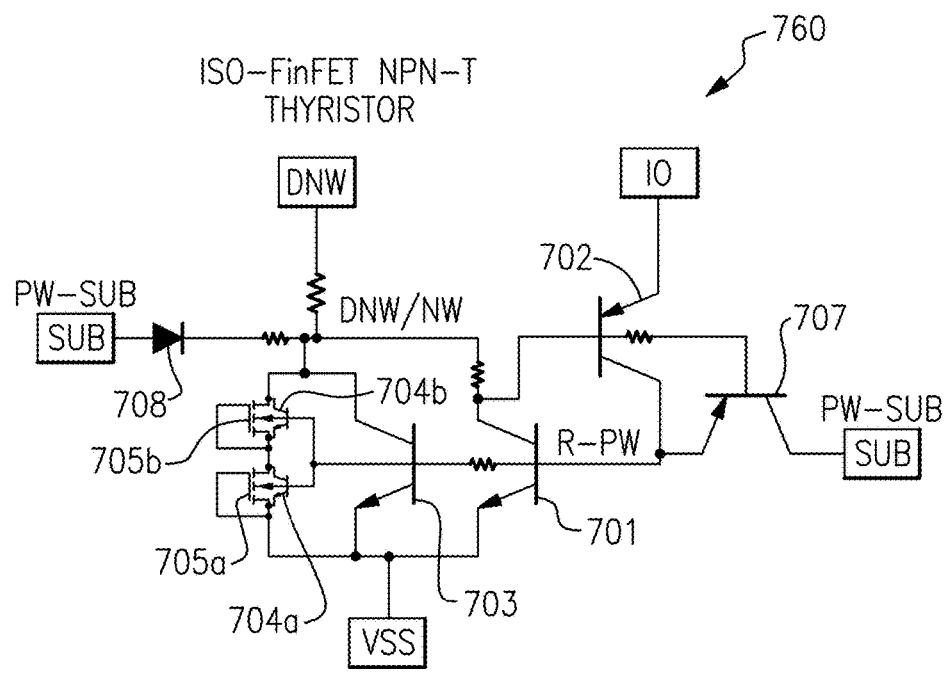
FIG. 30 is a circuit diagram of a FinFET thyristor protection circuit according to another embodiment.

FIG. 30 is a circuit diagram of a FinFET thyristor protection circuit 760 according to another embodiment. The FinFET thyristor protection circuit 760 includes an NPN bipolar transistor 701, a PNP bipolar transistor 702, a triggering NPN transistor 703, a first stacked NPN transistor 704a, a second stacked NPN transistor 704b, a first stacked n-type FinFET 705a, a second stacked n-type FinFET 705b, a substrate PNP bipolar transistor 707, and a substrate diode 708. One example connectivity of the FinFET thyristor protection circuit 760 to an IO terminal, a SUB terminal, and a VSS terminal is depicted. However, the FinFET thyristor circuit 760 can be connected to other terminals.

The FinFET thyristor protection circuit 760 of FIG. 30 is similar to the FinFET thyristor protection circuit 720 of FIG. 28, except that the FinFET thyristor protection circuit 760 further includes the substrate PNP bipolar transistor 707 and the substrate diode 708, which are associated with isolating the FinFET thyristor protection circuit 720 of FIG. 28 from a PSUB using a DNW isolation tub. The FinFET thyristor protection circuit 760 of FIG. 30 is also referred to herein as an ISO-FinFET NPN-T thyristor.

Figure 31:
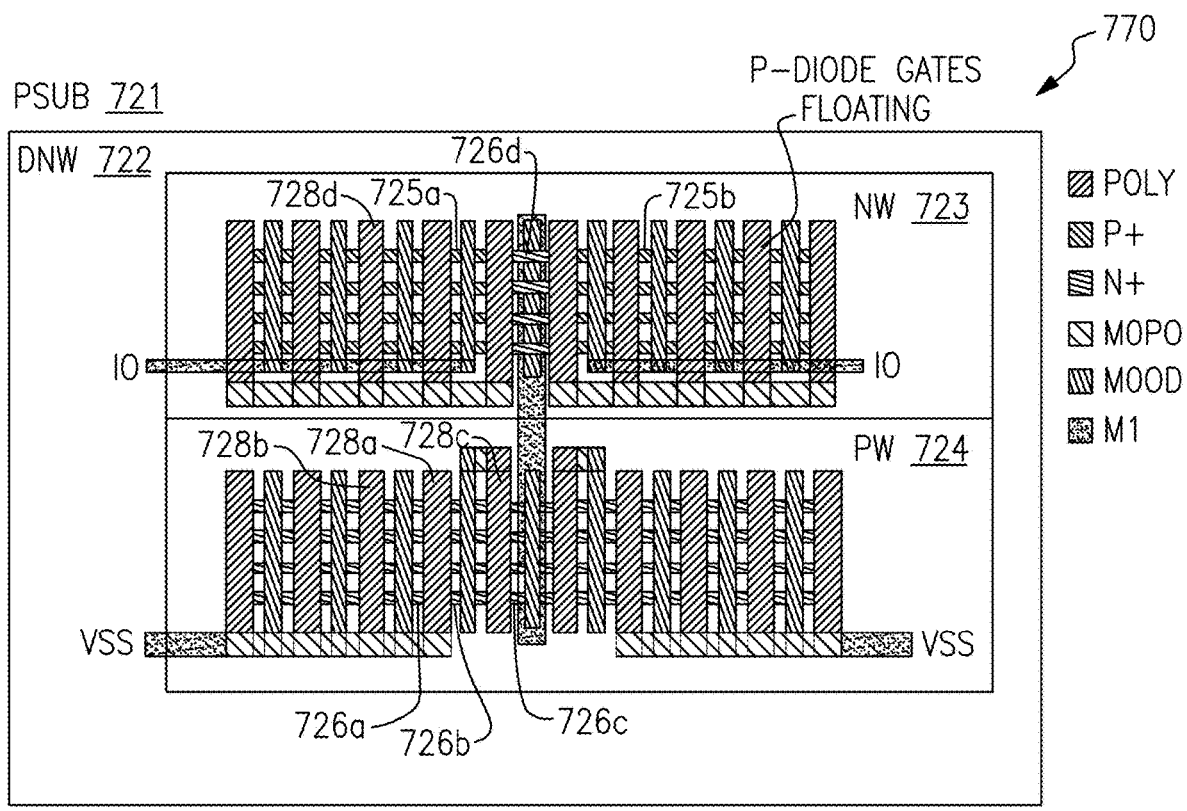
FIG. 31 is a plan view of a FinFET thyristor protection structure according to another embodiment.

FIG. 31 is a plan view of a FinFET thyristor protection structure 770 according to another embodiment. The FinFET thyristor protection structure 770 of FIG. 31 illustrates one embodiment of a chip layout used to implement the FinFET thyristor protection circuit 760 of FIG. 30. However, the FinFET thyristor protection circuit 760 of FIG. 30 can be implemented in other ways.

The FinFET thyristor protection structure 770 of FIG. 31 is similar to the FinFET thyristor protection structure 750 of FIG. 29, except that the FinFET thyristor protection structure 770 further includes a DNW 722.

Applications

Devices employing the above described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical and automotive applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A fin field-effect transistor (FinFET) thyristor protection structure for protecting a high-speed communication interface, the FinFET thyristor protection structure comprising:
    a signal terminal and a ground terminal;
    a thyristor comprising a PNP bipolar transistor and an NPN bipolar transistor that are cross-coupled, wherein the PNP bipolar transistor includes an emitter connected to the signal terminal and formed from a first plurality of p-type active (P+) regions in an n-type well (NW), a base formed from the NW, and a collector formed from a p-type well (PW), and wherein the NPN bipolar transistor includes an emitter connected to the ground terminal and formed from a first plurality of n-type active (N+) regions in the PW, a base formed from the PW, and a collector formed from the NW; and
    FinFET triggering circuitry formed in the NW and the PW, wherein the FinFET triggering circuitry comprises a p-type FinFET having a source and a gate each connected to the signal terminal and a drain connected to the base of the NPN bipolar transistor, the p-type FinFET configured to activate to provide a current path from the signal terminal to the ground terminal in response to an electrical overstress event received between the signal terminal and the ground terminal, and to trigger activation of the thyristor in response to the electrical overstress event,
    wherein the first plurality of P+ regions and the first plurality of N+ regions are each formed as fins extending in a first direction, and the gate of the p-type FinFET extends in a second direction substantially perpendicular to the first direction, the current path through the FinFET triggering circuitry in the first direction and a current path through the thyristor in the second direction,
    wherein the drain of the p-type FinFET is formed in the NW and is connected to the base of the NPN bipolar transistor by a direct metal connection in the second direction.

2. The FinFET thyristor protection structure of claim 1, wherein the source of the p-type FinFET is formed from the first plurality of P+ regions in the NW, the drain of the p-type FinFET is formed from a second plurality of P+ regions, and the gate of the p-type FinFET is formed from a plurality of gate fins over the NW.

3. The FinFET thyristor protection structure of claim 2, wherein the gate and the source of the p-type FinFET are connected to one another in backend metallization.

4. A fin field-effect transistor (FinFET) thyristor protection circuit comprising:
    a thyristor including an anode connected to a signal terminal and a cathode connected to a ground terminal, wherein the thyristor comprises a PNP bipolar transistor cross-coupled with an NPN bipolar transistor, wherein the PNP bipolar transistor includes an emitter connected to the signal terminal and the NPN bipolar transistor includes an emitter connected to the ground terminal, wherein the PNP bipolar transistor is formed from a first plurality of p-type active (P+) regions in an n-type well (NW) and the NPN bipolar transistor is formed from a first plurality of n-type active (N+) regions in the PW; and
    FinFET triggering circuitry comprising a p-type FinFET having a source and a gate each connected to the signal terminal and a drain connected to a base of the NPN bipolar transistor, the p-type FinFET configured to activate to provide a current path from the signal terminal to the ground terminal in response to an electrical overstress event received between the signal terminal and the ground terminal, wherein the FinFET triggering circuitry is further configured to trigger activation of the thyristor in response to the electrical overstress event, wherein the first plurality of P+ regions and the first plurality of N+ regions are each formed as fins extending in a first direction, and the gate of the p-type FinFET extends in a second direction substantially perpendicular to the first direction, the current path through the FinFET triggering circuitry in the first direction and a current path through the thyristor in the second direction, and wherein the drain of the p-type FinFET is formed in the NW and is connected to the base of the NPN bipolar transistor by a direct metal connection in the second direction.

5. The FinFET thyristor protection circuit of claim 4, wherein the FinFET triggering circuitry further comprises a triggering bipolar transistor having an emitter connected to the signal terminal, a base connected to a body of the p-type FinFET, and a collector connected to the base of the NPN bipolar transistor.

6. The FinFET thyristor protection circuit of claim 5, wherein a body of the p-type FinFET is connected to a base of the PNP bipolar transistor.

7. The FinFET thyristor protection circuit of claim 4, wherein the FinFET triggering circuitry further comprises a resistor connecting a substrate terminal to the drain of the p-type FinFET.

8. The FinFET thyristor protection circuit of claim 4, wherein a base-to-emitter junction of the PNP bipolar transistor is an open state.

9. The FinFET thyristor protection circuit of claim 4, wherein the current path through the p-type FinFET is substantially perpendicular to a current path through the thyristor.

10. The FinFET thyristor protection structure of claim 1, wherein the FinFET triggering circuitry further comprises a triggering bipolar transistor having an emitter connected to the signal terminal, a base connected to a body of the p-type FinFET, and a collector connected to the base of the NPN bipolar transistor.

11. The FinFET thyristor protection structure of claim 10, wherein the body of the p-type FinFET is connected to the base of the PNP bipolar transistor.

12. The FinFET thyristor protection structure of claim 1, further comprising a substrate terminal, wherein the FinFET triggering circuitry further comprises a resistor connecting the substrate terminal to the drain of the p-type FinFET, and the substrate terminal is decoupled from the ground terminal.

13. The FinFET thyristor protection structure of claim 1, wherein a base-to-emitter junction of the PNP bipolar transistor is an open state.

14. The FinFET thyristor protection structure of claim 1, wherein the first plurality of P+ regions in the NW are connected to a second plurality of P+ regions in the PW by a direct metal connection.

15. The FinFET thyristor protection structure of claim 14, wherein the source of the p-type FinFET is formed from the first plurality of P+ regions in the NW, and the drain of the p-type FinFET is formed from a third plurality of P+ regions in the NW.

16. The FinFET thyristor protection structure of claim 15, wherein the gate of the p-type FinFET is formed from a plurality of gate fins over the NW, the second plurality of P+ regions extend from the NW into the PW, the first plurality of N+ regions are positioned on a first side of the second plurality of P+ regions, and a third plurality of N+ regions are positioned on a second side of the second plurality of P+ regions opposite the first side.

17. The FinFET thyristor protection structure of claim 16, wherein each of the first plurality of P+ regions, the third plurality of P+ regions, the first plurality of N+ regions, and the third plurality of N+ regions extend a first distance in the first direction, wherein the second plurality of P+ regions extend a second distance in the first direction, wherein the first distance is greater than the second distance.

18. The FinFET thyristor protection structure of claim 17, wherein the second plurality of P+ regions extend in the second direction and are connected via a direct metal connection.

19. The FinFET thyristor protection structure of claim 1, wherein the source of the p-type FinFET is formed of a plurality of P+ regions, the drain of the p-type FinFET is formed of a plurality of P+ regions, the p-type FinFET has a second PNP bipolar transistor formed between the source and the drain of the p-type FinFET, the second PNP bipolar transistor configured to activate to provide the current path from the signal terminal to the ground terminal in response to an electrical overstress event received between the signal terminal and the ground terminal, and to trigger the activation of the thyristor through an independent current conduction path in response to the electrical overstress event.

20. The FinFET thyristor protection structure of claim 2, wherein the gate and the source of the p-type FinFET are connected to one another in backend metallization, and the first plurality of P+ regions forming the source of the of p-type FinFET is larger than the second plurality of p+ regions forming the drain of the p-type FinFET.

21. The FinFET thyristor protection structure of claim 1, wherein a body of the p-type FinFET is connected to the base of the PNP bipolar transistor and to the collector of the NPN bipolar transistor.

* * * * *